(12) United States Patent
Fujiwara et al.

(10) Patent No.: US 9,142,608 B2
(45) Date of Patent: Sep. 22, 2015

(54) MANUFACTURING METHOD OF SEMICONDUCTOR DEVICE AND SEMICONDUCTOR DEVICE

(71) Applicant: Asahi Kasei Microdevices Corporation, Chiyoda-ku, Tokyo (JP)

(72) Inventors: Tsuyoshi Fujiwara, Tokyo (JP); Kiyohiko Satoh, Tokyo (JP); Daichi Matsumoto, Tokyo (JP); Tsutomu Miyazaki, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 0 days.

(21) Appl. No.: 14/192,749

(22) Filed: Feb. 27, 2014

(65) Prior Publication Data

US 2014/0264748 A1 Sep. 18, 2014

(30) Foreign Application Priority Data

Mar. 15, 2013 (JP) .................... 2013-053862

(51) Int. Cl.
| | |
|---|---|
| *H01L 21/8242* | (2006.01) |
| *H01L 21/20* | (2006.01) |
| *H01L 49/02* | (2006.01) |
| *H01L 21/28* | (2006.01) |
| *H01L 23/522* | (2006.01) |
| *H01L 23/532* | (2006.01) |

(52) U.S. Cl.
CPC ................ *H01L 28/40* (2013.01); *H01L 21/28* (2013.01); *H01L 23/5223* (2013.01); *H01L 23/53223* (2013.01); *H01L 28/75* (2013.01)

(58) Field of Classification Search
CPC ......... H01L 21/28; H01L 28/40; H01L 28/75; H01L 23/5223; H01L 23/53223
USPC .......................................... 438/239, 393, 396
See application file for complete search history.

(56) References Cited

U.S. PATENT DOCUMENTS

| | | | |
|---|---|---|---|
| 6,232,131 B1 * | 5/2001 | Nagano et al. ................... 438/3 |
| 2007/0146591 A1 * | 6/2007 | Kimura et al. ................ 349/114 |
| 2012/0049369 A1 | 3/2012 | Mitsuyama et al. | |

FOREIGN PATENT DOCUMENTS

| | | |
|---|---|---|
| JP | 2003-174096 A | 6/2003 |
| JP | 2004-214514 A | 7/2004 |
| JP | 2012-049364 A | 3/2012 |

* cited by examiner

*Primary Examiner* — Nicholas Tobergte
(74) *Attorney, Agent, or Firm* — Miles & Stockbridge P.C.

(57) ABSTRACT

A step of forming a stacked film serving as a lower electrode, a step of forming an insulating film serving as a capacitive film on the stacked film, and a step of patterning the insulating film and the stacked film are performed. In the step of forming the stacked film, a film containing titanium, a film containing titanium and nitrogen, a main conductive film containing aluminum, a film containing titanium, and a film containing titanium and nitrogen are sequentially formed from below. The ratio of the surface roughness of the upper surface of the stacked film to the thickness of the insulating film is 14% or less.

12 Claims, 35 Drawing Sheets

MANUFACTURING METHOD OF SEMICONDUCTOR DEVICE AND SEMICONDUCTOR DEVICE

CROSS-REFERENCE TO RELATED APPLICATION

The present application claims priority from Japanese Patent Application No. 2013-053862 filed on Mar. 15, 2013, the content of which is hereby incorporated by reference into this application.

TECHNICAL FIELD OF THE INVENTION

The present invention relates to a semiconductor device and a manufacturing technique for the same, and more particularly to a semiconductor device provided with a capacitive element and a manufacturing technique for the same.

BACKGROUND OF THE INVENTION

As an electrostatic capacitive element, that is, a capacitive element included in an LSI (Large Scale Integrated circuit), a so-called MIM (Metal Insulator Metal) capacitor in which a capacitive film is disposed between a lower electrode and an upper electrode formed on a semiconductor substrate is known.

A capacitive value of a MIM capacitor can be set more accurately than other types of capacitive elements such as a MIS (Metal-Insulator-Silicon) capacitor, and the area of a semiconductor device can be reduced by forming a MIM capacitor on a wiring in a layer higher than a semiconductor element. For this reason, MIM capacitors are widely used in various types of semiconductor devices provided with CMOS (Complementary Metal Oxide Semiconductor), BiCMOS (Bipolar Complementary Metal Oxide Semiconductor), and bipolar transistors.

In a MIM capacitor, when the applied voltage becomes equal to or higher than a given voltage, a leakage current rapidly increases. This voltage is referred to as a withstand voltage. In addition, a voltage value at which a leakage current rapidly increases is referred to as a withstand voltage value. A withstand voltage value sometimes varies depending on the quality of a capacitive film, for example, a defect or the like in the capacitive film, and sometimes varies depending on the surface roughness of the lower electrode.

For example, Japanese Patent Application Laid-Open Publication No. 2012-49364 (Patent Document 1) describes a semiconductor device in which the lower electrode of a MIM capacitor is formed by sequentially stacking a first barrier layer, a first aluminum layer, and a second barrier layer from below and the surface roughness of the first aluminum layer is less than a predetermined value. Patent Document 1 describes that, when the planarity of the surface of the first aluminum layer is improved, variations in the withstand voltage of the MIM capacitor is suppressed.

Also, Japanese Patent Application Laid-Open Publication No. 2004-214514 (Patent Document 2) describes a MIM capacitor in which a titanium nitride (TiN) film, a titanium (Ti) film, a lower metal film, a dielectric film, and an upper metal film are sequentially formed from below and the surface of the lower metal film is roughened. According to the Patent Document 2, the capacitance of the MIM capacitor is increased by roughening the surface of the lower metal film.

Furthermore, Japanese Patent Application Laid-Open Publication No. 2003-174096 (Patent Document 3) describes a technique in which, after forming a conductive film serving as a lower electrode of a MIM capacitor, heat treatment is performed at a temperature higher than the formation temperature of the conductive film, thereby reorienting the Al crystal grains contained in the conductive film in a manufacturing process of a semiconductor device.

SUMMARY OF THE INVENTION

According to the study made by the inventors of the present invention, it has been found that the surface roughness of the upper surface of the lower electrode increases as the thickness of the main conductive film of the lower electrode of a MIM capacitor increases, so that the planarity of the surface of the lower electrode decreases. It has been also found that the withstand voltage value of the MIM capacitor decreases as the thickness of the main conductive film increases, so that variations in withstand voltage value increase. Therefore, in order to increase the withstand voltage value of the MIM capacitor and decrease the variations in withstand voltage value, it is necessary to consider the thickness dependence of the main conductive film on the withstand voltage value.

However, in the semiconductor device described in Patent Document 1 mentioned above, no consideration is given to the thickness dependence of the first aluminum layer on the withstand voltage value of the MIM capacitor. For this reason, in the semiconductor device described in Patent Document 1, it is not possible to suppress the decrease in withstand voltage value and suppress the variations in withstand voltage value when the thickness of the main conductive film increases, with the result that it is not possible to improve the performance of the semiconductor device.

Also, in the MIM capacitor described in Patent Document 2 mentioned above, although it is possible to increase the capacitance of the MIM capacitor, it is not possible to suppress the decrease in withstand voltage value and suppress the variations in withstand voltage value of the MIM capacitor when the thickness of the main conductive film increases, with the result that it is not possible to improve the performance of the semiconductor device.

Moreover, in the manufacturing process of the semiconductor device described in Patent Document 3 mentioned above, although local stress applied to the capacitive film can be reduced, it is not possible to suppress the decrease in withstand voltage value and suppress the variations in withstand voltage value when the thickness of the main conductive film increases, with the result that it is not possible to improve the performance of the semiconductor device.

Under such circumstances, the present invention provides a semiconductor device including a capacitive element, which can suppress a decrease in the withstand voltage value of the capacitive element and suppress variations in the withstand voltage value of the capacitive element even when the thickness of the main conductive film of a lower electrode increases.

A manufacturing method of a semiconductor device according to a representative embodiment includes a step of forming a stacked film serving as a lower electrode of a MIM capacitor, a step of forming an insulating film serving as a capacitive film of the MIM capacitor on the stacked film, and a step of patterning the insulating film and the stacked film. In the step of forming the stacked film, a film containing titanium, a film containing titanium and nitrogen, a main conductive film containing aluminum, a film containing titanium, and a film containing titanium and nitrogen are sequentially formed from below. Also, the ratio of the surface roughness of the upper surface of the stacked film to the thickness of the insulating film is 14% or less.

In addition, a manufacturing method of a semiconductor device according to a representative embodiment includes a step of forming a stacked film serving as a lower electrode of a MIM capacitor, and a step of patterning the stacked film, thereby forming a lower electrode composed of the stacked film. The manufacturing method further includes a step of forming an opening portion in an interlayer insulating film formed on the lower electrode and forming an insulating film serving as a capacitive film on the lower electrode exposed in the opening portion. In the process of forming the stacked film, a film containing titanium, a film containing titanium and nitrogen, a main conductive film containing aluminum, a film containing titanium, and a film containing titanium and nitrogen are sequentially formed from below. Also, the ratio of the surface roughness of the upper surface of the stacked film to the thickness of the insulating film is 14% or less.

Furthermore, a semiconductor device according to a representative embodiment includes a lower electrode and a capacitive film formed on the lower electrode. The lower electrode is composed of a stacked film obtained by sequentially stacking a film containing titanium, a film containing titanium and nitrogen, a main conductive film containing aluminum, a film containing titanium, and a film containing titanium and nitrogen from below. Also, the ratio of the surface roughness of the upper surface of the lower electrode to the thickness of the capacitive film is 14% or less.

According to the representative embodiments, in a semiconductor device including a capacitive element, even when the thickness of a main conductive film of a lower electrode increases, it is possible to suppress a decrease in the withstand voltage value of the capacitive element and suppress variations in the withstand voltage value of the capacitive element.

BRIEF DESCRIPTIONS OF THE DRAWINGS

DESCRIPTIONS OF THE PREFERRED EMBODIMENTS

Figure 1:
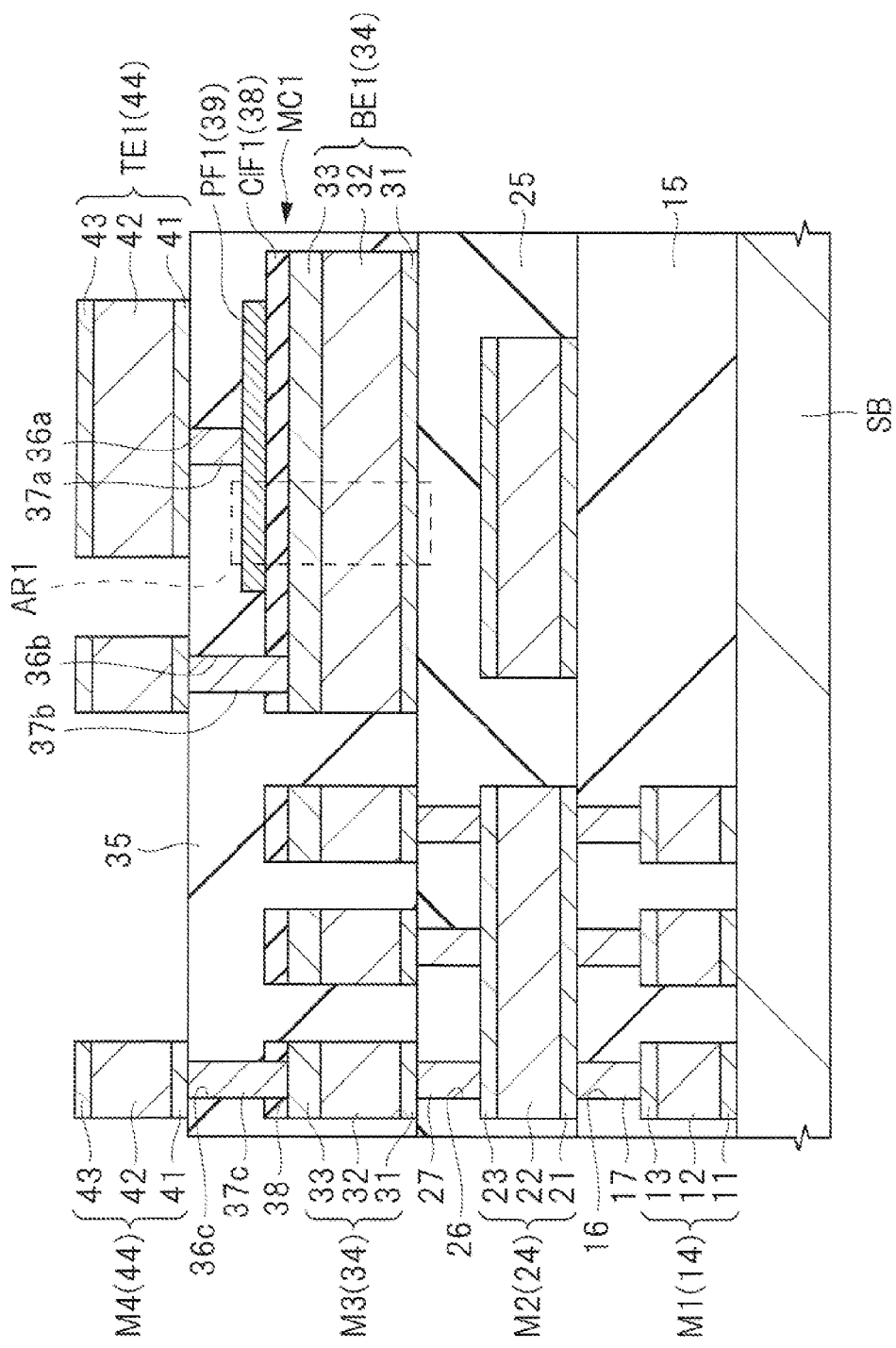
FIG. 1 is a sectional view of the main part of a semiconductor device of the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a sectional view and hatching is used even in a plan view so as to make the drawings easy to see.

Note that, in the following description of each embodiment, a case in which a semiconductor device including a MIM capacitor as a capacitive element is applied to a semiconductor device including a MISFET (Metal Insulator Semiconductor Field Effective Transistor) is taken as an example. However, each embodiment can be applied to various types of semiconductor devices including CMOS, BiCMOS, and bipolar transistors. In addition, a MIM capacitor of the semiconductor device according to each embodiment can be used as, for example, a filter or analog capacitor in an ADC (Analog-to-Digital Converter) or DAC (Digital-to-Analog Converter). Furthermore, a MIM capacitor of the semiconductor device according to each embodiment can be used as, for example, an oscillator or resonance circuit in an RF (Radio Frequency) circuit or an RF coupling or RF bypass capacitor in a matching network.

In addition, in each embodiment described below, the range of A to B indicates A or more and B or less unless otherwise specified.

First Embodiment

Configuration of Semiconductor Device

A semiconductor device according to an embodiment will be described with reference to the accompanying drawings. As described above, a case in which the semiconductor device is applied to a semiconductor device including a MIM capacitor as an electrostatic capacitive element, that is, a capacitive element will be described.

Figure 2:
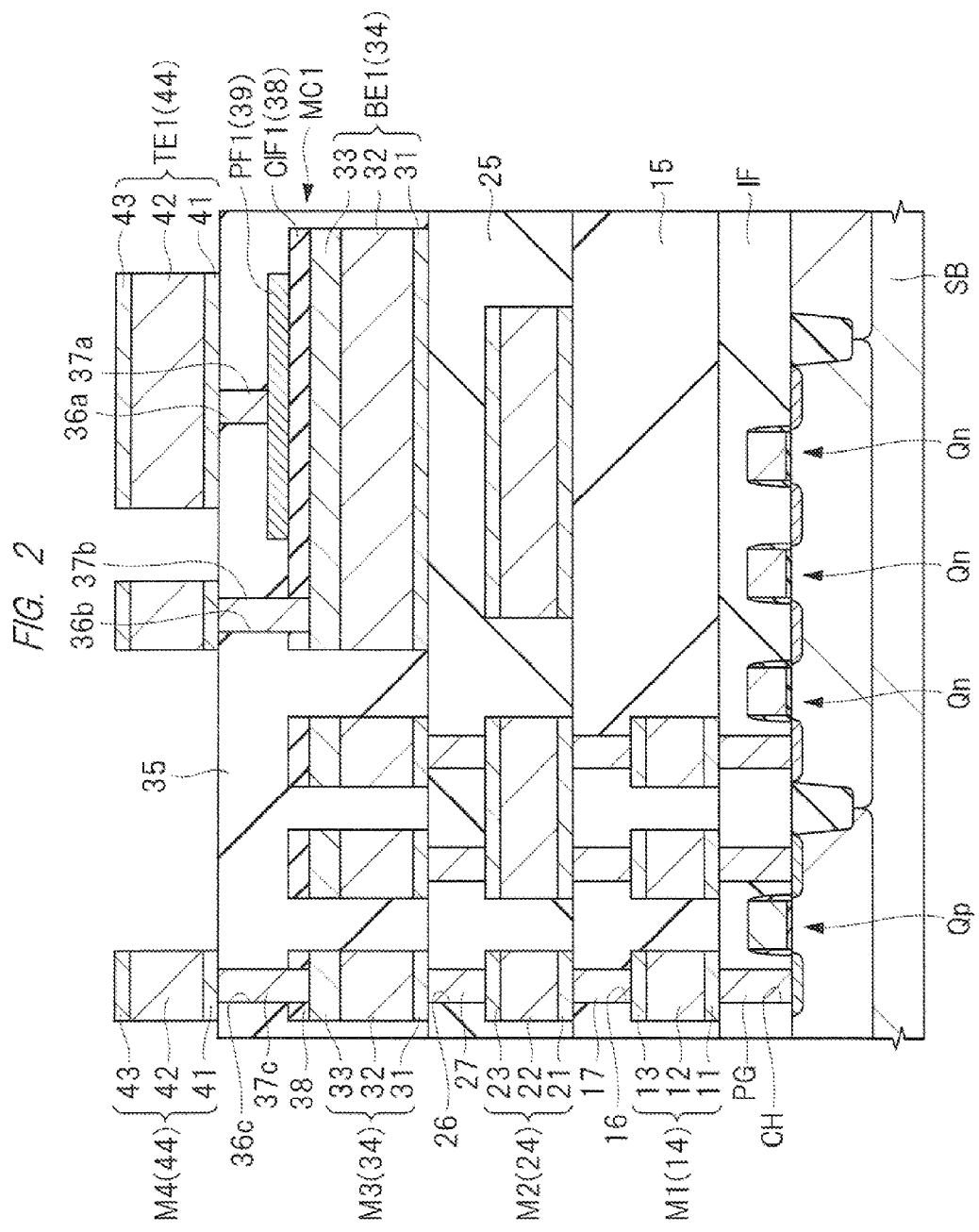
FIG. 2 is a sectional view of the main part of the semiconductor device of the first embodiment.

FIGS. 1 and 2 are sectional views of the main part of the semiconductor device of the first embodiment. Although FIG. 1 does not show any semiconductor elements such as transistors formed on a semiconductor substrate, FIG. 2 shows transistors as an example of semiconductor elements.

As shown in FIG. 1, the semiconductor device of the first embodiment includes a first-layer wiring M1, a second-layer wiring M2, a third-layer wiring M3, and a fourth-layer wiring M4 which are formed on a semiconductor substrate SB. Also, the semiconductor device of the first embodiment has a MIM capacitor MC1 as a capacitive element, which is composed of a lower electrode BE1, a capacitive film CIF1, and an upper electrode TE1. The semiconductor substrate SB is formed of, for example, a silicon single crystal substrate.

Although not shown in FIG. 1, semiconductor elements such as transistors are formed on the semiconductor substrate SB. FIG. 2 shows a case in which, for example, an n-channel MISFET (Metal Insulator Semiconductor Field Effective Transistor) Qn and a p-channel MISFET Qp are formed as semiconductor elements. In the case shown in FIG. 2, an insulating film IF is formed on the n-channel MISFET Qn and the p-channel MISFET Qp. An opening portion CH is formed in the insulating film IF so as to reach the semiconductor substrate SB through the insulating film IF. In the opening portion CH, a plug PG made of a conductive film is formed on the semiconductor substrate SB exposed in the opening portion CH so as to fill the opening portion CH.

Note that, in FIG. 1, the illustrations of the n-channel MISFET Qn and the p-channel MISFET Qp as semiconductor elements, the insulating film IF, the opening portions CH, and the plugs PG shown in FIG. 2 are omitted.

As shown in FIG. 2, the first-layer wiring M1 is formed on the insulating film IF in which the plug PG is formed. More specifically, as shown in FIG. 1, the first-layer wiring M1 is formed on the semiconductor substrate SB. The first-layer wiring M1 is electrically connected to the semiconductor substrate SB.

As shown in FIG. 1, the first-layer wiring M1 is composed of a stacked film 14 as a conductive film obtained by stacking a barrier conductive film 11, a main conductive film 12, and a barrier conductive film 13.

The barrier conductive film 11 is formed on the plug PG and the insulating film IF. As the barrier conductive film 11, a film containing titanium (Ti) and a film containing Ti and nitrogen (N) are sequentially stacked from below. More specifically, it is possible to use a film obtained by sequentially stacking a titanium (Ti) film having a thickness of, for example, 10 nm and a titanium nitride (TiN) film having a thickness of, for example, 30 nm from below.

The main conductive film 12 is formed on the barrier conductive film 11. The main conductive film 12 is composed of a film containing aluminum (Al). More specifically, an alloy film containing Al as a main component, that is, an Al alloy film having a thickness of, for example, 400 nm can be used as the main conductive film 12.

The barrier conductive film 13 is formed on the main conductive film 12. As the barrier conductive film 13, a film containing Ti and a film containing Ti and N are sequentially stacked from below. More specifically, it is possible to use a film obtained by sequentially stacking a Ti film having a thickness of, for example, 10 nm and a TiN film having a thickness of, for example, 20 nm from below. The barrier conductive film 11 and the barrier conductive film 13 are provided to prevent or suppress the diffusion of Al and the like in the main conductive film 12.

More specifically, the first-layer wiring M1 is composed of the stacked film 14 obtained by sequentially stacking, for example, a Ti film, a TiN film, an Al alloy film, a Ti film, and a TiN film on the plug PG and the insulating film IF.

A first interlayer insulating film 15 is formed on the insulating film IF (see FIG. 2) so as to cover the first-layer wiring M1. More specifically, the first interlayer insulating film 15 is formed on the insulating film IF and the first-layer wiring M1. In a part of the first interlayer insulating film 15 on the first-layer wiring M1, an opening portion 16 which reaches the first-layer wiring M1 through the first interlayer insulating film 15 is formed. In the opening portion 16, a plug 17 made of a conductive film is formed on the first-layer wiring M1 exposed on the bottom portion of the opening portion 16 so as to fill the opening portion 16.

On the first interlayer insulating film 15 in which the plug 17 is buried, the second-layer wiring M2 is formed. The second-layer wiring M2 is electrically connected to the first-layer wiring M1 through the plug 17.

Like the first-layer wiring M1, the second-layer wiring M2 is composed of a stacked film 24 as a conductive film obtained by stacking a barrier conductive film 21, a main conductive film 22, and a barrier conductive film 23.

The barrier conductive film 21 is formed on the plug 17 and the first interlayer insulating film 15. As the barrier conductive film 21, a film containing Ti and a film containing Ti and N are sequentially stacked from below. More specifically, it is possible to use a film obtained by sequentially stacking a Ti film having a thickness of, for example, 10 nm and a TiN film having a thickness of, for example, 30 nm from below.

The main conductive film 22 is formed on the barrier conductive film 21. As the main conductive film 22, a film containing Al is formed. More specifically, an alloy film containing Al as a main component, that is, an Al alloy film having a thickness of, for example, 400 nm can be used as the main conductive film 22.

The barrier conductive film 23 is formed on the main conductive film 22. As the barrier conductive film 23, a film containing Ti and a film containing Ti and N are sequentially stacked from below. More specifically, it is possible to use a film obtained by sequentially stacking a Ti film having a thickness of, for example, 10 nm and a TiN film having a thickness of, for example, 20 nm from below. The barrier conductive film 21 and the barrier conductive film 23 are provided to prevent or suppress the diffusion of Al and the like in the main conductive film 22.

More specifically, the second-layer wiring M2 is composed of the stacked film 24 obtained by sequentially stacking, for example, a Ti film, a TiN film, an Al alloy film, a Ti film, and a TiN film on the plug 17 and the first interlayer insulating film 15.

A second interlayer insulating film 25 is formed on the first interlayer insulating film 15 so as to cover the second-layer wiring M2. More specifically, the second interlayer insulating film 25 is formed on the first interlayer insulating film 15 and the second-layer wiring M2. In a part of the second interlayer insulating film 25 on the second-layer wiring M2, an opening portion 26 which reaches the second-layer wiring M2 through the second interlayer insulating film 25 is formed. In the opening portion 26, a plug 27 made of a conductive film is formed on the second-layer wiring M2 exposed on the bottom portion of the opening portion 26 so as to fill the opening portion 26.

Note that, as the main conductive film 12 of the first-layer wiring M1 and the main conductive film 22 of the second-layer wiring M2, a conductive film made of Al or a conductive film made of copper (Cu) can be used instead of the conductive film made of the Al alloy film.

On the second interlayer insulating film 25 in which the plug 27 is buried, the lower electrode BE1 and the third-layer wiring M3 are formed away from each other. The lower electrode BE1 is used as the lower electrode of the MIM capacitor MC1. The third-layer wiring M3 is electrically connected to the second-layer wiring M2 through the plug 27.

Figure 3:
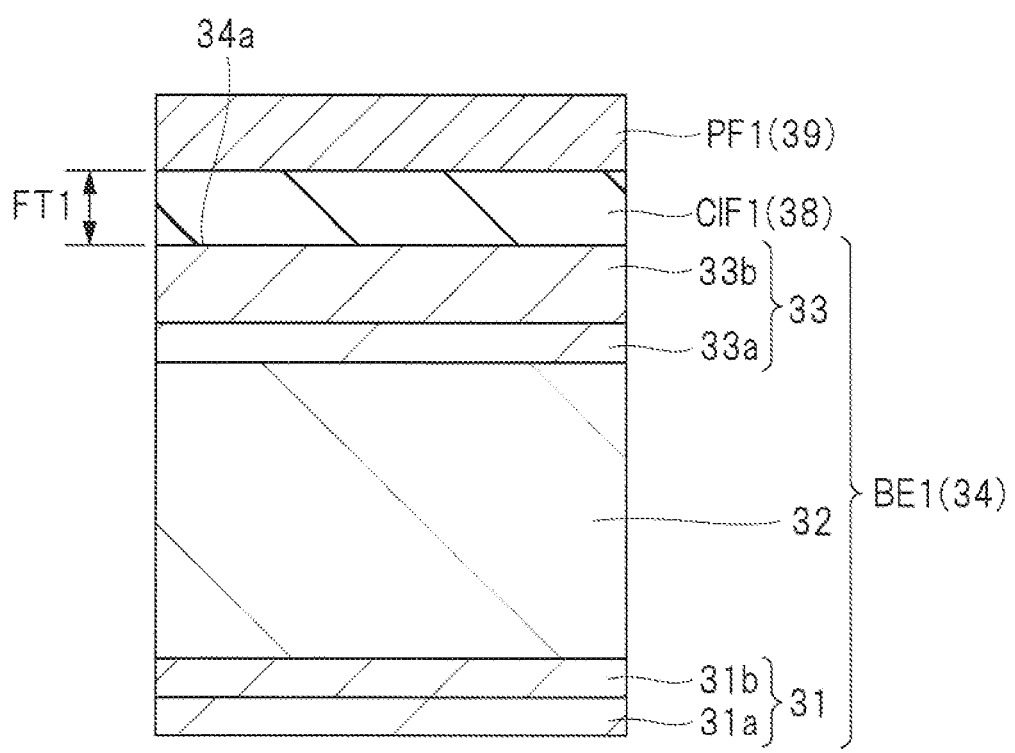
FIG. 3 is a sectional view of the main part of the semiconductor device of the first embodiment.

FIG. 3 is a sectional view of the main part of the semiconductor device of the first embodiment. In the sectional view of FIG. 3, a region AR1 enclosed by the broken line in FIG. 1, that is, a portion near the lower electrode BE1 in FIG. 1 is shown in an enlarged manner.

As shown in FIGS. 1 and 3, the lower electrode BE1 is composed of a stacked film 34 as a conductive film obtained by stacking a barrier conductive film 31, a main conductive film 32, and a barrier conductive film 33.

The barrier conductive film 31 is formed on the second interlayer insulating film 25. As the barrier conductive film 31, as shown in FIG. 3, a film 31a containing Ti and a film 31b containing Ti and N are sequentially stacked from below. More specifically, as the barrier conductive film 31, it is possible to use a film obtained by sequentially stacking the film 31a made of a Ti film having a thickness of, for example, 10 nm and the film 31b made of a TiN film having a thickness of, for example, 30 nm from below.

The main conductive film 32 is formed on the barrier conductive film 31. As the main conductive film 32, a film containing Al is formed. More specifically, an alloy film containing Al as a main component, that is, an Al alloy film having a thickness of, for example, 600 nm can be used as the main conductive film 32.

The barrier conductive film 33 is formed on the main conductive film 32. As the barrier conductive film 33, as shown in FIG. 3, a film 33a containing Ti and a film 33b containing Ti and N are sequentially stacked from below. More specifically, as the barrier conductive film 33, it is possible to use a film obtained by sequentially stacking the film 33a made of a Ti film having a thickness of, for example, 10 nm and the film 33b made of a TiN film having a thickness of, for example, 60 nm from below. The barrier conductive film 31 and the barrier conductive film 33 are provided to prevent or suppress the diffusion of Al and the like in the main conductive film 32.

More specifically, as the lower electrode BE1, for example, the film 31a made of a Ti film, the film 31b made of a TiN film, the main conductive film 32 made of an Al alloy film, the film 33a made of a Ti film, and the film 33b made of a TiN film are sequentially stacked on the second interlayer insulating film 25.

When seen in a plan view, the third-layer wiring M3 is formed away from the lower electrode BE1 in a region different from the region in which the lower electrode BE1 is formed. However, the third-layer wiring M3 can be composed of the stacked film 34 of the same layer as that of the lower electrode BE1. More specifically, like the lower electrode BE1, the third-layer wiring M3 is composed of the stacked film 34 as a conductive film obtained by stacking the barrier conductive film 31, the main conductive film 32, and the barrier conductive film 33.

Like the lower electrode BE1, the third-layer wiring M3 can be formed by sequentially stacking the film 31a containing Ti, the film 31b containing Ti and N, the main conductive film 32 made of a film containing Al, the film 33a containing Ti, and the film 33b containing Ti and N on the plug 27 and the second interlayer insulating film 25. More specifically, like the lower electrode BE1, the third-layer wiring M3 can be formed by sequentially stacking, for example, the film 31a made of a Ti film, the film 31b made of a TiN film, the main conductive film 32 made of an alloy film containing Al as a main component, that is, an Al alloy film, the film 33a made of a Ti film, and the film 33b made of a TiN film.

Also, the barrier conductive film 31 of the third-layer wiring M3 can be composed of a film of the same layer as that of the barrier conductive film 31 of the lower electrode BE1. In addition, the main conductive film 32 of the third-layer wiring M3 can be composed of a film of the same layer as that of the main conductive film 32 of the lower electrode BE1. Furthermore, the barrier conductive film 33 of the third-layer wiring M3 can be composed of a film of the same layer as that of the barrier conductive film 33 of the lower electrode BE1. This makes it possible to form the lower electrode BE1 and the third-layer wiring M3 in the same process and consequently to simplify the process.

Note that the thickness of the barrier conductive film 31 is preferably determined from the viewpoint of reducing the electric resistances of the lower electrode BE1 and the third-layer wiring M3, from the viewpoint of ensuring the reliability in electromigration and the like in the lower electrode BE1 and the third-layer wiring M3, and the like. In the case in which a stacked film composed of a Ti film and a TiN film is used as the barrier conductive film 31, the entire thickness of the barrier conductive film 31 is preferably in the range of about 20 nm to 100 nm. In addition, a conductive film containing tantalum (Ta), molybdenum (Mo), tungsten (W), or a nitride of Ta, Mo, or W as a main component can be used as the barrier conductive film 31.

On the other hand, the thickness of the main conductive film is determined from the viewpoint of reducing the electric resistance of the lower electrode BE1 to improve the high frequency characteristics of the MIM capacitor MC1 composed of the lower electrode BE1, from the viewpoint of reducing the electric resistance of the third-layer wiring M3, and the like. When the thickness of the main conductive film 32 is less than 100 nm, there is a possibility that the electric resistance of the lower electrode BE1 and the electric resistance of the third-layer wiring M3 cannot be easily reduced. Furthermore, when the thickness of the main conductive film 32 exceeds 3,000 nm, there is a possibility that the third-layer wiring M3 may become excessively thick. Therefore, the thickness of the main conductive film 32 is preferably in the range of 100 nm to 3,000 nm.

In addition, the thickness of the main conductive film 32 is more preferably in the range of 200 nm to 1,200 nm. This makes it possible to easily reduce a surface roughness RMS of the upper surface of the lower electrode BE1, while easily reducing the electric resistances of the lower electrode BE1 and the third-layer wiring M3.

In addition, as the barrier conductive film 33, it is possible to use a conductive film containing Ta, Mo, W, or a nitride of Ta, Mo, or W as a main component. This makes it possible to prevent or suppress the occurrence of crack in the barrier conductive film 33.

The capacitive film CIF1 composed of an insulating film 38 is formed on the lower electrode BE1. The capacitive film CIF1 is formed by patterning, that is, processing the insulating film 38. The capacitive film CIF1 is used as a capacitive film of the MIM capacitor MC1. As the insulating film 38 serving as the capacitive film CIF1, various types of insulating films such as a silicon oxide ($SiO_2$) film, a silicon nitride (SiN) film, and a silicon oxynitride (SiON) film can be used. This makes it possible to easily form the insulating film 38 by using various types of film formation methods. In addition, a thickness FT1 (see FIG. 3) of the capacitive film CIF1 is determined in accordance with the capacitance of the MIM capacitor MC1.

In the semiconductor device of the first embodiment, the ratio of the surface roughness RMS as the root-mean-square roughness of an upper surface 34a (see FIG. 3) of the lower electrode BE1 to the thickness FT1 of the capacitive film CIF1 is 14% or less. This makes it possible to manufacture the products with a yield rate of 90% or more as will be described later with reference to FIG. 22.

Note that, even after a semiconductor device is manufactured, it is possible to manufacture a sample in which the upper surface 34a of the lower electrode BE1 is exposed by removing a portion above the lower electrode BE1, that is, the capacitive film CIF1 and others. Then, the surface roughness of the exposed upper surface 34a of the lower electrode BE1 of the manufactured sample can be measured by using, for example, an integrated scatterometer. Alternatively, a cross-section observation sample whose cross-section including an interface between the lower electrode BE1 and the capacitive film CIF1 can be observed can be manufactured by, for example, an FIB (Focused Ion Beam) process. Then, by observing the interface between the lower electrode BE1 and the capacitive film CIF1 of the manufactured cross-section observation sample by, for example, SEM (Scanning Electron Microscope), the surface roughness of the upper surface 34a of the lower electrode BE1 can be measured.

In addition, in the semiconductor device of the first embodiment, the value obtained by dividing the X-ray diffraction intensity of the (111) plane of the main conductive film 32 by the thickness of the main conductive film 32 is 200 cps (count per sec)/nm or more. At this time, as will be described with reference to FIG. 23, the surface roughness RMS of the upper surface 34a of the lower electrode BE1 becomes 25 Å or less, and the ratio of the surface roughness RMS of the upper surface 34a of the lower electrode BE1 to the thickness FT1 (see FIG. 3) of the capacitive film CIF1 can be set to 14% or less.

Note that, even after a semiconductor device is manufactured, it is possible to manufacture a sample in which the upper surface 34a of the lower electrode BE1 is exposed by removing a portion above the lower electrode BE1, that is, the capacitive film CIF1 and others, and to measure the X-ray diffraction intensity of the (111) plane of the main conductive film 32 by an X-ray diffraction method. Alternatively, even if the portion above the lower electrode BE1 is not removed, the X-ray diffraction intensity of the (111) plane of the main conductive film 32 can be measured by the X-ray diffraction method by adjusting X-ray irradiation conditions.

A conductive film PF1 is formed on the capacitive film CIF1. The conductive film PF1 is formed by patterning, that is, processing a conductive film 39. The conductive film PF1 is used as a part of the upper electrode of the MIM capacitor MC1. The conductive film PF1 is a portion in contact with the capacitive film CIF1, and is used also as a protective film for protecting the upper surface of the capacitive film CIF1. As the conductive film PF1, a conductive film containing Ti and N can be used. For example, a TiN film having a thickness of, for example, 80 nm can be used. In addition, as the conductive film PF1, a conductive film such as a Ti film, a tantalum nitride (TaN) film, or an Al film can be used instead of a TiN film. Even when such a conductive film is used, the conductive film PF1 serves as a part of the upper electrode and can protect the upper surface of the capacitive film CIF1.

In this manner, the lower electrode BE1, the capacitive film CIF1, and the conductive film PF1 form the MIM capacitor MC1 as a capacitive element.

Note that, as shown in FIG. 1, the insulating film 38 may be formed on the third-layer wiring M3.

A third interlayer insulating film 35 is formed on the second interlayer insulating film 25 so as to cover the lower electrode BE1, the capacitive film CIF1, the conductive film PF1, and the third-layer wiring M3. More specifically, the third interlayer insulating film 35 is formed on the lower electrode BE1, the capacitive film CIF1, the conductive film PF1, and the third-layer wiring M3.

In a part of the third interlayer insulating film 35 on the conductive film PF1, an opening portion 36a which reaches the conductive film PF1 through the third interlayer insulating film 35 is formed. In the opening portion 36a, a plug 37a made of a conductive film is formed on the conductive film PF1 exposed in the opening portion 36a so as to fill the opening portion 36a. The plug 37a is electrically connected to the conductive film PF1.

On the lower electrode BE1, an opening portion 36b which reaches the lower electrode BE1 through the third interlayer insulating film 35 and the capacitive film CIF1 is formed. In the opening portion 36b, a plug 37b made of a conductive film is formed on the lower electrode BE1 exposed in the opening portion 36b so as to fill the opening portion 36b. The plug 37b is electrically connected to the lower electrode BE1.

On the third-layer wiring M3, an opening portion 36c which reaches the third-layer wiring M3 through the third interlayer insulating film 35 and the capacitive film CIF1 is formed. In the opening portion 36c, a plug 37c made of a conductive film is formed on the third-layer wiring M3 exposed in the opening portion 36c so as to fill the opening portion 36c. The plug 37c is electrically connected to the third-layer wiring M3.

The upper electrode TE1 is formed on the third interlayer insulating film 35 in which the plug 37a is buried. The upper electrode TE1 is electrically connected to the conductive film PF1 through the plug 37a and is used as the upper electrode of the MIM capacitor MC1 together with the conductive film PF1.

The upper electrode TE1 is composed of a stacked film 44 as a conductive film obtained by stacking a barrier conductive film 41, a main conductive film 42, and a barrier conductive film 43.

The barrier conductive film 41 is formed on the plug 37a and the third interlayer insulating film 35. As the barrier conductive film 41, a film containing Ti and a film containing Ti and N are sequentially stacked from below. More specifically, it is possible to use a film obtained by sequentially stacking a Ti film having a thickness of, for example, 10 nm and a TiN film having a thickness of, for example, 30 nm from below.

The main conductive film 42 is formed on the barrier conductive film 41. As the main conductive film 42, a film composed of a film containing Al can be used. More specifically, an alloy film containing Al as a main component, that is, an Al alloy film having a thickness of, for example, 600 nm can be used as the main conductive film 42.

The barrier conductive film 43 is formed on the main conductive film 42. As the barrier conductive film 43, a film containing Ti and a film containing Ti and N are sequentially stacked from below. More specifically, it is possible to use a film obtained by sequentially stacking a Ti film having a thickness of, for example, 10 nm and a TiN film having a thickness of, for example, 20 nm from below. The barrier conductive film 41 and the barrier conductive film 43 are provided to prevent or suppress the diffusion of Al and the like in the main conductive film 42.

More specifically, the upper electrode TE1 is composed of a film obtained by sequentially stacking, for example, a Ti film, a TiN film, an Al alloy film, a Ti film, and a TiN film on the plug 37a and the third interlayer insulating film 35.

Also, a plurality of fourth-layer wirings M4 are formed away from each other on the third interlayer insulating film 35 in which the plugs 37b and 37c are buried. A given one of the fourth-layer wirings M4 is electrically connected to the lower electrode BE1 via the plug 37b, and another wiring of the fourth-layer wirings M4 is electrically connected to the third-layer wiring M3 via the plug 37c.

When seen in a plan view, the fourth-layer wiring M4 is formed away from the upper electrode TE1 in a region different from the region in which the upper electrode TE1 is formed. However, the fourth-layer wiring M4 can be composed of the stacked film 44 of the same layer as that of the upper electrode TE1. More specifically, like the upper electrode TE1, the fourth-layer wiring M4 is composed of the stacked film 44 as a conductive film obtained by stacking the barrier conductive film 41, the main conductive film 42, and the barrier conductive film 43.

Like the upper electrode TE1, the fourth-layer wiring M4 can be formed by sequentially stacking a film containing Ti, a film containing Ti and N, a film containing Al, a film containing Ti, and a film containing Ti and N on the plug 37b, the plug 37c and the third interlayer insulating film 35. More specifically, like the upper electrode TE1, the fourth-layer wiring M4 can be formed by sequentially stacking, for example, a Ti film, a TiN film, an Al alloy film, a Ti film, and a TiN film on the plug 37b, the plug 37c, and the third interlayer insulating film 35.

Also, the barrier conductive film 41 of the fourth-layer wiring M4 can be composed of a film of the same layer as that of the barrier conductive film 41 of the upper electrode TE1. In addition, the main conductive film 42 of the fourth-layer wiring M4 can be composed of a film of the same layer as that of the main conductive film 42 of the upper electrode TE1. Furthermore, the barrier conductive film 43 of the fourth-layer wiring M4 can be composed of a film of the same layer as that of the barrier conductive film 43 of the upper electrode TE1. This makes it possible to form the upper electrode TE1 and the fourth-layer wiring M4 in the same process and consequently to simplify the process.

<Manufacturing Process of Semiconductor Device>

Next, a manufacturing process of the semiconductor device of the first embodiment will be described with reference to the accompanying drawings. FIGS. 4 to 16 are sectional views of the main part in a manufacturing process of the semiconductor device of the first embodiment.

Note that, like FIG. 1, the illustrations of the n-channel MISFET Qn and the p-channel MISFET Qp as semiconductor elements, the insulating film IF, the opening portions CH, and the plugs PG shown in FIG. 2 are omitted in FIGS. 4 to 16. In addition, since the process of forming the n-channel MISFET Qn and the p-channel MISFET Qp shown in FIG. 2 can be performed by a known method, the description thereof is omitted.

Figure 4:
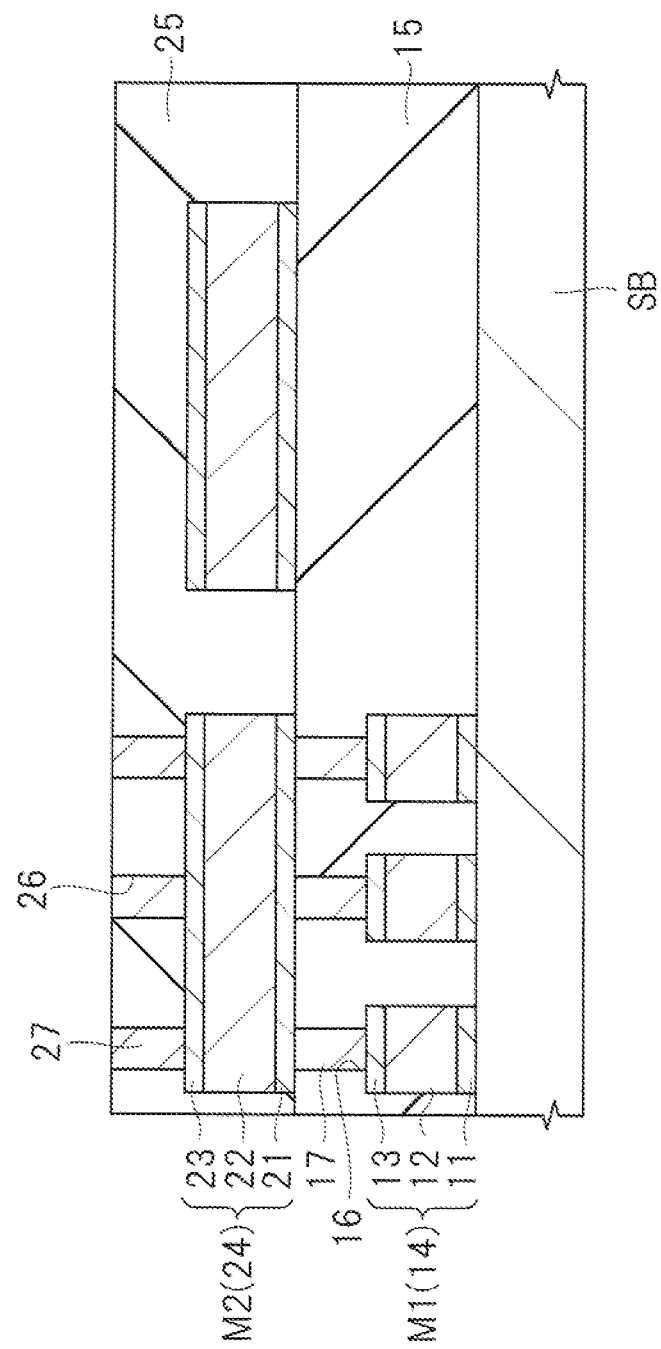
FIG. 4 is a sectional view of the main part in a manufacturing process of the semiconductor device of the first embodiment.

First, as shown in FIG. 4, the semiconductor substrate SB is prepared (step S11). In step S11, the semiconductor substrate SB on which the two layer wirings, that is, the first-layer wiring M1 and the second-layer wiring M2 are formed is prepared.

Then, the stacked film 14 composed of the barrier conductive film 11, the main conductive film 12, and the barrier conductive film 13 sequentially formed from below is formed on the semiconductor substrate SB in which the plugs PG (not shown) and the insulating film IF (not shown) are formed. As the barrier conductive film 11, a Ti film having a thickness of, for example, 10 nm and a TiN film having a thickness of, for example, 30 nm can be sequentially formed from below by a sputtering method. As the main conductive film 12, an alloy film having a thickness of, for example, 400 nm and containing Al as a main component, that is, an Al alloy film can be formed by the sputtering method. As the barrier conductive film 13, a Ti film having a thickness of, for example, 10 nm and a TiN film having a thickness of, for example, 20 nm can be sequentially formed from below by the sputtering method. The stacked film 14 formed in this manner is patterned or processed by a photolithography technique and a dry etching technique, thereby forming the first-layer wiring M1.

Next, the first interlayer insulating film 15 is formed on the semiconductor substrate SB and the first-layer wiring M1. The first interlayer insulating film 15 is formed by forming an $SiO_2$ film having a thickness of, for example, 1,300 nm by a plasma CVD (Chemical Vapor Deposition) method and then polishing and planarizing the film by a CMP (Chemical Mechanical Polishing) method. The first interlayer insulating film 15 formed in this manner is patterned or processed by the photolithography technique and the dry etching technique, thereby forming the opening portion 16 in a portion of the first interlayer insulating film 15 located on the first-layer wiring M1 so as to reach the first-layer wiring M1 through the first interlayer insulating film 15.

Next, a barrier conductive film made of, for example, a TiN film is formed on the first-layer wiring M1 exposed on the bottom portion of the opening portion 16, the side wall of the opening portion 16, and the first interlayer insulating film 15 by the sputtering method. Then, a main conductive film made of, for example, a W film is formed on the formed barrier conductive film so as to fill the opening portion 16 by the CVD method. Thereafter, the plug 17 is formed in the opening portion 16 by polishing and removing portions of the main conductive film and barrier conductive film other than the portions in the opening portion 16, that is, the main conductive film and the barrier conductive film on the first interlayer insulating film 15 by the CMP method.

Next, the stacked film 24 composed of the barrier conductive film 21, the main conductive film 22, and the barrier conductive film. 23 sequentially formed from below is formed on the plug 17 and the first interlayer insulating film 15. As the barrier conductive film 21, a Ti film having a thickness of, for example, 10 nm and a TiN film having a thickness of, for example, 30 nm can be sequentially formed from below by the sputtering method. As the main conductive film 22, an alloy film having a thickness of, for example, 400 nm and containing Al as a main component, that is, an Al alloy film can be formed by the sputtering method. As the barrier conductive film 23, a Ti film having a thickness of, for example, 10 nm and a TiN film having a thickness of, for example, 20 nm can be sequentially formed from below by the sputtering method. The stacked film 24 formed in this manner is patterned or processed by the photolithography technique and the dry etching technique, thereby forming the second-layer wiring M2.

Next, the second interlayer insulating film 25 is formed on the first interlayer insulating film. 15 and the second-layer wiring M2. The second interlayer insulating film 25 is formed by forming an $SiO_2$ film having a thickness of, for example, 1,300 nm by the plasma CVD method and then polishing and planarizing the film by the CMP method. The second interlayer insulating film 25 formed in this manner is patterned or processed by the photolithography technique and the dry etching technique, thereby forming the opening portion 26 in a portion of the second interlayer insulating film located on the second-layer wiring M2 so as to reach the second-layer wiring M2 through the second interlayer insulating film 25.

Next, a barrier conductive film made of, for example, a TiN film is formed on the second-layer wiring M2 exposed on the bottom portion of the opening portion 26, the side wall of the opening portion 26, and the second interlayer insulating film 25 by the sputtering method. Then, a main conductive film made of, for example, a W film is formed on the formed barrier conductive film so as to fill the opening portion 26 by the CVD method. Thereafter, the plug 27 is formed in the opening portion 26 by polishing and removing portions of the main conductive film and barrier conductive film other than the portions in the opening portion 26, that is, the main conductive film and the barrier conductive film on the second interlayer insulating film 25 by the CMP method.

Note that, as the main conductive film 12 of the first-layer wiring M1 and the main conductive film 22 of the second-layer wiring M2, for example, a conductive film made of an Al film or a conductive film made of a Cu film can be formed by a damascene method instead of forming a conductive film made of an Al alloy film by the sputtering method.

Figure 5:
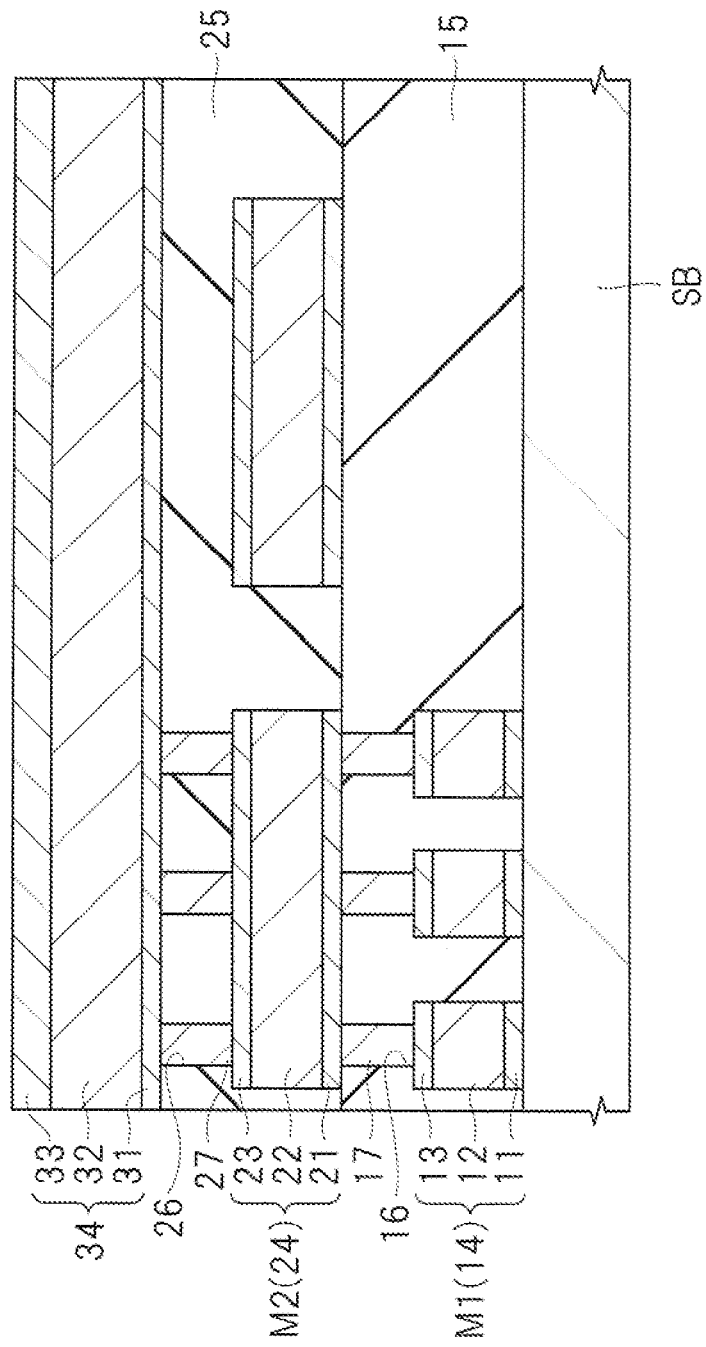
FIG. 5 is a sectional view of the main part in the manufacturing process of the semiconductor device of the first embodiment.

Subsequently, as shown in FIG. 5, the stacked film 34 serving as the lower electrode BE1 (see FIG. 10) and the third-layer wiring M3 (see FIG. 10) is formed (step S12). In step S12, the stacked film 34 composed of the barrier conductive film 31, the main conductive film 32, and the barrier conductive film 33 sequentially formed from below is formed on the plug 27 and the second interlayer insulating film 25.

As shown in FIG. 3, as the barrier conductive film 31, the film 31a containing Ti and the film 31b containing Ti and N can be sequentially formed from below. More specifically, the barrier conductive film 31 can be formed by forming the film 31a made of a Ti film having a thickness of, for example, 10 nm in an atmosphere containing no nitrogen by the sputtering method and then forming the film 31b made of a TiN film having a thickness of, for example, 30 nm by the sputtering method. As the main conductive film 32, a film containing Al can be formed. More specifically, an alloy film having a thickness of, for example, 600 nm and containing Al as a main component, that is, an Al alloy film can be formed by the sputtering method. As the barrier conductive film 33, the film 33a containing Ti and the film 33b containing Ti and N can be sequentially formed from below. More specifically, the barrier conductive film 33 can be formed by forming the film 33a made of a Ti film having a thickness of, for example, 10 nm in an atmosphere containing no nitrogen by the sputtering method and then forming the film 33b made of a TiN film having a thickness of, for example, 60 nm by the sputtering method.

Note that, forming the film in an atmosphere containing no nitrogen by the sputtering method means that after the interior of the deposition chamber of a sputtering apparatus is evacuated, the film is formed by the sputtering method without supplying any nitrogen gas or gas containing nitrogen into the deposition chamber.

Note that, as described above, the thickness of the barrier conductive film 31 is determined from the viewpoint of reducing the electric resistances of the lower electrode BE1 (see FIG. 10) and third-layer wiring M3 (see FIG. 10) composed of the stacked film 34. Alternatively, the thickness of the barrier conductive film 31 is determined from the viewpoint of ensuring reliability in electromigration and the like in the lower electrode BE1 and the third-layer wiring M3 composed of the stacked film 34. In the case in which a stacked film composed of a Ti film and a TiN film is used as the barrier conductive film 31, the entire thickness of the barrier conductive film 31 is preferably in the range of about 20 nm to 100 nm. In addition, a conductive film containing Ta, Mo, W, or a nitride of Ta, Mo, or W as a main component can be used as the barrier conductive film 31.

On the other hand, as described above, the thickness of the main conductive film 32 is determined from the viewpoint of reducing the electric resistance of the stacked film 34 to improve the high frequency characteristics of the MIM capacitor MC1 (see FIG. 10) formed from the lower electrode BE1 composed of the stacked film 34. Alternatively, the thickness of the main conductive film 32 is determined from the viewpoint of, for example, reducing the electric resistance of the third-layer wiring M3 composed of the stacked film 34. As described above, the thickness of the main conductive film 32 is preferably in the range of 100 nm to 3,000 nm. In addition, the thickness of the main conductive film 32 is more preferably in the range of 200 nm to 1,200 nm. This makes it possible to easily reduce a surface roughness RMS of the upper surface of the lower electrode BE1, while easily reducing the electric resistances of the lower electrode BE1 and the third-layer wiring M3.

In addition, as described above, as the barrier conductive film 33, it is possible to use a conductive film containing Ta, Mo, W, or a nitride of Ta, Mo, or W as a main component. This makes it possible to prevent or suppress the occurrence of crack in the barrier conductive film 33.

Figure 6:
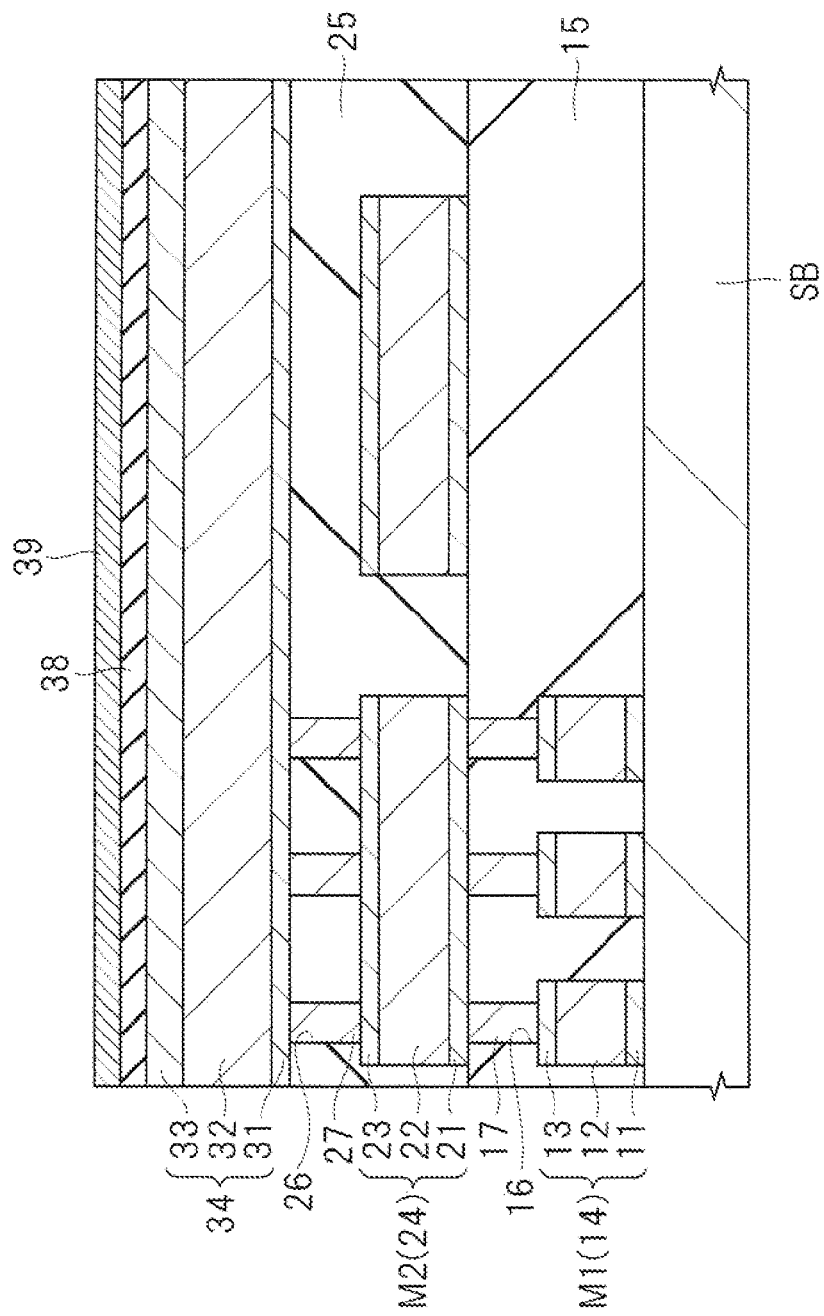
FIG. 6 is a sectional view of the main part in the manufacturing process of the semiconductor device of the first embodiment.

Subsequently, as shown in FIG. 6, the insulating film 38 serving as the capacitive film CIF1 (see FIG. 10) and the conductive film 39 serving as the conductive film PF1 (see FIG. 8) are formed (step S13). In step S13, the insulating film 38 serving as the capacitive film CIF1 and the conductive film 39 serving as the conductive film PF1 are formed on the stacked film 34 composed of the barrier conductive film 31, the main conductive film 32, and the barrier conductive film 33.

First, the insulating film 38 made of one of various types of insulating films such as an $SiO_2$ film, an SiN film, and an SiON film is formed on the barrier conductive film 33 by the plasma CVD method. In addition, the thickness FT1 (see FIG. 3) of the insulating film 38 is determined in accordance with the capacitance of the MIM capacitor MC1 (see FIG. 10).

Next, the conductive film 39 made of a TiN film having a thickness of, for example, 80 nm is formed on the insulating film 38 by the sputtering method. The conductive film 39 is formed as a part of the upper electrode of the MIM capacitor MC1. The conductive film 39 is also a portion in contact with the insulating film 38 and is formed as a protective film for protecting the upper surface of the insulating film 38 in a subsequent process, for example, a process of removing a resist. As the conductive film 39, a conductive film such as a Ti film, TaN film, or Al film can be formed instead of a TiN film, and even when such a conductive film is formed, the conductive film 39 serves as a part of the upper electrode and can protect the upper surface of the insulating film 38.

At this time, the conductive film 39 is formed in a layer higher than the stacked film 34. Since this makes it possible to form the conductive film PF1 (see FIG. 10) composed of the conductive film 39 and the third-layer wiring M3 (see FIG. 10) composed of the stacked film 34 at different height positions, the degree of freedom in wiring layout can be improved and the area of the semiconductor device can be reduced.

In the manufacturing process of the semiconductor device of the first embodiment, the ratio of the surface roughness RMS of the upper surface 34a of the stacked film 34 formed in step S12 to the thickness FT1 (see FIG. 3) of the insulating film 38 formed in step S13 is 14% or less. This makes it possible to manufacture products with a yield rate of 90% or more as will be described later with reference to FIG. 22.

In the manufacturing process of the semiconductor device of the first embodiment, the film formation rate of the main conductive film 32 made of an alloy film containing Al as a main component, that is, an Al alloy film is preferably 1,000 nm/min or more in step S12. In this case, as will be described with reference to FIG. 23, the surface roughness RMS of the upper surface 34a of the stacked film 34 becomes 25 Å or less, and the ratio of the surface roughness RMS of the upper surface 34a of the stacked film 34 to the thickness FT1 of the insulating film 38 can be set to 14% or less.

In addition, in the manufacturing process of the semiconductor device of the first embodiment, the value obtained by dividing the X-ray diffraction intensity of the (111) plane of the main conductive film 32 formed in step S12 by the thickness of the main conductive film 32 is preferably 200 cps/nm or more. At this time, as will be described with reference to FIG. 23, the surface roughness RMS of the upper surface 34a of the stacked film 34 becomes 25 Å or less, and the ratio of the surface roughness RMS of the upper surface 34a of the stacked film 34 to the thickness FT1 of the insulating film 38 can be set to 14% or less.

Figure 7:
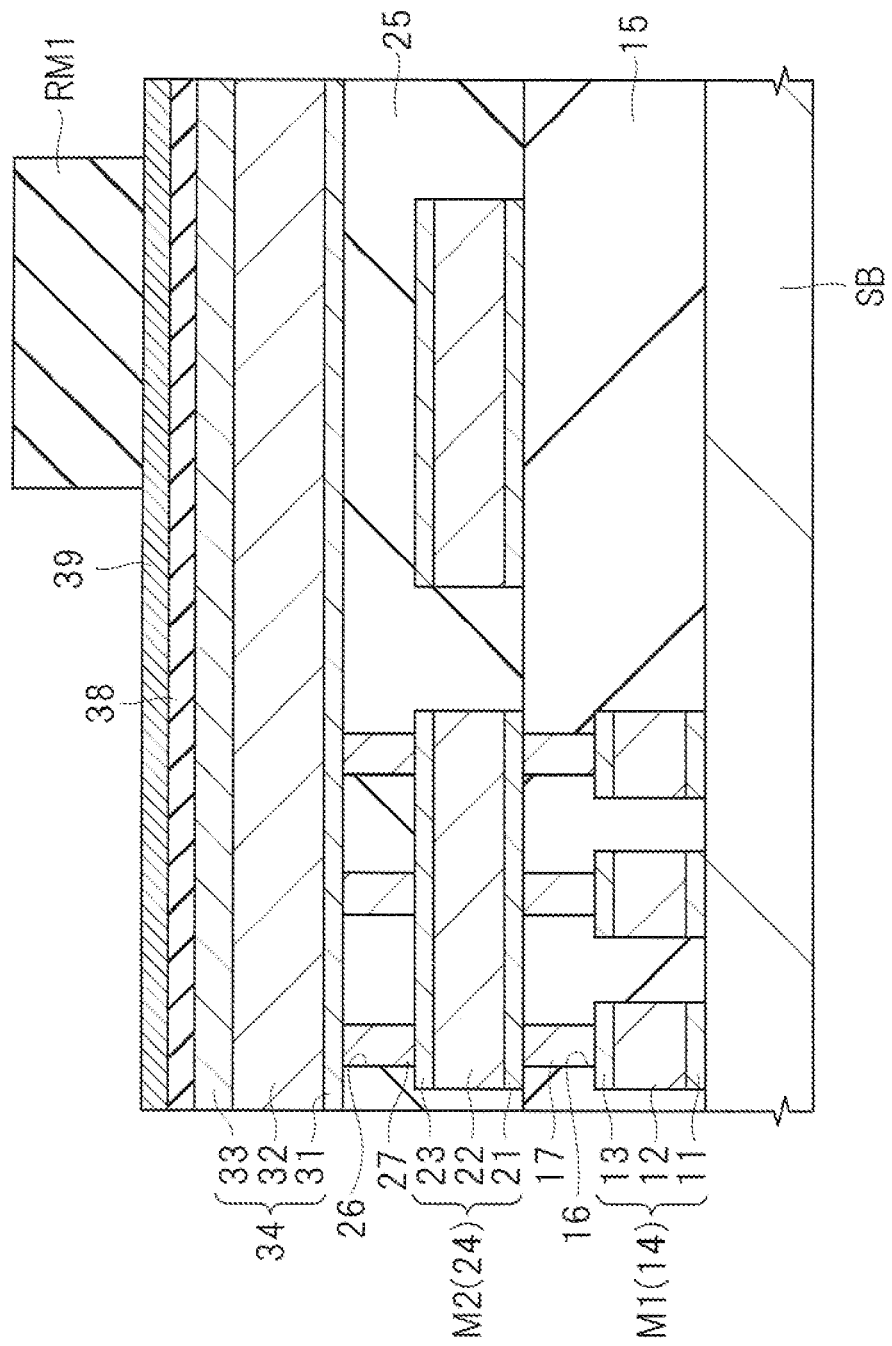
FIG. 7 is a sectional view of the main part in the manufacturing process of the semiconductor device of the first embodiment.

Subsequently, as shown in FIG. 7, a resist mask RM1 is formed (step S14). In step S14, the photoresist film applied onto the conductive film 39 is exposed and developed by using the photolithography technique, thereby leaving a photoresist film so as to cover a portion of the conductive film 39 serving as the conductive film PF1 (see FIG. 8). More specifically, a portion of the photoresist film located in a region in which the conductive film PF1 is formed is left, thereby forming the resist mask RM1.

Figure 8:
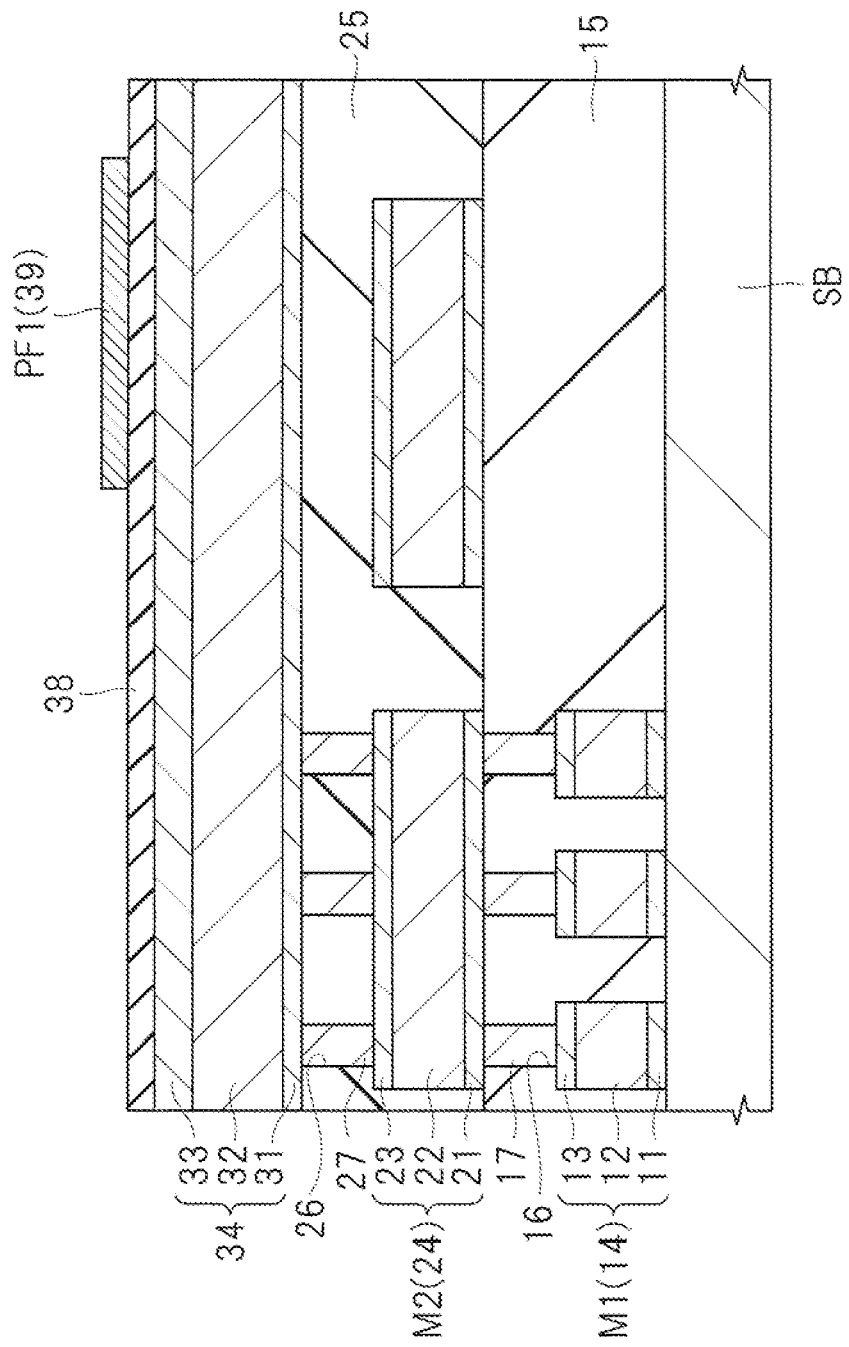
FIG. 8 is a sectional view of the main part in the manufacturing process of the semiconductor device of the first embodiment.

Next, as shown in FIG. 8, the conductive film PF1 is formed (step S15). In step S15, after the conductive film 39 is patterned or processed by the dry etching technique using the resist mask RM1 as a mask, the resist mask RM1 is removed. In this manner, the conductive film PF1 made of the conductive film 39 is formed.

Figure 9:
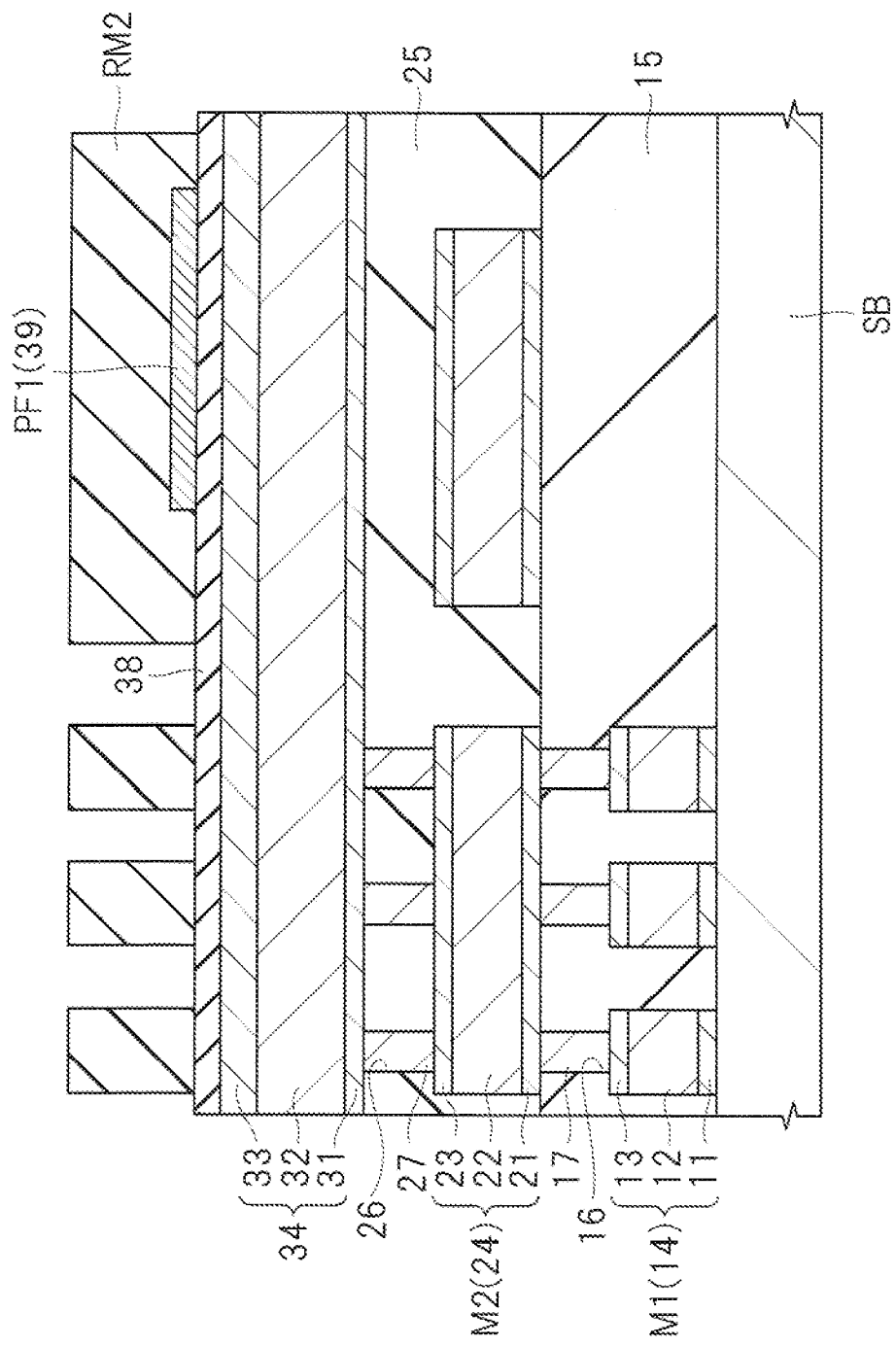
FIG. 9 is a sectional view of the main part in the manufacturing process of the semiconductor device of the first embodiment.

Next, as shown in FIG. 9, a resist mask RM2 is formed (step S16). In step S16, the photoresist film applied onto the conductive film PF1 and the insulating film 38 is exposed and developed by using the photolithography technique, thereby leaving a photoresist film so as to cover portions of the stacked film 34 serving as the lower electrode BE1 and the third-layer wiring M3. More specifically, portions of the photoresist film located in regions in which the lower electrode BE1 and the third-layer wiring M3 are formed are left, thereby forming the resist mask RM2.

Figure 10:
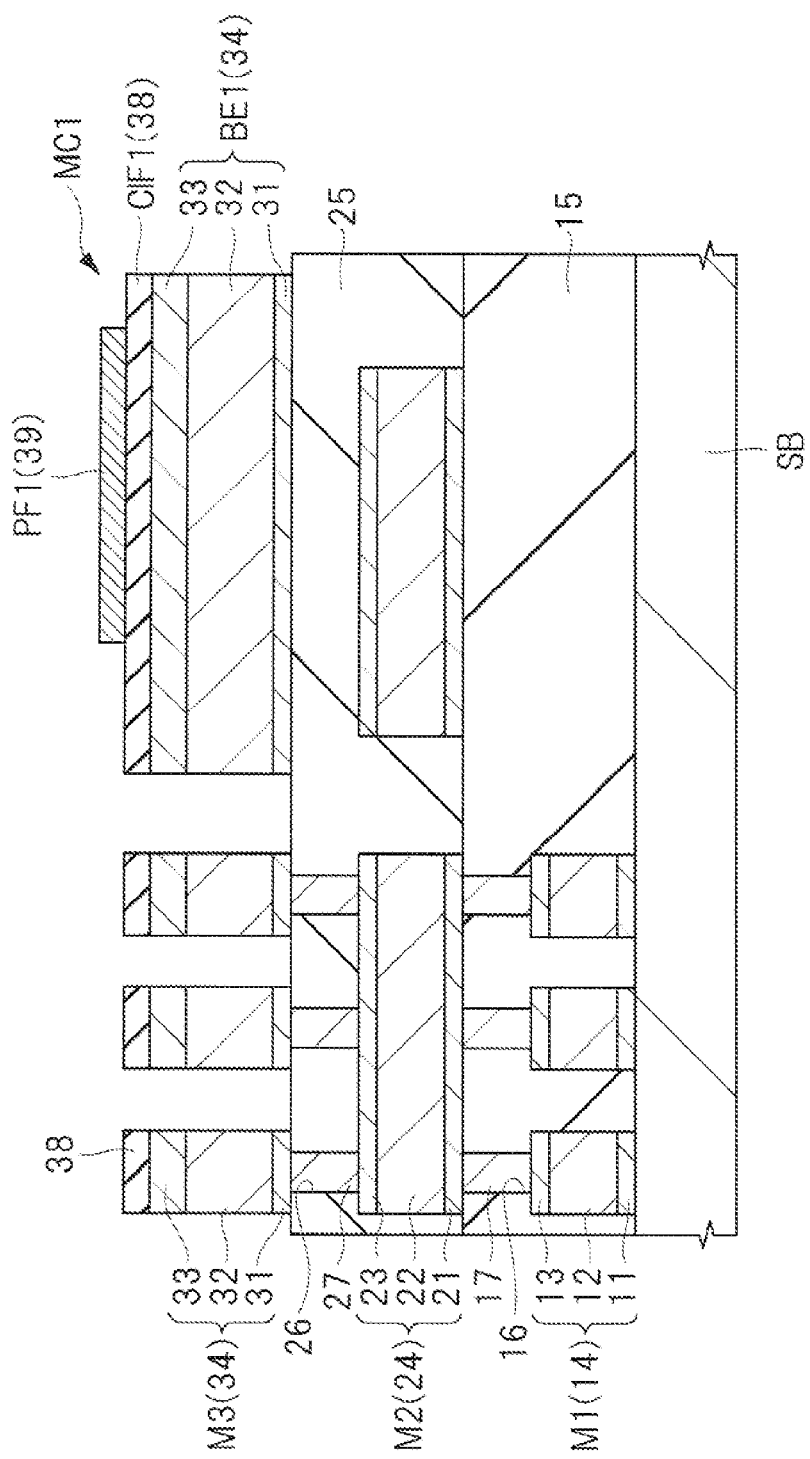
FIG. 10 is a sectional view of the main part in the manufacturing process of the semiconductor device of the first embodiment.

Subsequently, as shown in FIG. 10, the capacitive film CIF1, the lower electrode BE1, and the third-layer wiring M3 are formed (step S17). In step S17, after the insulating film 38, the barrier conductive film 33, the main conductive film 32, and the barrier conductive film 31 are patterned or processed by the dry etching technique using the resist mask RM2 as a mask, the resist mask RM2 is removed.

In this manner, the capacitive film CIF1 made of the insulating film. 38 and disposed under the conductive film. PF1 serving as apart of the upper electrode and the lower electrode BE1 composed of the stacked film 34 and disposed under the capacitive film CIF1 are formed. More specifically, the lower electrode BE1 is formed on the second interlayer insulating film 25, the capacitive film CIF1 is formed on the lower electrode BE1, and the conductive film PF1 is formed on the capacitive film CIF1. At this time, the lower electrode BE1, the capacitive film CIF1, and the conductive film PF1 form the MIM capacitor MC1 as a capacitive element.

In addition, the third-layer wiring M3 composed of the stacked film 34 is formed away from the lower electrode BE1. More specifically, when seen in a plan view, the third-layer wiring M3 composed of the stacked film 34 is formed in a region different from the region in which the lower electrode BE1 is formed. Note that, as shown in FIG. 10, the insulating film 38 may be left on the third-layer wiring M3.

Figure 11:
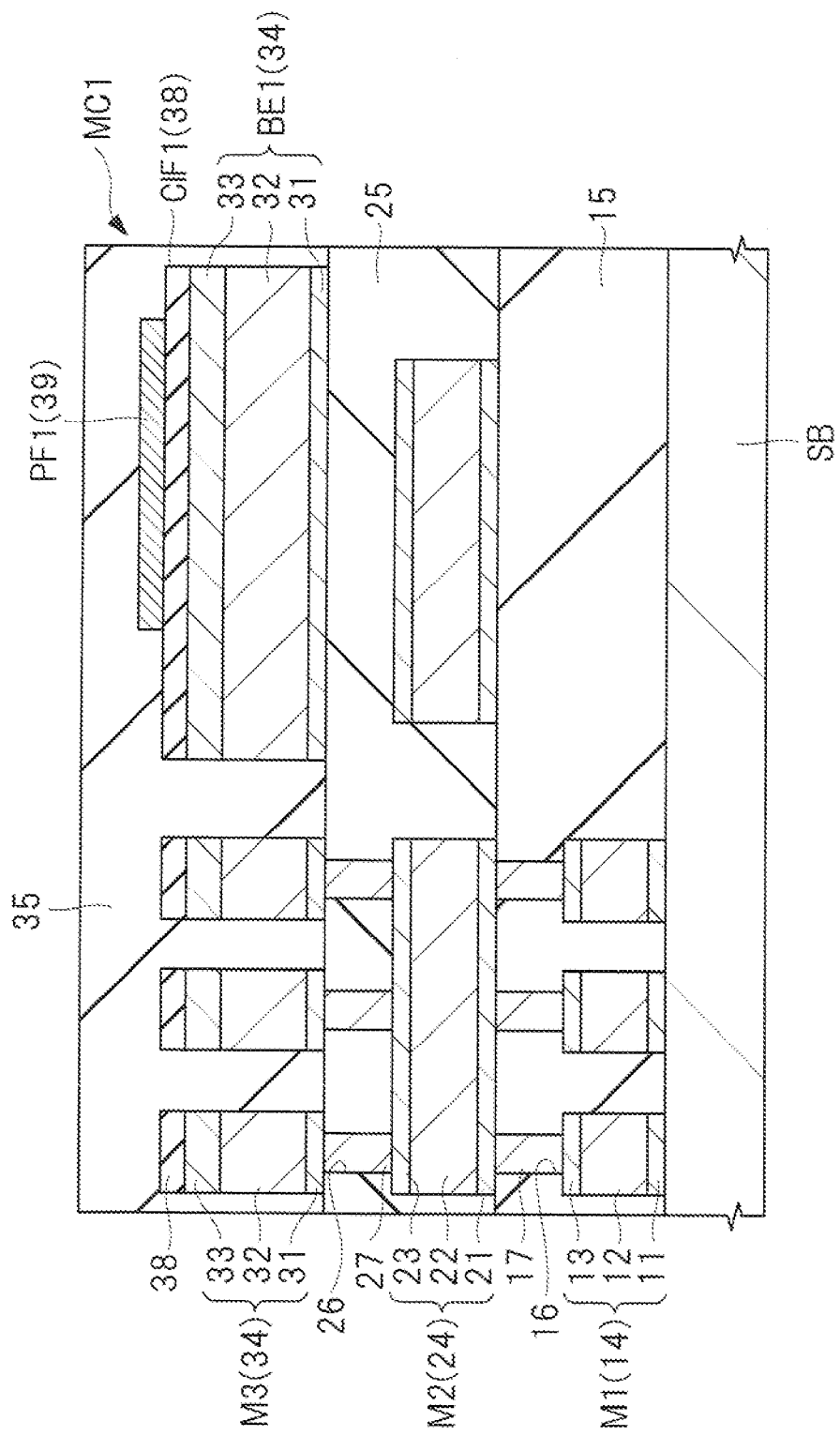
FIG. 11 is a sectional view of the main part in the manufacturing process of the semiconductor device of the first embodiment.

Next, as shown in FIG. 11, the third interlayer insulating film 35 is formed (step S18). In step S18, after an $SiO_2$ film having a thickness of, for example, 1,300 nm is formed on the lower electrode BE1, the capacitive film CIF1, the conductive film PF1, and the third-layer wiring M3 by the plasma CVD method, the formed $SiO_2$ film is polished and planarized by the CMP method, thereby forming the third interlayer insulating film 35.

Figure 12:
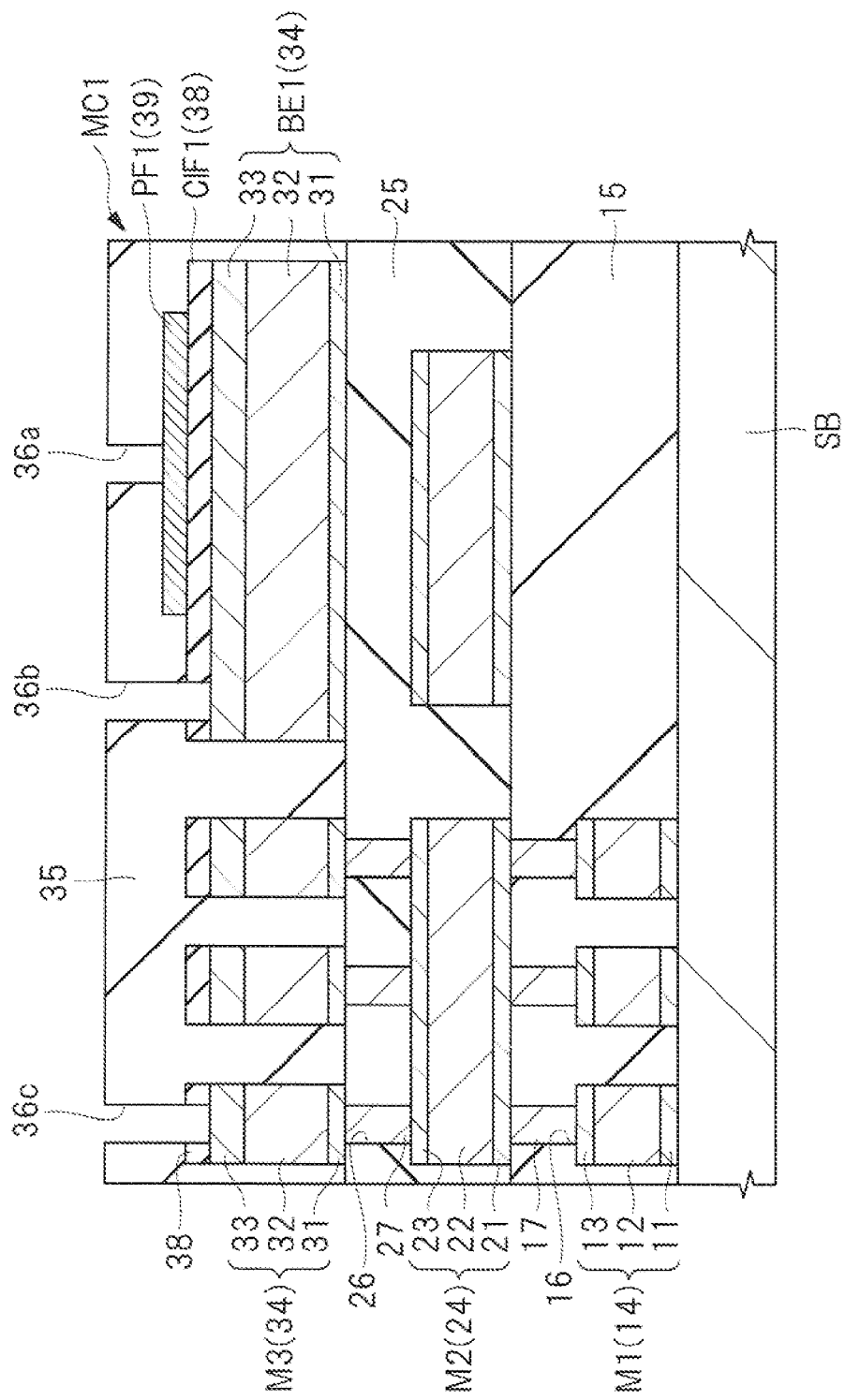
FIG. 12 is a sectional view of the main part in the manufacturing process of the semiconductor device of the first embodiment.

Next, as shown in FIG. 12, the opening portions 36a, 36b, and 36c are formed (step S19). In step S19, the third interlayer insulating film 35 is patterned or processed by using the photolithography technique and the dry etching technique, thereby forming the opening portion 36a reaching the conductive film PF1 through the third interlayer insulating film 35. In addition, in step S19, the opening portion 36b reaching the lower electrode BE1 through the third interlayer insulating film 35 and the capacitive film CIF1 is formed. Furthermore, in step S19, the opening portion 36c reaching the third-layer wiring M3 through the third interlayer insulating film 35 is formed.

Figure 13:
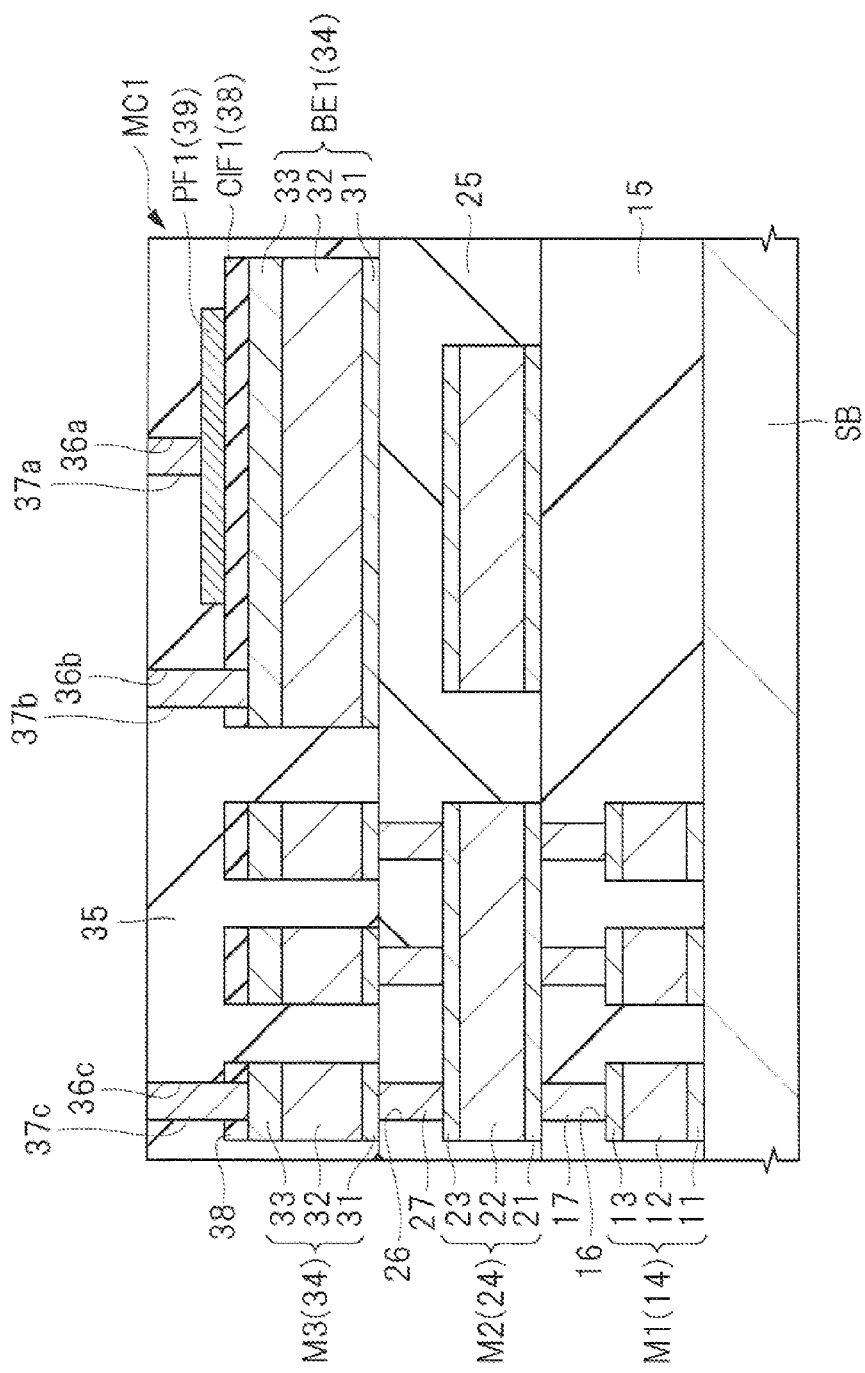
FIG. 13 is a sectional view of the main part in the manufacturing process of the semiconductor device of the first embodiment.

Subsequently, as shown in FIG. 13, the plugs 37a, 37b, and 37c are formed (step S20). In step S20, a barrier conductive film made of, for example, a TiN film is formed on the conductive film PF1 exposed in the opening portion 36a, the lower electrode BE1 exposed in the opening portion 36b, the third-layer wiring M3 exposed in the opening portion 36c, the side walls of the opening portions 36a, 36b, and 36c, and the third interlayer insulating film 35 by the sputtering method. Then, a main conductive film made of, for example, a W film is formed on the formed barrier conductive film by the CVD method so as to fill the opening portions 36a, 36b, and 36c. Thereafter, portions of the main conductive film and barrier conductive film other than the portions in the opening portions 36a, 36b, and 36c, that is, the main conductive film and the barrier conductive film on the third interlayer insulating film 35 are polished and removed by the CMP method.

In this manner, the plug 37a electrically connected to the conductive film PF1 is formed in the opening portion 36a so as to fill the opening portion 36a. In addition, the plug 37b electrically connected to the lower electrode BE1 is formed in the opening portion 36b so as to fill the opening portion 36b. Furthermore, the plug 37c electrically connected to the third-layer wiring M3 is formed in the opening portion 36c so as to fill the opening portion 36c.

Figure 14:
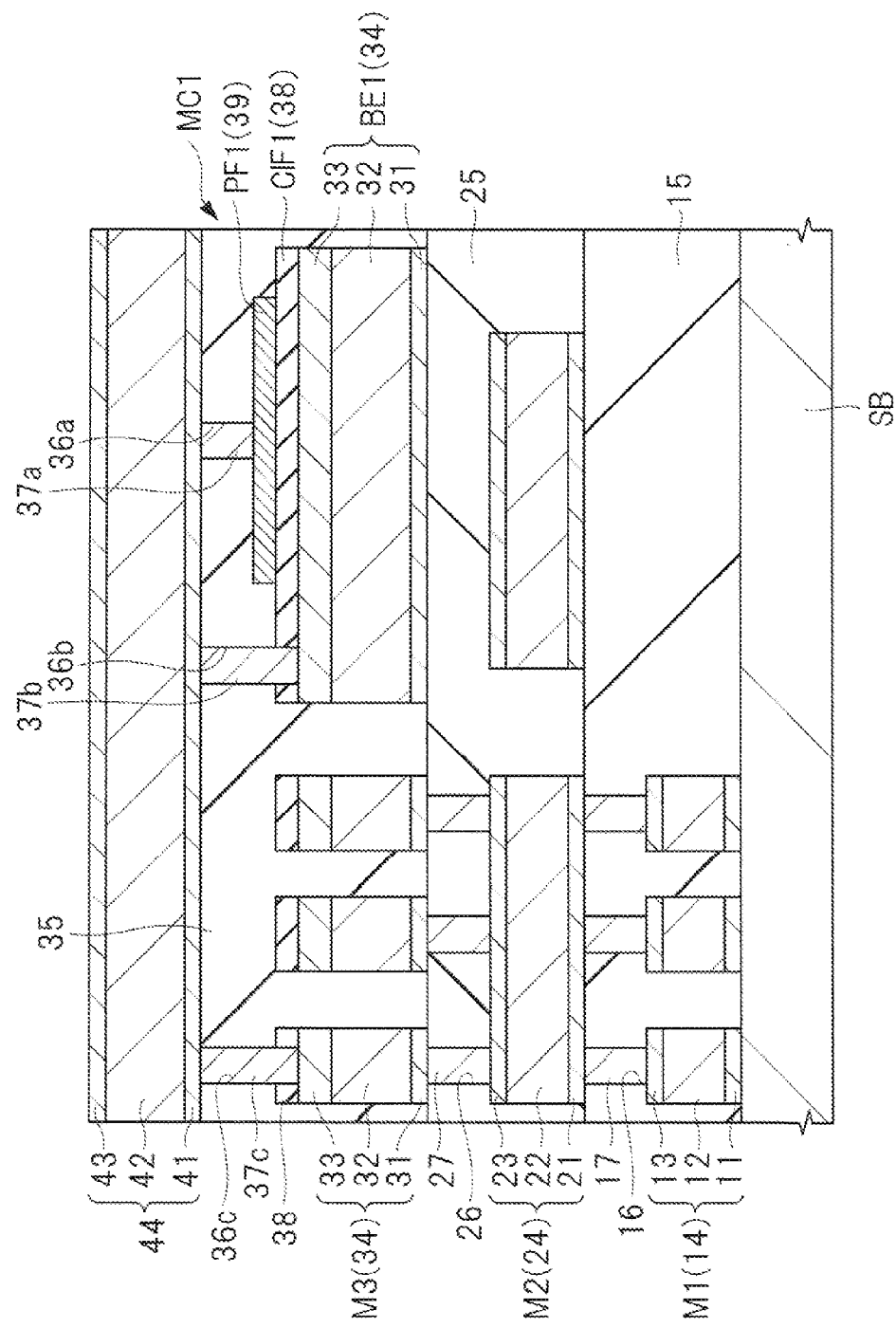
FIG. 14 is a sectional view of the main part in the manufacturing process of the semiconductor device of the first embodiment.

Subsequently, as shown in FIG. 14, the stacked film 44 serving as the upper electrode TE1 (see FIG. 1) and the fourth-layer wiring M4 (see FIG. 1) is formed (step S21). In step S21, the stacked film 44 composed of the barrier conductive film 41, the main conductive film 42, and the barrier conductive film 43 sequentially formed from below is formed on the plugs 37a, 37b, and 37c and the third interlayer insulating film 35.

As the barrier conductive film 41, a film containing Ti and a film containing Ti and N can be sequentially formed from below. More specifically, a Ti film having a thickness of, for example, 10 nm and a TiN film having a thickness of, for example, 30 nm can be sequentially formed from below by the sputtering method. As the main conductive film 42, a film containing Al can be formed. More specifically, an alloy film having a thickness of, for example, 600 nm and containing Al as a main component, that is, an Al alloy film can be formed by the sputtering method. As the barrier conductive film 43, a film containing Ti and a film containing Ti and N can be sequentially formed from below. More specifically, a Ti film having a thickness of, for example, 10 nm and a TiN film having a thickness of, for example, 20 nm can be sequentially formed from below by the sputtering method.

Figure 15:
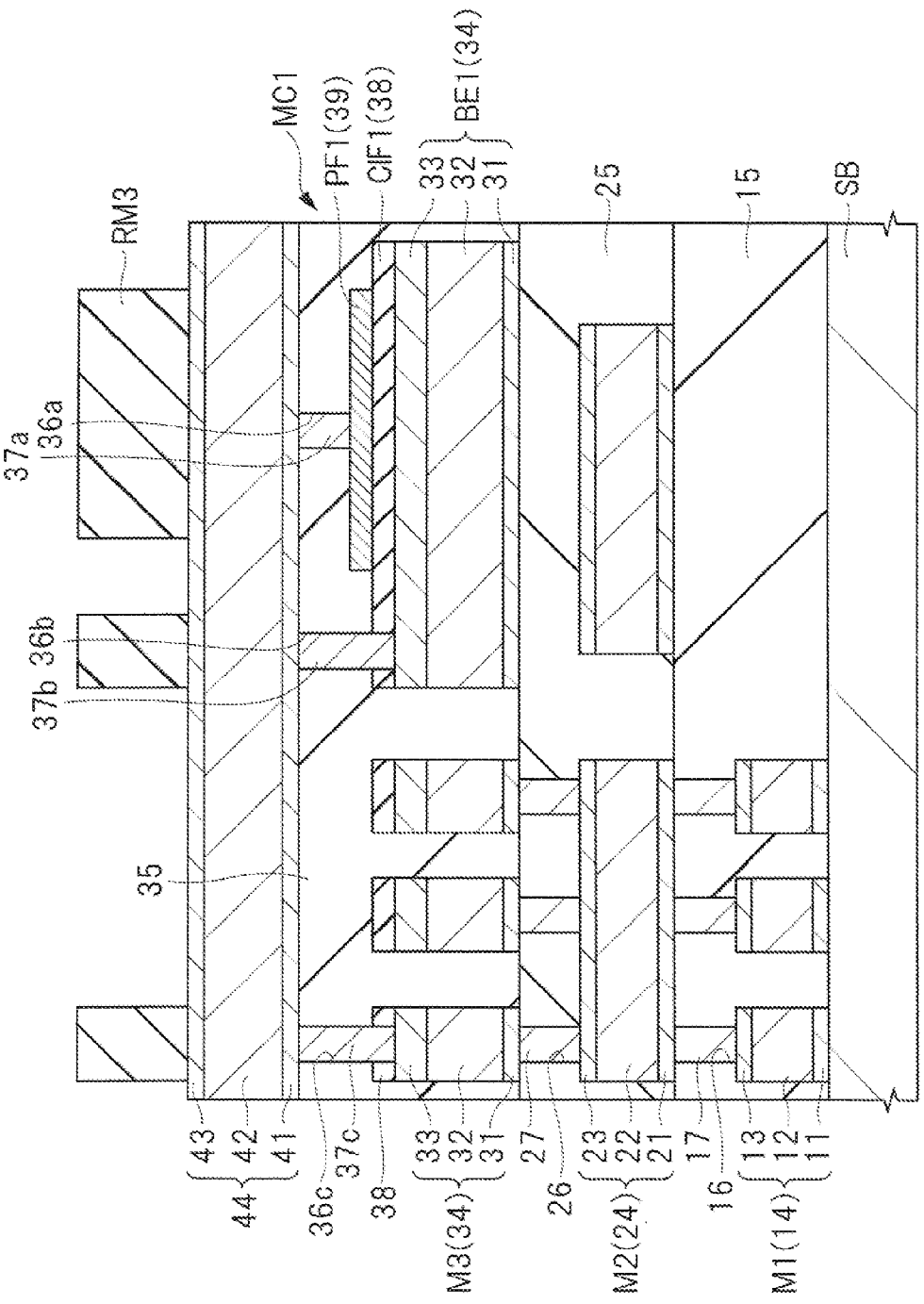
FIG. 15 is a sectional view of the main part in the manufacturing process of the semiconductor device of the first embodiment.

Next, as shown in FIG. 15, a resist mask RM3 is formed (step S22). In step S22, the photoresist film applied onto the stacked film 44 is exposed and developed by using the photolithography technique so as to leave portions of the photoresist film located in regions in which the upper electrode TE1 and the fourth-layer wiring M4 are formed, thereby forming the resist mask RM3.

Subsequently, after the barrier conductive film 43, the main conductive film 42, and the barrier conductive film 41 are patterned or processed by the dry etching technique using the resist mask RM3 as a mask, the resist mask RM3 is removed. In this manner, the upper electrode TE1 composed of the stacked film 44 and electrically connected to the plug 37a and the fourth-layer wiring M4 composed of the stacked film 44 and electrically connected to the plugs 37b and 37c are formed. Through the process so far, the semiconductor device shown in FIG. 1 is manufactured.

Figure 16:
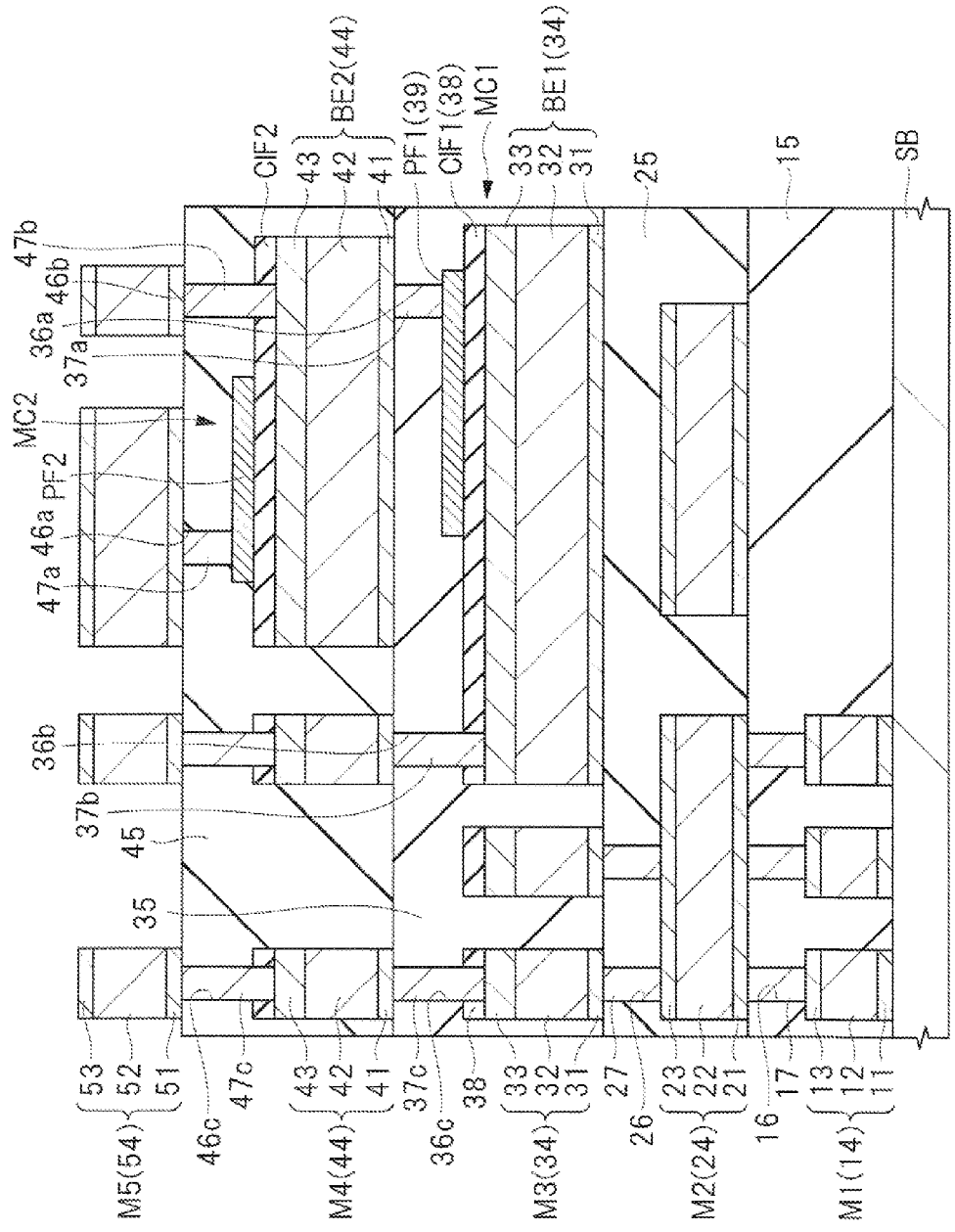
FIG. 16 is a sectional view of the main part in the manufacturing process of the semiconductor device of the first embodiment.

In addition, as shown in FIG. 16, MIM capacitors may be formed in a plurality of different layers in the semiconductor device.

For example, after the process in step S21 is performed, an insulating film serving as a capacitive film CIF2 and a conductive film serving as a conductive film PF2 are formed on the stacked film 44. Then, the conductive film PF2, the capacitive film CIF2, and the fourth-layer wiring M4 and a lower electrode BE2 composed of the stacked film 44 are formed by using the photolithography technique and the dry etching technique. At this time, the lower electrode BE2, the capacitive film CIF2, and the conductive film PF2 form a MIM capacitor MC2 as a capacitive element.

Next, a fourth interlayer insulating film 45 is formed. Then, an opening portion 46a reaching the conductive film PF2 through the fourth interlayer insulating film 45 is formed, an opening portion 46b reaching the lower electrode BE2 through the fourth interlayer insulating film 45 and the capacitive film CIF2 is formed, and an opening portion 46c reaching the fourth-layer wiring M4 through the fourth interlayer insulating film 45 is formed. Next, plugs 47a, 47b, and 47c are formed in the opening portions 46a, 46b, and 46c, respectively. Thereafter, a fifth-layer wiring M5 composed of a stacked film 54 obtained by stacking a barrier conductive film 51, a main conductive film 52, and a barrier conductive film 53 is formed on the plug 47a, the plug 47b, the plug 47c, and the fourth interlayer insulating film 45. Through the process so far, as shown in FIG. 16, the semiconductor device including the two MIM capacitors MC1 and MC2 is manufactured.

<Surface Roughness and Defect Density>

Next, the relationship between the surface roughness of the upper surface 34a of the stacked film 34 serving as the lower electrode BE1 and defect density will be described with reference to a comparative example. In the following description, the case in which the ratio of the surface roughness RMS of the upper surface 34a of the stacked film 34 formed in step S12 to the thickness FT1 of the insulating film 38 formed in step S13 in the manufacturing process of the semiconductor device described above exceeds 14% is taken as the comparative example 1.

Note that, in the following description, the surface roughness of the upper surface 34a of the stacked film 34 will also be simply referred to as the surface roughness of the stacked film 34.

Figure 17:
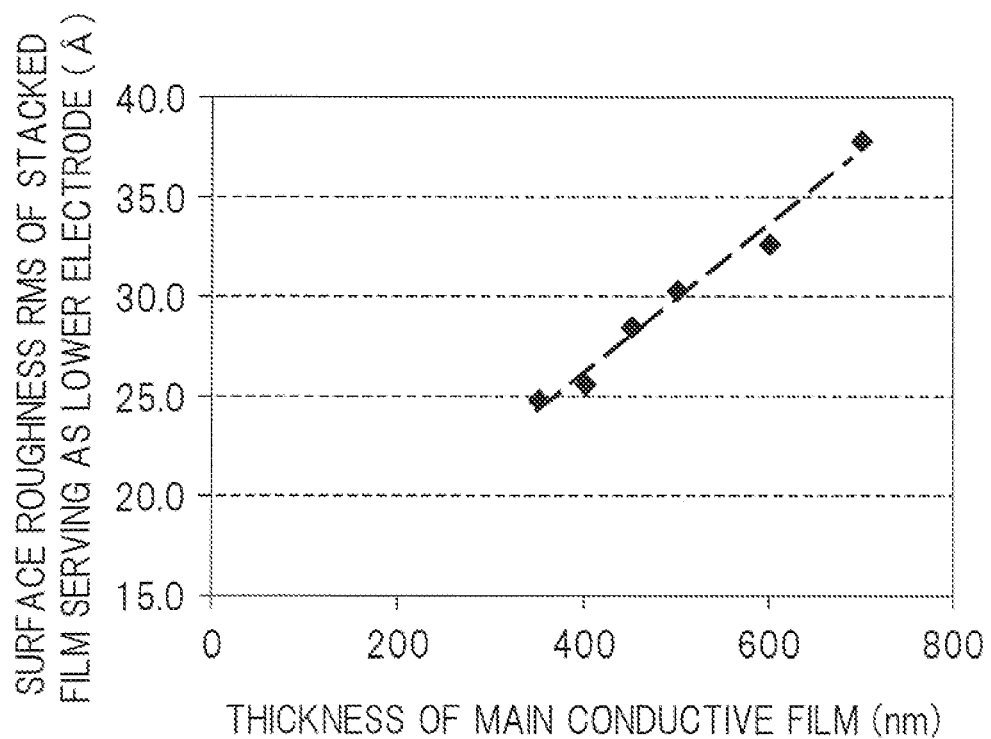
FIG. 17 is a graph showing the thickness dependence of a main conductive film on the surface roughness of the upper surface of a stacked film serving as a lower electrode in a comparative example 1.
Figure 18:
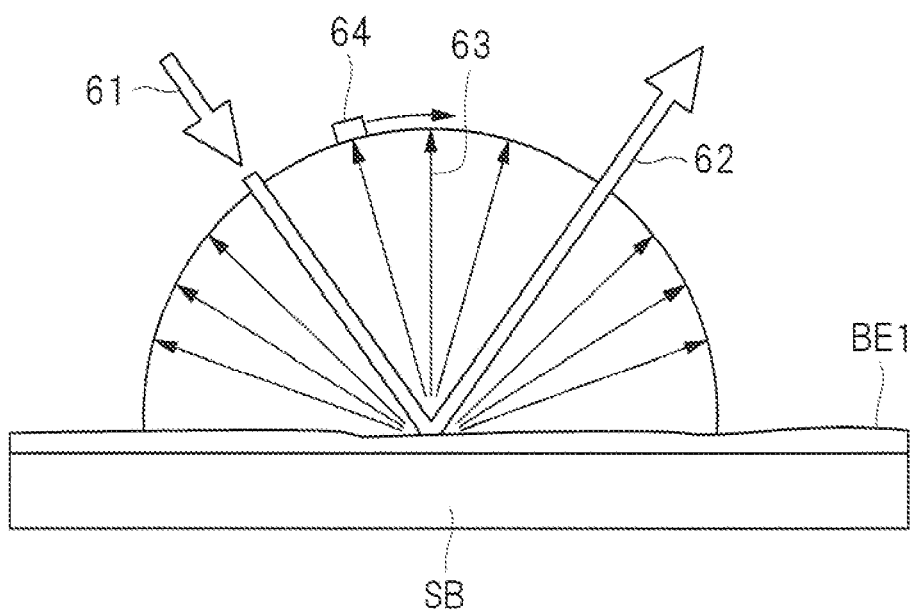
FIG. 18 is a view for describing a measurement method of surface roughness using an integrated scatterometer.

FIG. 17 is a graph showing the thickness dependence of the main conductive film on the surface roughness of the upper surface of the stacked film serving as the lower electrode in the comparative example 1. FIG. 18 is a view for describing a measurement method of surface roughness using an integrated scatterometer.

Also in the comparative example 1, like the first embodiment, the stacked film 34 is obtained by sequentially stacking a film 31a made of a Ti film, a film 31b made of a TiN film, a main conductive film 32 made of an Al film, a film 33a made of a Ti film, and a film 33b made of a TiN film from below as shown in FIG. 3. The film 31a, the film 31b, the main conductive film 32, the film 33a, and the film 33b each are formed by the sputtering method. Also, in the comparative example 1, semiconductor devices with different thicknesses are manufactured while changing the thickness of the main conductive film 32. In addition, in the comparative example 1, the insulating film 38 is made of an $SiO_2$ film formed by the plasma CVD method.

As described above, the surface roughness is the surface roughness RMS as a root-mean-square roughness. In this case, as the surface roughness RMS, the measurement value measured by an integrated scatterometer is used. As shown in FIG. 18, the integrated scatterometer is designed to irradiate the surface of the lower electrode BE1 formed on the semiconductor substrate SB as a measured sample with laser light 61 and detect the intensity of scattered light 63 scattered in directions different from the direction of specular light 62 formed by specular reflection of the irradiated laser light 61 by a detector 64. For example, the detector 64 is provided so as to be rotatable about the irradiation position of the laser light 61, and the data of rotational angle dependence on the intensity of the scattered light 63 is acquired by measuring the intensity of the scattered light 63 by the detector 64 while changing the rotational angle of the detector 64. Then, by analyzing the acquired data, the surface roughness can be measured.

As described above, even after a semiconductor device is manufactured, it is possible to manufacture a sample in which the upper surface 34a of the lower electrode BE1 is exposed by removing a portion above the lower electrode BE1, that is, the capacitive film CIF1 and others. Then, the surface roughness of the exposed upper surface 34a of the lower electrode BE1 of the manufactured sample can be measured by using, for example, the integrated scatterometer. Alternatively, a cross-section observation sample whose cross-section including an interface between the lower electrode BE1 and the capacitive film CIF1 can be observed can be manufactured by, for example, an FIB process. Then, by observing the interface between the lower electrode BE1 and the capacitive film CIF1 of the manufactured cross-section observation sample by, for example, SEM, the surface roughness of the upper surface 34a of the lower electrode BE1 can be measured.

Furthermore, the measurement values measured by various types of measuring instruments such as an AFT (Atomic Force Microscope) instead of the integrated scatterometer can be used as the surface roughness.

As shown in FIG. 17, it can be found in the comparative example 1 that, in the range of the thickness of the main conductive film 32 of 400 nm or more, as the thickness of the main conductive film 32 increases, the surface roughness RMS of the upper surface 34a of the stacked film 34 increases, and the planarity of the surface of the stacked film 34 decreases. In addition, according to the broken line in FIG. 17 obtained by the linear approximation of measurement points by the least square method, since the broken line is close to the measurement points, it can be found that the surface roughness of the upper surface 34a of the stacked film 34 linearly increases with respect to the thickness of the main conductive film 32.

Note that, although the upper surface 34a of the stacked film 34 is the upper surface of the barrier conductive film 33, since the thickness of the barrier conductive film 33 is smaller than that of the main conductive film 32, it is considered that the surface roughness of the upper surface of the barrier conductive film 33 is almost equal to the surface roughness of the upper surface of the main conductive film 32. More specifically, it is considered that the surface roughness of the upper surface 34a of the stacked film 34 is almost equal to the surface roughness of the upper surface of the main conductive film 32.

Figure 19:
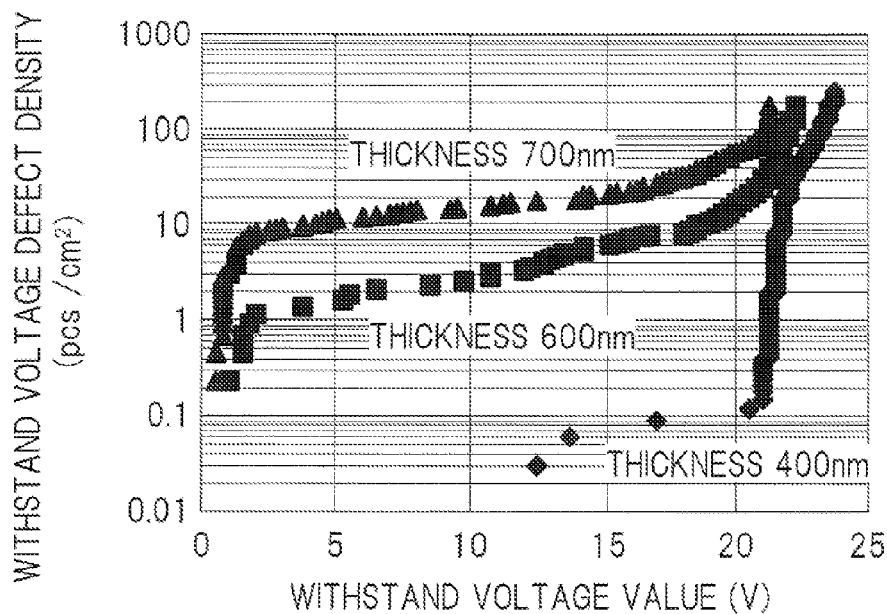
FIG. 19 is a graph showing the cumulative frequency distributions of the withstand voltage values of MIM capacitors in the comparative example 1.

FIG. 19 is a graph showing the cumulative frequency distributions of the withstand voltage values of MIM capacitors in the comparative example 1.

FIG. 19 shows the cumulative frequency distributions of measured withstand voltage values, which are obtained by measuring the withstand voltage values of many MIM capacitors MC1 formed in a plane of the semiconductor substrate SB in the cases in which thicknesses of the main conductive film 32 made of an Al film are 400 nm, 600 nm, and 700 nm in the semiconductor device of the comparative example 1. As described above, the withstand voltage value is a voltage value at which a leakage current rapidly increases. In FIG. 19, withstand voltage values are plotted on the horizontal axis, and withstand voltage defect densities are plotted on the vertical axis. For example, the state where the withstand voltage defect density is 10 pcs/cm² when the withstand voltage value is 5 V means that there are 10 MIM capacitors MC1 whose withstand voltage value is 5 V or less per 1 cm².

As shown in FIG. 19, in the comparative example 1, as the thickness of the main conductive film 32 increases, the withstand voltage value of the MIM capacitor MC1 decreases, and variations in the withstand voltage value of the MIM capacitors MC1 increase. It is considered that this is because the surface roughness of the upper surface of the main conductive film 32 increases as the thickness of the main conductive film 32 increases, and the planarity of the surface of the main conductive film 32 decreases, so that a leakage current easily flows between the lower electrode BE1 and the conductive film PF1. In other words, it is considered that the surface roughness of the upper surface 34a of the stacked film 34 increases as the thickness of the main conductive film 32 increases, and the planarity of the surface of the stacked film 34 decreases, so that the withstand voltage value of the MIM capacitor MC1 decreases and variations in the withstand voltage value of the MIM capacitors MC1 increase.

In the semiconductor device described in Patent Document 1 mentioned above, the lower electrode of a MIM capacitor is formed by sequentially stacking the first barrier layer, the first aluminum layer, and the second barrier layer from below, and the surface roughness of the first aluminum layer is less than a predetermined value. In the semiconductor device described in Patent Document 1 mentioned above, when the planarity of the surface of the first aluminum layer is improved, variations in the withstand voltage of the MIM capacitors are suppressed. Therefore, in the semiconductor device described in Patent Document 1, in order to suppress variations in the withstand voltage of the MIM capacitors, the surface roughness of the first aluminum layer is made smaller than the predetermined value. In addition, in the semiconductor device described in Patent Document 1, the surface roughness of the first aluminum layer is measured by an AFM, and by changing the film formation method of the first barrier layer, the surface roughness of the first aluminum layer formed on the first barrier layer and having a thickness of 150 nm is changed.

In order to reduce the electric resistance of the main conductive film 32, it is preferable to increase the thickness of the main conductive film 32. As shown in FIGS. 17 and 19, however, it has been found that the surface roughness RMS of the upper surface 34a of the stacked film 34 increases as the thickness of the main conductive film 32 increases, and the planarity of the surface of the stacked film 34 decreases, so that the withstand voltage value of the MIM capacitor MC1 decreases and variations in withstand voltage value increase. Therefore, in order to increase the withstand voltage value of the MIM capacitor and suppress variations in withstand voltage value, it is necessary to consider the thickness dependence of the main conductive film on the withstand voltage value of the MIM capacitor.

In the semiconductor device described in Patent Document 1, however, there is no consideration to the dependence of the thickness of the first aluminum layer on the withstand voltage value of the MIM capacitor. For this reason, in the semiconductor device described in Patent Document 1, when the thickness of the main conductive film increases, it is not possible to suppress a decrease in the withstand voltage value of the MIM capacitor and suppress variations in withstand voltage value, with the result that it is not possible to improve the performance of the semiconductor device. For example, in the range in which the thickness of the main conductive film is 400 nm or more, it is not possible to suppress a decrease in the withstand voltage value of the MIM capacitor and suppress variations in withstand voltage value, with the result that it is not possible to improve the performance of the semiconductor device.

On the other hand, in the MIM capacitor described in Patent Document 2 mentioned above, the TiN film, the Ti film, the lower metal film, the dielectric film, and the upper metal film are sequentially formed from below, and the surface of the lower metal film is roughened. In the MIM capacitor described in Patent Document 2, the surface of the lower metal film is roughened to increase the capacitance of the MIM capacitor.

In the MIM capacitor described in Patent Document 2, however, although it is possible to increase the capacitance of the MIM capacitor, when the thickness of the main conductive film increases, it is not possible to suppress a decrease in the withstand voltage value of the MIM capacitor and suppress variations in withstand voltage value, with the result that it is not possible to improve the performance of the semiconductor device. Also, in the MIM capacitor described in Patent Document 2, the surface of the lower metal film is roughened. For this reason, when forming an insulating film serving as a capacitive film, it is necessary to use a film formation method excellent in step coverage, for example, an ALD (Atomic Layer Deposition) method, and this may increase the manufacturing cost.

In addition, in the manufacturing process of the semiconductor device described in Patent Document 3 mentioned above, after a conductive film serving as the lower electrode of the MIM capacitor is formed, heat treatment is performed at a temperature higher than the formation temperature of the conductive film to reorient the Al crystal grains contained in the conductive film.

In the manufacturing process of the semiconductor device described in Patent Document 3, however, although it is possible to reduce local stress applied to the capacitive film, when the thickness of the main conductive film increases, it is not possible to suppress the decrease in withstand voltage value and suppress variations in withstand voltage value, with the result that it is not possible to improve the performance of the semiconductor device.

Main Characteristics and Effects of Present Embodiment

On the other hand, according to the first embodiment, the ratio of the surface roughness RMS of the upper surface 34a of the stacked film 34 serving as the lower electrode BE1 to the thickness FT1 of the insulating film 38 serving as the capacitive film CIF1 is 14% or less.

Here, the relationship between the surface roughness of the upper surface 34a of the stacked film. 34 and the defect density will be described with reference to a working example of the first embodiment. In the following description, the case in which the ratio of the surface roughness RMS of the upper surface 34a of the stacked film 34 formed in step S12 to the thickness FT1 of the insulating film 38 formed in step S13 in the manufacturing process of the semiconductor device described above is 14% or less is taken as a working example 1.

Figure 20:
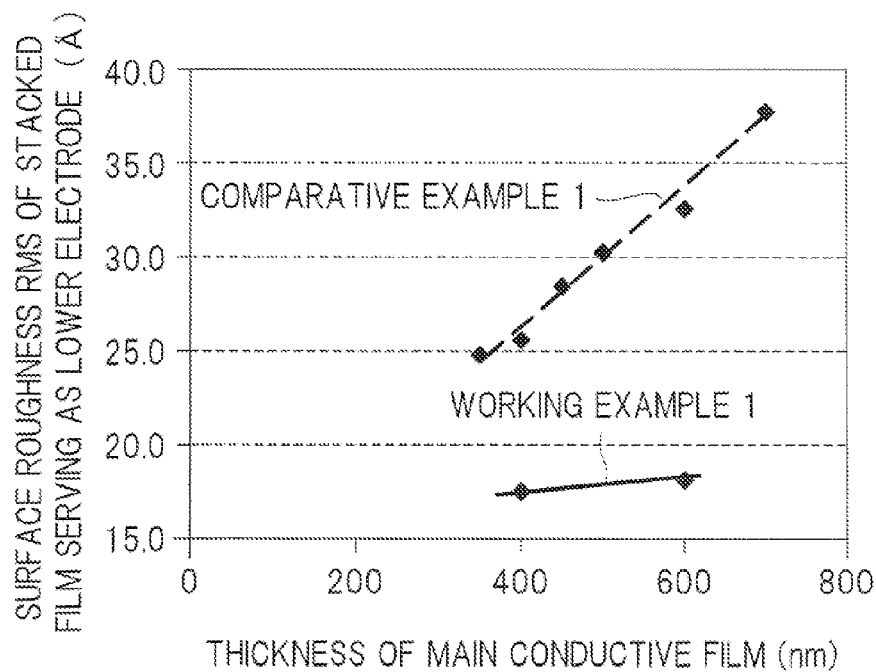
FIG. 20 is a graph showing the thickness dependence of the main conductive film on the surface roughness of the upper surface of the stacked film serving as the lower electrode in a working example 1 together with the thickness dependence in the comparative example 1.

FIG. 20 is a graph showing the thickness dependence of the main conductive film on the surface roughness of the upper surface of the stacked film serving as the lower electrode in the working example 1 together with the thickness dependence in comparative example 1.

In the working example 1, as shown in FIG. 3, the stacked film 34 is formed by sequentially stacking the film 31a made of a Ti film, the film 31b made of a TiN film, the main conductive film 32 made of an Al film, the film 33a made of a Ti film, and the film 33b made of a TiN film from below. The film 31a, the film 31b, the main conductive film 32, the film 33a, and the film 33b each are formed by the sputtering method. Also, in the working example 1, semiconductor devices with different thicknesses are manufactured while changing the thickness of the main conductive film 32. In addition, in the working example 1, the insulating film 38 is made of an $SiO_2$ film formed by the plasma CVD method.

As shown in FIG. 20, like the comparative example 1, also in the working example 1, in the range of the thickness of the main conductive film 32 of 400 nm or more, as the thickness of the main conductive film 32 increases, the surface roughness RMS of the upper surface 34a of the stacked film 34 increases, and the planarity of the surface of the stacked film 34 decreases. In addition, according to the solid line in FIG.

20 obtained by linear approximation of measurement values by the least square method, since the solid line is close to the measurement values, the surface roughness of the upper surface 34a of the stacked film 34 linearly increases with respect to the thickness of the main conductive film 32 also in the working example 1 like the comparative example 1.

As shown in FIG. 20, however, it has been confirmed that if the thicknesses of the main conductive films 32 are equal to each other, the surface roughness of the stacked film 34 decreases in the working example 1 as compared with the comparative example 1. More specifically, it has been confirmed that the surface roughness of the stacked film 34 including the main conductive film 32 having a thickness of either 400 nm or 600 nm in the working example 1 is considerably smaller than the surface roughness of the stacked film 34 including the main conductive film 32 having a thickness of 400 nm in the comparative example 1, that is, the surface roughness of about 25 Å. In other words, it has been confirmed that in the working example 1, even if the thickness of the main conductive film 32 increases, the surface roughness of the stacked film 34 decreases as compared with the comparative example 1.

Figure 21:
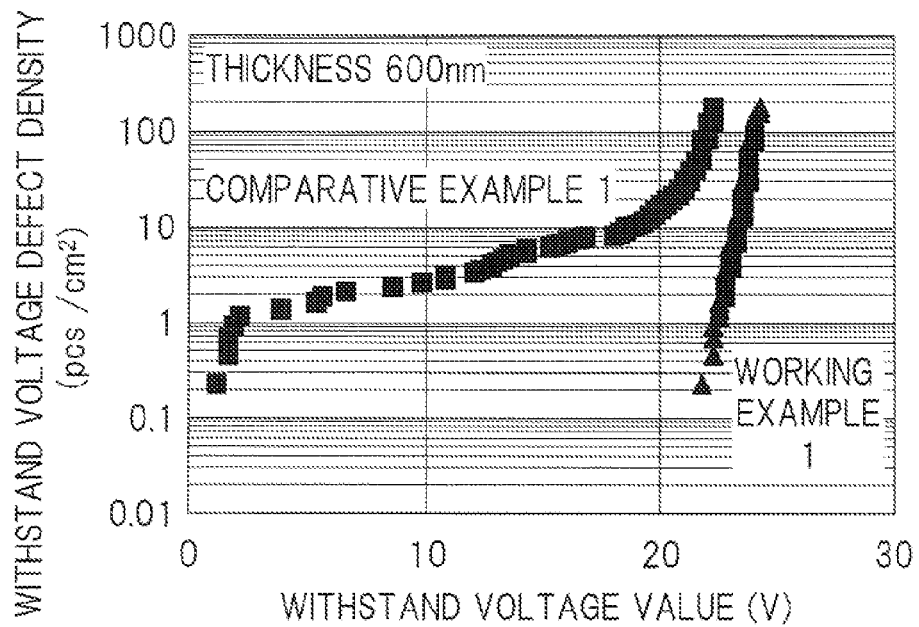
FIG. 21 is a graph showing the cumulative frequency distribution of the withstand voltage values of the MIM capacitors in the working example 1 together with the cumulative frequency distribution of the withstand voltage values in the comparative example 1.

FIG. 21 is a graph showing the cumulative frequency distribution of the withstand voltage values of the MIM capacitors of the working example 1 together with the cumulative frequency distribution of the withstand voltage values in the comparative example 1.

FIG. 21 shows the cumulative frequency distribution of measured withstand voltage values, which is obtained by measuring the withstand voltage values of many MIM capacitors MC1 formed in a plane of the semiconductor substrate SB in a case in which the main conductive film 32 made of an Al film has a thickness of 600 nm in the semiconductor device of the working example 1. In addition, FIG. 21 shows the cumulative frequency distribution of measured withstand voltage values in a case in which the main conductive film 32 has a thickness of 600 nm in the semiconductor device of the comparative example 1.

As shown in FIG. 21, it has been confirmed that, in the working example 1, the withstand voltage value of the MIM capacitor MC1 considerably increases and variations in the withstand voltage value of the MIM capacitor MC1 are suppressed as compared with the comparative example 1. It is considered that this is because the surface roughness of the upper surface of the main conductive film 32 decreases and the planarity of the surface of the main conductive film 32 is improved in the working example 1, which makes a leakage current harder to flow between the lower electrode BE1 and the conductive film PF1 as compared with the comparative example 1. In other words, it is considered that the surface roughness of the upper surface 34a of the stacked film 34 decreases and the planarity of the surface of the stacked film 34 is improved in the working example 1, so that the withstand voltage value of the MIM capacitor MC1 increases and variations in the withstand voltage value of the MIM capacitor MC1 are suppressed as compared with the comparative example 1.

Figure 22:
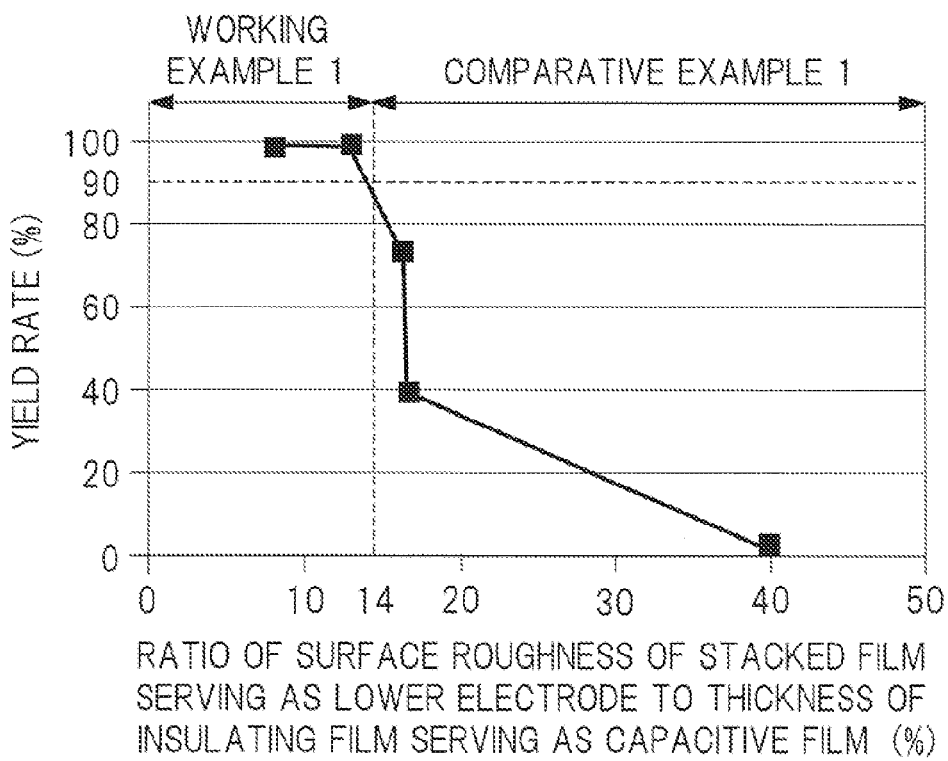
FIG. 22 is a graph showing the relationship between the ratio of the surface roughness of a stacked film serving as a lower electrode to the thickness of an insulating film serving as a capacitive film and the yield rate of MIM capacitors.

FIG. 22 is a graph showing the relationship between the ratio of the surface roughness of a stacked film serving as a lower electrode to the thickness of an insulating film serving as a capacitive film and the yield rate of MIM capacitors. Note that the yield rate of MIM capacitors means the ratio of MIM capacitors having withstand voltage values equal to or more than 85% of the maximum withstand voltage value of MIM capacitors to the many MIM capacitors formed in a plane of a semiconductor substrate. In addition, each semiconductor device having the stacked film 34 whose ratio of surface roughness to the thickness FT1 (see FIG. 3) of the insulating film 38 is 14% or less corresponds to the semiconductor device of the working example 1, and each semiconductor device having the stacked film 34 whose ratio of surface roughness to the thickness FT1 of the insulating film 38 exceeds 14% corresponds to the semiconductor device of the comparative example 1. Furthermore, in FIG. 22, measurement values are connected by straight lines.

As shown in FIG. 22, when the ratio of the surface roughness of the stacked film 34 to the thickness FT1 of the insulating film 38 exceeds 14%, that is, in the case of the semiconductor device of the comparative example 1, the yield rate of MIM capacitors is less than 90%. In contrast, when the ratio of the surface roughness of the stacked film 34 to the thickness FT1 of the insulating film 38 is 14% or less, that is, in the case of the semiconductor device of the working example 1, the yield rate of MIM capacitors is 90% or more. In other words, in the working example 1, since the ratio of the surface roughness of the stacked film 34 to the thickness FT1 of the insulating film 38 is 14% or less, the yield rate of MIM capacitors can be 90% or more. This is because it is possible to reduce the surface roughness of the stacked film 34, increase the withstand voltage value of the MIM capacitor, and suppress variations in withstand voltage value in the working example 1 as compared with the comparative example 1 as shown in FIGS. 20 and 21.

More specifically, in the first embodiment, since the ratio of the surface roughness of the stacked film 34 to the thickness FT1 of the insulating film 38 is 14% or less, it is possible to reduce the surface roughness of the lower electrode BE1, suppress a decrease in the withstand voltage value of the MIM capacitor, and suppress variations in withstand voltage value. As a result, it is possible to increase the yield rate of MIM capacitors to 90% or more.

Next, preferred film formation conditions for the main conductive film 32 to set the ratio of the surface roughness of the stacked film 34 to the thickness FT1 of the insulating film 38 to 14% or less will be described.

Figure 23:
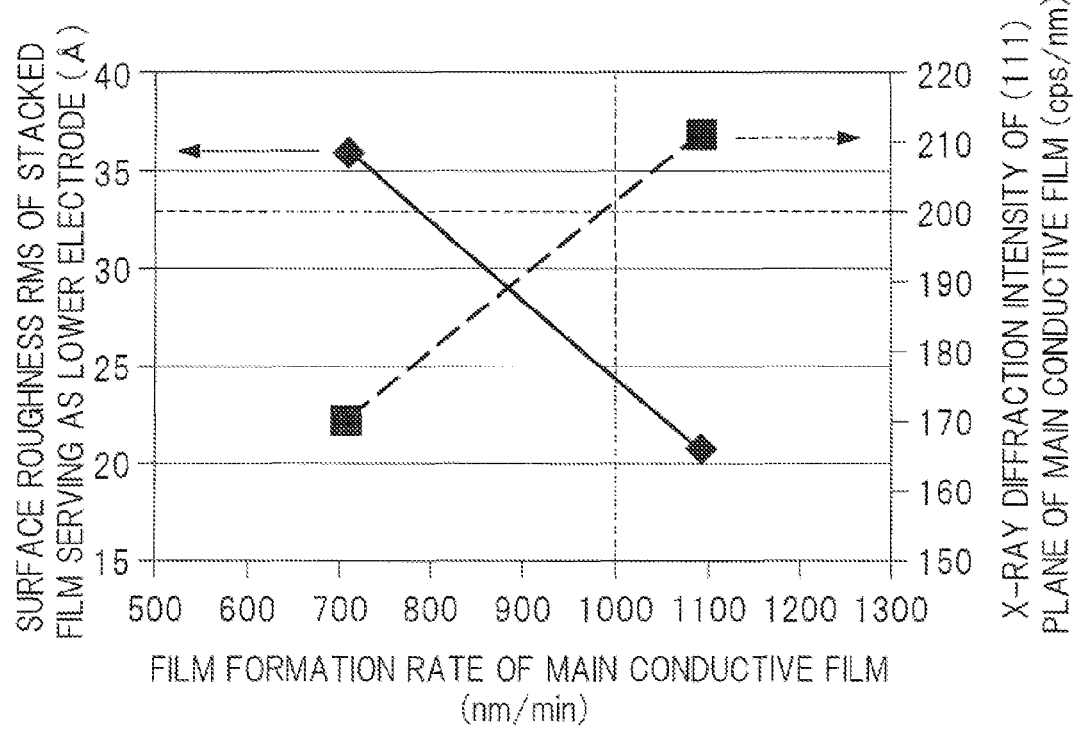
FIG. 23 is a graph showing the relationship between the film formation rate of a main conductive film, the surface roughness of a stacked film serving as a lower electrode, and the X-ray diffraction intensity on the (111) plane of a main conductive film.

FIG. 23 is a graph showing the relationship between the film formation rate of a main conductive film, the surface roughness of a stacked film serving as a lower electrode, and the X-ray diffraction intensity on the (111) plane of the main conductive film. In FIG. 23, the horizontal axis represents the film formation rate of the main conductive film 32 made of an Al film, the vertical axis on the left side represents the surface roughness RMS, that is, the root-mean-square roughness of the upper surface 34a of the stacked film 34, and the vertical axis on the right side represents the value obtained by dividing the X-ray diffraction intensity of the Al (111) plane of the main conductive film 32 made of an Al film by the thickness of the main conductive film 32. In FIG. 23, measurement values are connected by straight lines.

As shown in FIG. 23, as the film formation rate of the main conductive film 32 increases, the surface roughness RMS of the upper surface 34a of the stacked film. 34 decreases, and the value obtained by dividing the X-ray diffraction intensity of the (111) plane of the main conductive film 32 by the thickness of the main conductive film 32 increases. More specifically, as the film formation rate of the main conductive film 32 made of an Al film increases, the planarity of the upper surface 34a of the stacked film 34 is improved, and the (111) orientation of the main conductive film 32 made of an Al film is improved.

For the increase of the film formation rate of an Al film when forming the Al film by the sputtering method, various methods for adjusting film formation conditions are conceivable, such as increasing the power to be supplied, shortening the distance between a target and a semiconductor substrate, and adjusting the temperature of the semiconductor substrate.

Among them, when increasing the power to be supplied, it is considered that the supply rate of atoms supplied to a semiconductor substrate increases in conjunction with the increase of power, so that the film formation rate of an Al film increases. In addition, it is considered that the energy of atoms supplied to the semiconductor substrate increases in conjunction with the increase of power, so that the atoms reaching the surface of the semiconductor substrate can easily move to energetically stable positions, and the (111) orientation of the Al film is improved. In addition, since Al has a face-centered cubic lattice crystal structure and the Al (111) plane is a plane in which atoms are most closely packed, that is, a most closely packed plane, when the Al film is (111)-oriented, the planarity is prone to be improved. Therefore, as the (111) orientation of the Al film is improved, the planarity of the surface of the Al film is improved.

The result shown in FIG. 20 indicates that the surface roughness RMS of the upper surface 34a of the stacked film 34 in the semiconductor device of the working example 1 falls within the range of not more than 25 Å, which is the minimum value of the surface roughness RMS of the upper surface 34a of the stacked film 34 in the semiconductor device of the comparative example 1. In addition, the result shown in FIG. 23 indicates that it is when the film formation rate of the main conductive film 32 made of an Al film is 1,000 nm/min or more that the surface roughness of the upper surface 34a of the stacked film 34 becomes 25 Å or less. In other words, when the film formation rate of the main conductive film 32 made of an Al film is 1,000 nm/min or more, the surface roughness RMS of the upper surface 34a of the stacked film 34 becomes 25 Å or less, so that the ratio of the surface roughness RMS of the upper surface 34a of the stacked film 34 to the thickness FT1 (see FIG. 3) of the insulating film 38 can be set to 14% or less.

Therefore, in the first embodiment, the film formation rate of the main conductive film 32 is preferably 1,000 nm/min or more. In this manner, it is possible to reduce the surface roughness of the lower electrode BE1 composed of the stacked film 34 by improving the (111) orientation of the main conductive film 32 even when the thickness of the main conductive film 32 increases, and consequently to further suppress the decrease in withstand voltage value and further suppress the variations in withstand voltage value.

In addition, the result shown in FIG. 23 indicates that it is when the value obtained by dividing the X-ray diffraction intensity of the Al (111) plane of the main conductive film 32 made of an Al film by the thickness of the main conductive film 32 is 200 cps/nm or more that the surface roughness RMS of the upper surface 34a of the stacked film 34 becomes 25 Å or less. In other words, when the value obtained by dividing the X-ray diffraction intensity of the (111) plane of the main conductive film 32 by the thickness of the main conductive film 32 is 200 cps/nm or more, the surface roughness RMS of the upper surface 34a of the stacked film 34 becomes 25 Å or less. As a result, the ratio of the surface roughness RMS of the upper surface 34a of the stacked film 34 to the thickness FT1 of the insulating film 38 can be set to 14% or less.

Therefore, in the first embodiment, the value obtained by dividing the X-ray diffraction intensity of the (111) plane of the main conductive film 32 by the thickness FT1 of the main conductive film 32 is preferably 200 cps/nm or more. In this manner, it is possible to reduce the surface roughness of the lower electrode BE1 composed of the stacked film 34 by improving the (111) orientation of the main conductive film 32 even when the thickness of the main conductive film 32 increases, and consequently to further suppress the decrease in withstand voltage value and further suppress the variations in withstand voltage value.

Note that each X-ray diffraction intensity shown in FIG. 23 is the value measured by an X-ray diffraction device when the voltage applied to an X-ray source is set to 50 kV and the current flowing in the X-ray source is set to 300 mA, thereby setting the power supplied to the X-ray source to 1.5 kW. More specifically, the value obtained by dividing the X-ray diffraction intensity of the (111) plane of the main conductive film 32 by the thickness FT1 of the main conductive film 32 is preferably 200 cps/nm or more when the power supplied to the X-ray source of the X-ray diffraction device is set to 1.5 kW.

In addition, when the film formation rate of the main conductive film 32 is 1,000 nm/min, the value obtained by dividing the X-ray diffraction intensity of the (111) plane of the main conductive film 32 by the thickness FT1 of the main conductive film 32 is 200 cps/nm. On the other hand, when the film formation rate of the main conductive film 32 is 700 nm/min, the value obtained by dividing the X-ray diffraction intensity of the (111) plane of the main conductive film 32 by the thickness FT1 of the main conductive film 32 is 170 cps/nm. Therefore, the value obtained by dividing the X-ray diffraction intensity of the (111) plane of the main conductive film 32 by the thickness FT1 of the main conductive film 32 is preferably 200/170=1.18 times the value obtained by dividing the X-ray diffraction intensity of the (111) plane of the main conductive film 32 by the thickness FT1 of the main conductive film 32 when the film formation rate of the main conductive film 32 is 700 nm/min.

In addition, each X-ray diffraction intensity shown in FIG. 23 is the value measured when an area on the semiconductor substrate which is irradiated with X-rays is 5 mm×15 mm=75 mm$^2$.

Note that, as described above, for the increase of the film formation rate of the main conductive film 32 when forming the main conductive film 32 by the sputtering method, various methods for adjusting film formation conditions are conceivable, such as shortening the distance between a target and a semiconductor substrate and adjusting the temperature of the semiconductor substrate in addition to increasing the power to be supplied. Also by adjusting such film formation conditions, the ratio of the surface roughness of the upper surface 34a of the stacked film 34 to the thickness FT1 of the insulating film 38 can be set to 14% or less, so that it is possible to reduce the surface roughness of the lower electrode BE1 composed of the stacked film 34, suppress a decrease in withstand voltage value, and suppress variations in withstand voltage value.

Furthermore, in the first embodiment, the surface of the stacked film 34 serving as the lower electrode BE1 is not roughened. For this reason, when forming the insulating film 38 serving as the capacitive film CIF1, it is not necessary to use a film formation method excellent in step coverage such as the ALD method, and this prevents or suppresses an increase in manufacturing cost.

Second Embodiment

Next, a semiconductor device of the second embodiment will be described. In the semiconductor device of the second embodiment, an opening portion is formed in an interlayer insulating film formed so as to cover a lower electrode, and a capacitive film and a conductive film are formed on the lower electrode exposed in the opening portion.

<Configuration of Semiconductor Device>

Figure 24:
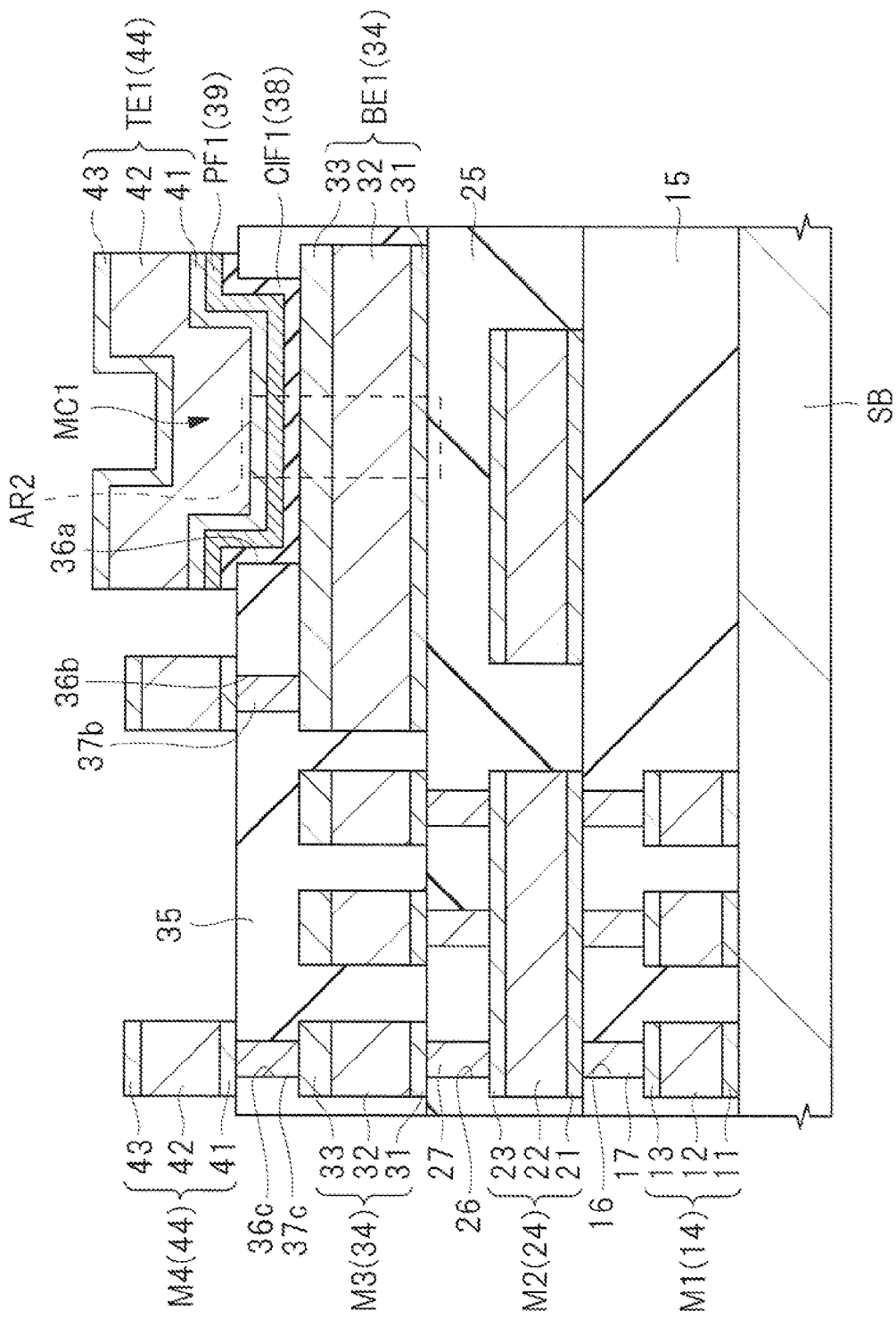
FIG. 24 is a sectional view of the main part of a semiconductor device of the second embodiment.

FIG. 24 is a sectional view of the main part of the semiconductor device of the second embodiment.

As shown in FIG. 24, the semiconductor device of the second embodiment includes a first-layer wiring M1, a second-layer wiring M2, a third-layer wiring M3, and a fourth-layer wiring M4 which are formed on a semiconductor substrate SB. Also, the semiconductor device of the second embodiment has a MIM capacitor MC1 as a capacitive element, which is composed of a lower electrode BE1, a capacitive film CIF1, and an upper electrode TE1. The semiconductor substrate SB is formed of, for example, a silicon single crystal substrate.

FIG. 24 does not show semiconductor elements such as transistors formed on the semiconductor substrate SB. As described in the first embodiment with reference to FIG. 2, however, an n-channel MISFET Qn, a p-channel MISFET Qp and others may be formed as semiconductor elements on the semiconductor substrate SB.

In addition, the respective portions of the semiconductor device of the second embodiment other than those above the lower electrode BE1 are the same as the respective portions of the semiconductor device of the first embodiment. Therefore, the description of the portions ranging from the first-layer wiring M1 to the second interlayer insulating film 25 is omitted.

Also in the second embodiment, like the first embodiment, the lower electrode BE1 and the third-layer wiring M3 are formed away from each other on the second interlayer insulating film 25 in which a plug 27 is buried. The lower electrode BE1 is used as the lower electrode of the MIM capacitor MC1. The third-layer wiring M3 is electrically connected to the second-layer wiring M2 through the plug 27.

Note that FIG. 3 described above is also a sectional view showing the main part of a region AR2 enclosed by the broken line in FIG. 24, that is, a portion near the lower electrode BE1 in FIG. 24 in an enlarged manner.

The lower electrode BE1 is composed of a stacked film 34 as a conductive film obtained by stacking a barrier conductive film 31, a main conductive film 32, and a barrier conductive film 33. The barrier conductive film 31 is formed on the second interlayer insulating film 25. As the barrier conductive film 31, as shown in FIG. 3, a film 31a containing Ti and a film 31b containing Ti and N are sequentially stacked from below. The main conductive film 32 is formed on the barrier conductive film 31. As the main conductive film 32, a film containing Al is formed. The barrier conductive film 33 is formed on the main conductive film 32. As the barrier conductive film 33, a film 33a containing Ti and a film 33b containing Ti and N are sequentially stacked from below. The barrier conductive film 31 and the barrier conductive film 33 are provided to prevent or suppress the diffusion of Al and the like in the main conductive film 32.

When seen in a plan view, the third-layer wiring M3 is formed away from the lower electrode BE1 in a region different from the region in which the lower electrode BE1 is formed. However, the third-layer wiring M3 can be composed of the stacked film 34 of the same layer as that of the lower electrode BE1. More specifically, like the lower electrode BE1, the third-layer wiring M3 is composed of the stacked film 34 as a conductive film made up of the barrier conductive film 31, the main conductive film 32, and the barrier conductive film 33.

Like the lower electrode BE1, the third-layer wiring M3 can be formed by sequentially stacking the film 31a containing Ti, the film 31b containing Ti and N, the main conductive film 32 made of a film containing Al, the film 33a containing Ti, and the film 33b containing Ti and N on the plug 27 and the second interlayer insulating film 25. Also, the barrier conductive film 31 of the third-layer wiring M3 can be composed of a film of the same layer as that of the barrier conductive film 31 of the lower electrode BE1. In addition, the main conductive film 32 of the third-layer wiring M3 can be composed of a film of the same layer as that of the main conductive film 32 of the lower electrode BE1. Furthermore, the barrier conductive film 33 of the third-layer wiring M3 can be composed of a film of the same layer as that of the barrier conductive film 33 of the lower electrode BE1. This makes it possible to form the lower electrode BE1 and the third-layer wiring M3 in the same process and consequently to simplify the process.

Note that the thicknesses and materials of the barrier conductive film 31, the film 31a, and the film 31b in the semiconductor device of the second embodiment can be the same as those of the barrier conductive film 31, the film 31a, and the film 31b in the semiconductor device of the first embodiment. In addition, the thickness and material of the main conductive film 32 in the semiconductor device of the second embodiment can be the same as those of the main conductive film 32 in the semiconductor device of the first embodiment. Furthermore, the thicknesses and materials of the barrier conductive film 33, the film 33a, and the film 33b in the semiconductor device of the second embodiment can be the same as those of the barrier conductive film 33, the film 33a, and the film 33b in the semiconductor device of the first embodiment.

A third interlayer insulating film 35 is formed on the second interlayer insulating film 25 so as to cover the lower electrode BE1 and the third-layer wiring M3. More specifically, the third interlayer insulating film 35 is formed on the lower electrode BE1 and the third-layer wiring M3.

In a part of the third interlayer insulating film 35 on the lower electrode BE1, an opening portion 36a which reaches the lower electrode BE1 through the third interlayer insulating film 35 is formed. The capacitive film CIF1 is formed on the lower electrode BE1 exposed on the bottom portion of the opening portion 36a, the side wall of the opening portion 36a, and the third interlayer insulating film 35. The capacitive film CIF1 is formed by pattering, that is, processing an insulating film 38. The capacitive film CIF1 is used as a capacitive film of the MIM capacitor MC1. As the insulating film 38 serving as the capacitive film CIF1, various types of insulating films such as an $SiO_2$ film, an SiN film, and an SiON film can be used like the first embodiment. This makes it possible to easily form the insulating film 38 by using various types of film formation methods. In addition, the thickness FT1 (see FIG. 3) of the capacitive film CIF1 is determined in accordance with the capacitance of the MIM capacitor MC1.

Like the semiconductor device of the first embodiment, also in the semiconductor device of the second embodiment, the ratio of a surface roughness RMS as the root-mean-square roughness of an upper surface 34a (see FIG. 3) of the lower electrode BE1 to the thickness FT1 of the capacitive film CIF1 is 14% or less. This makes it possible to manufacture products with a yield rate of 90% or more as described above in the first embodiment with reference to FIG. 22.

Note that, like the first embodiment, even after a semiconductor device is manufactured, it is possible to manufacture a sample in which the upper surface 34a of the lower electrode BE1 is exposed by removing a portion above the lower electrode BE1, that is, the capacitive film CIF1 and others. Then, the surface roughness of the exposed upper surface 34a of the lower electrode BE1 of the manufactured sample can be measured by using, for example, an integrated scatterometer. Alternatively, like the first embodiment, a cross-section observation sample whose cross-section including an interface between the lower electrode BE1 and the capacitive film CIF1 can be observed can be manufactured by, for example, an FIB process. Then, by observing the interface between the lower electrode BE1 and the capacitive film CIF1 of the manufactured cross-section observation sample by, for example, SEM, the surface roughness of the upper surface 34a of the lower electrode BE1 can be measured.

In addition, like the semiconductor device of the first embodiment, also in the semiconductor device of the second embodiment, the value obtained by dividing the X-ray diffraction intensity of the (111) plane of the main conductive film 32 by the thickness of the main conductive film 32 is 200 cps/nm or more. At this time, as described above in the first embodiment with reference to FIG. 23, the surface roughness RMS of the upper surface 34a of the lower electrode BE1 becomes 25 Å or less, and the ratio of the surface roughness RMS of the upper surface 34a of the lower electrode BE1 to the thickness FT1 of the capacitive film CIF1 can be set to 14% or less.

Note that, like the first embodiment, even after a semiconductor device is manufactured, it is possible to manufacture a sample in which the upper surface 34a of the lower electrode BE1 is exposed by removing a portion above the lower electrode BE1, that is, the capacitive film CIF1 and others, and to measure the X-ray diffraction intensity of the (111) plane of the main conductive film 32 by an X-ray diffraction method. Alternatively, even if the portion above the lower electrode BE1 is not removed, the X-ray diffraction intensity of the (111) plane of the main conductive film 32 can be measured by the X-ray diffraction method by adjusting X-ray irradiation conditions.

A conductive film PF1 is formed on the capacitive film CIF1. The conductive film PF1 is formed by patterning, that is, processing a conductive film 39. The conductive film PF1 is used as a part of the upper electrode of the MIM capacitor MC1. The conductive film PF1 is a portion in contact with the capacitive film CIF1, and is used also as a protective film for protecting the upper surface of the capacitive film CIF1. As the conductive film PF1, a conductive film containing Ti and N can be used. For example, a TiN film having a thickness of, for example, 80 nm can be used. In addition, as the conductive film PF1, a conductive film such as a Ti film, a TaN film, or an Al film can be used instead of a TiN film. Even when such a conductive film is used, the conductive film PF1 serves as a part of the upper electrode and can protect the upper surface of the capacitive film CIF1.

In this manner, the lower electrode BE1, the capacitive film CIF1, and the conductive film PF1 form the MIM capacitor MC1 as a capacitive element.

In a part of the third interlayer insulating film 35 on the lower electrode BE1, an opening portion 36b is formed so as to reach the lower electrode BE1 through the third interlayer insulating film 35. A plug 37b made of a conductive film is formed in the opening portion 36b on the lower electrode BE1 exposed in the opening portion 36b so as to fill the opening portion 36b. The plug 37b is electrically connected to the lower electrode BE1.

In a part of the third interlayer insulating film 35 on the third-layer wiring M3, an opening portion 36c is formed so as to reach the third-layer wiring M3 through the third interlayer insulating film 35. A plug 37c made of a conductive film is formed in the opening portion 36c on the third-layer wiring M3 exposed in the opening portion 36c so as to fill the opening portion 36c. The plug 37c is electrically connected to the third-layer wiring M3.

The upper electrode TE1 is formed on the conductive film PF1. The upper electrode TE1 is electrically connected to the conductive film PF1 and is used as the upper electrode of the MIM capacitor MC1 together with the conductive film PF1.

The upper electrode TE1 is composed of a stacked film 44 as a conductive film obtained by stacking a barrier conductive film 41, a main conductive film 42, and a barrier conductive film 43. The barrier conductive film 41 is formed on the conductive film PF1. As the barrier conductive film 41, a film containing Ti and a film containing Ti and N are sequentially stacked from below. The main conductive film 42 is formed on the barrier conductive film 41. As the main conductive film 42, a film composed of a film containing Al can be used. The barrier conductive film 43 is formed on the main conductive film 42. As the barrier conductive film 43, a film containing Ti and a film containing Ti and N are sequentially stacked from below. The barrier conductive film 41 and the barrier conductive film 43 are provided to prevent or suppress the diffusion of Al and the like in the main conductive film 42.

Also, a fourth-layer wiring M4 is formed on the third interlayer insulating film 35 in which the plugs 37b and 37c are buried. The fourth-layer wirings M4 is electrically connected to the lower electrode BE1 via the plug 37b, and is electrically connected to the third-layer wiring M3 via the plug 37c.

When seen in a plan view, the fourth-layer wiring M4 is formed away from the upper electrode TE1 in a region different from the region in which the upper electrode TE1 is formed. However, the fourth-layer wiring M4 can be composed of the stacked film 44 of the same layer as that of the upper electrode TE1. More specifically, like the upper electrode TE1, the fourth-layer wiring M4 is composed of the stacked film 44 as a conductive film obtained by stacking the barrier conductive film 41, the main conductive film 42, and the barrier conductive film 43.

The barrier conductive film 41 of the fourth-layer wiring M4 is composed of a film of the same layer as that of the barrier conductive film 41 of the upper electrode TE1, the main conductive film 42 of the fourth-layer wiring M4 is composed of a film of the same layer as that of the main conductive film 42 of the upper electrode TE1, and the barrier conductive film 43 of the fourth-layer wiring M4 is composed of a film of the same layer as that of the barrier conductive film 43 of the upper electrode TE1. This makes it possible to form the upper electrode TE1 and the fourth-layer wiring M4 in the same process and consequently to simplify the process.

Note that the thickness and material of the barrier conductive film 41 in the semiconductor device of the second embodiment can be the same as those of the barrier conductive film 41 in the semiconductor device of the first embodiment. In addition, the thickness and material of the main conductive film 42 in the semiconductor device of the second embodiment can be the same as those of the main conductive film 42 in the semiconductor device of the first embodiment. Furthermore, the thickness and material of the barrier conductive film 43 in the semiconductor device of the second embodiment can be the same as those of the barrier conductive film 43 in the semiconductor device of the first embodiment.

<Manufacturing Process of Semiconductor Device>

Next, a manufacturing process of the semiconductor device of the second embodiment will be described with reference to the accompanying drawings. FIGS. 25 to 37 are sectional views of the main part in a manufacturing process of the semiconductor device of the second embodiment.

Note that, like FIG. 24, the illustrations of semiconductor elements such as transistors formed on the semiconductor substrate are omitted in FIGS. 25 to 37. In addition, since the process of forming the semiconductor elements can be performed by a known method, the description thereof is omitted.

Figure 25:
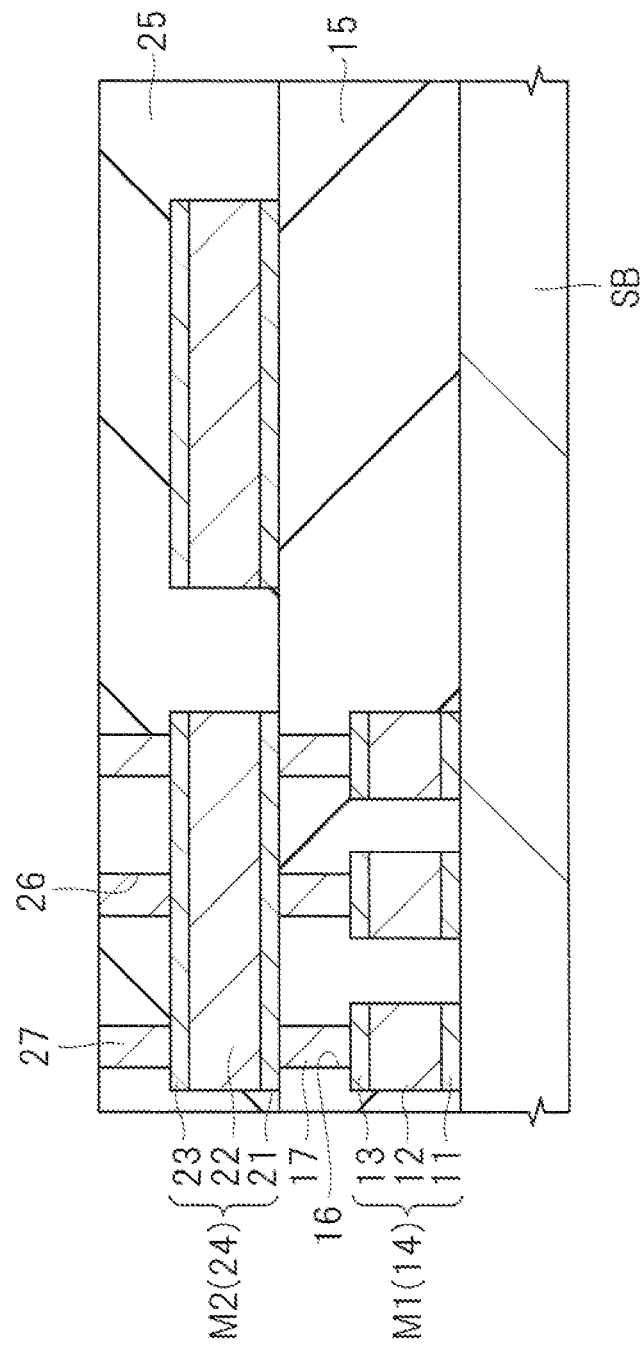
FIG. 25 is a sectional view of the main part in a manufacturing process of the semiconductor device of the second embodiment.

First, as shown in FIG. 25, the semiconductor substrate SB is prepared (step S31). The process in step S31 can be the same as that in step S11 in the first embodiment.

Figure 26:
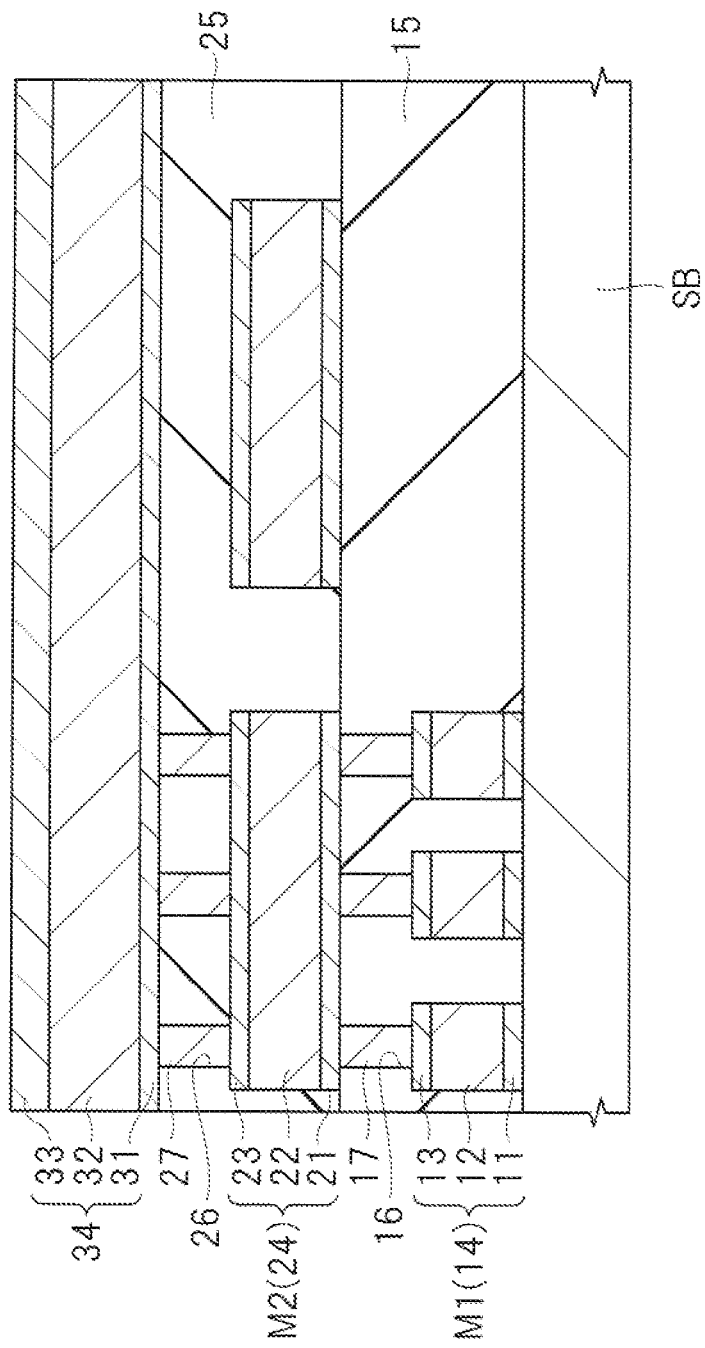
FIG. 26 is a sectional view of the main part in the manufacturing process of the semiconductor device of the second embodiment.

Next, as shown in FIG. 26, the stacked film 34 serving as the lower electrode BE1 and the third-layer wiring M3 is formed (step S32). The process in step S32 can be the same as that in step S12 in the first embodiment.

Figure 27:
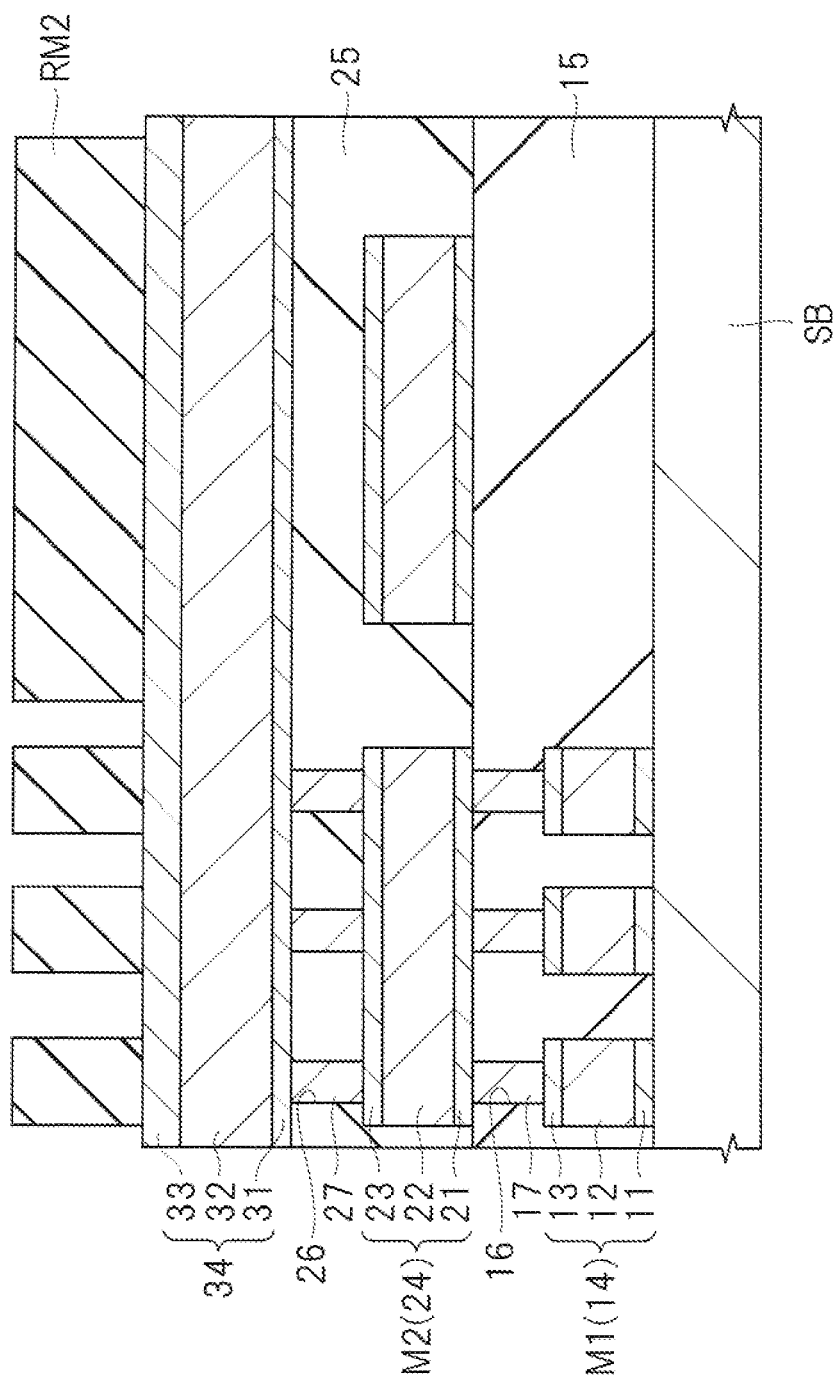
FIG. 27 is a sectional view of the main part in the manufacturing process of the semiconductor device of the second embodiment.

Next, as shown in FIG. 27, a resist mask RM2 is formed (step S33). The process in step S33 can be the same as that in step S16 in the first embodiment except that the insulating film 38 and the conductive film 39 are not formed on the stacked film 34.

Figure 28:
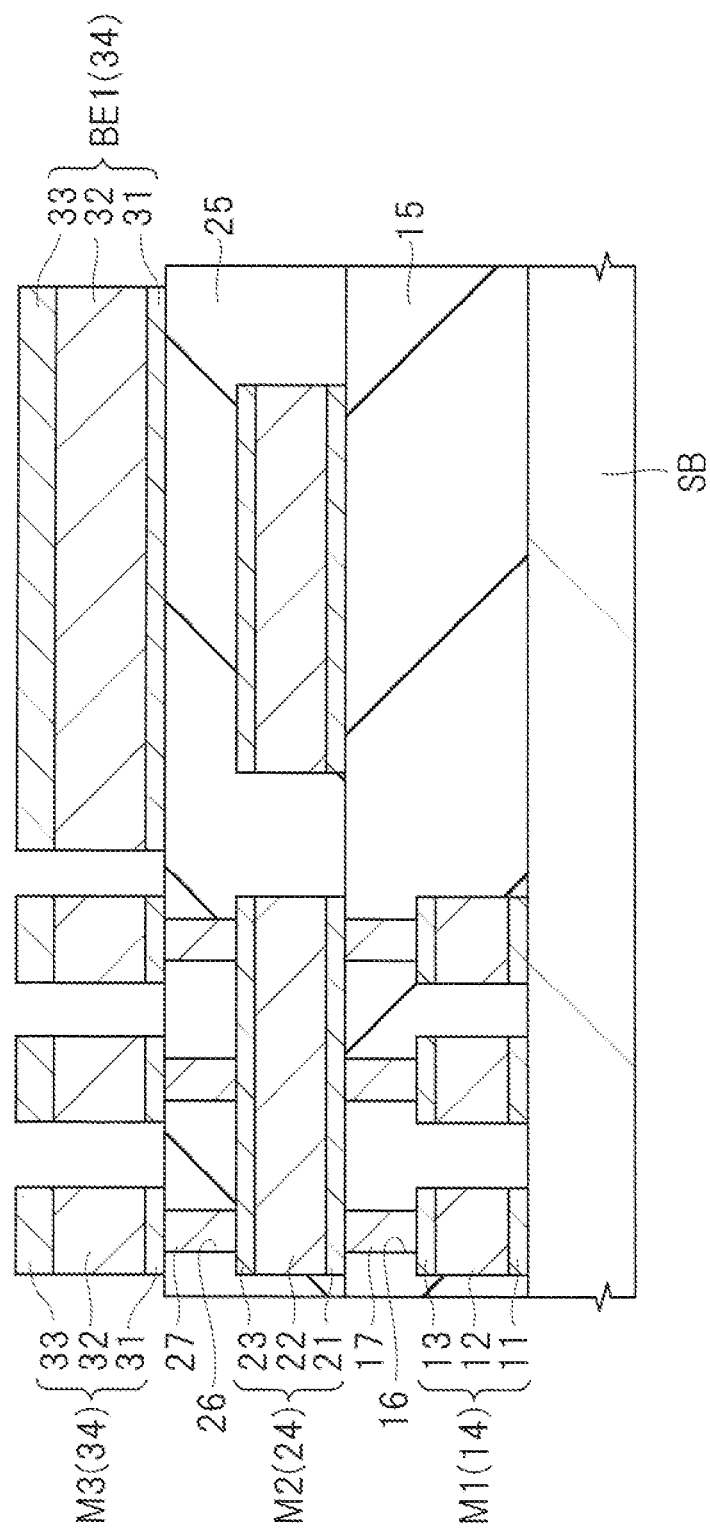
FIG. 28 is a sectional view of the main part in the manufacturing process of the semiconductor device of the second embodiment.

Next, as shown in FIG. 28, the lower electrode BE1 and the third-layer wiring M3 are formed (step S34). The process in step S34 can be the same as that in step S17 in the first embodiment except that the insulating film 38 and the conductive film 39 are not formed on the stacked film 34.

Through the process described above, the lower electrode BE1 composed of the stacked film 34 is formed on the second interlayer insulating film 25. In addition, the third-layer wiring M3 composed of the stacked film 34 is formed away from the lower electrode BE1. More specifically, when seen in a plan view, the third-layer wiring M3 composed of the stacked film 34 is formed in a region different from the region in which the lower electrode BE1 is formed.

Figure 29:
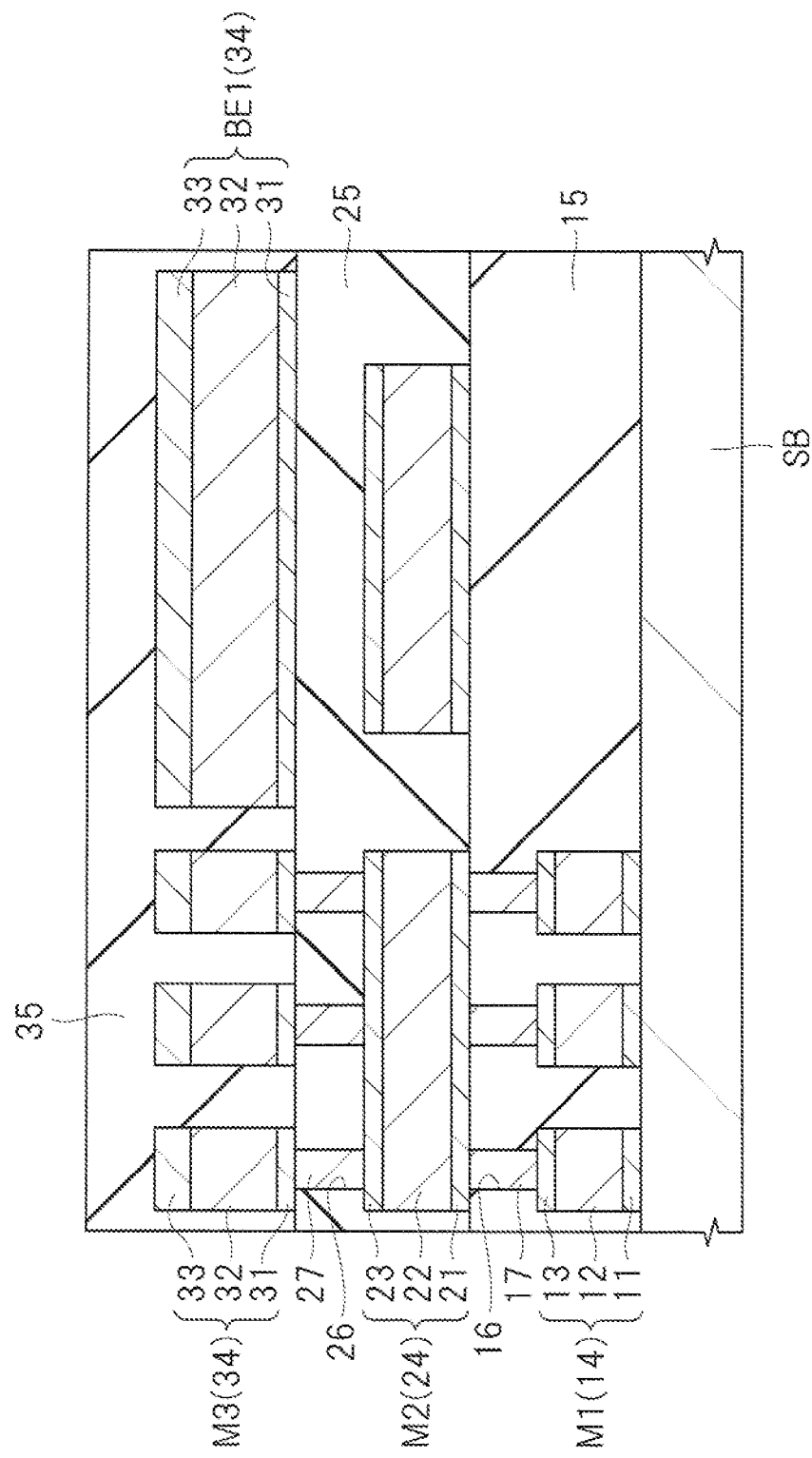
FIG. 29 is a sectional view of the main part in the manufacturing process of the semiconductor device of the second embodiment.

Next, as shown in FIG. 29, the third interlayer insulating film 35 is formed (step S35). The process in step S35 can be the same as that in step S18 in the first embodiment except that the insulating film 38 and the conductive film 39 are not formed on the stacked film 34.

Figure 30:
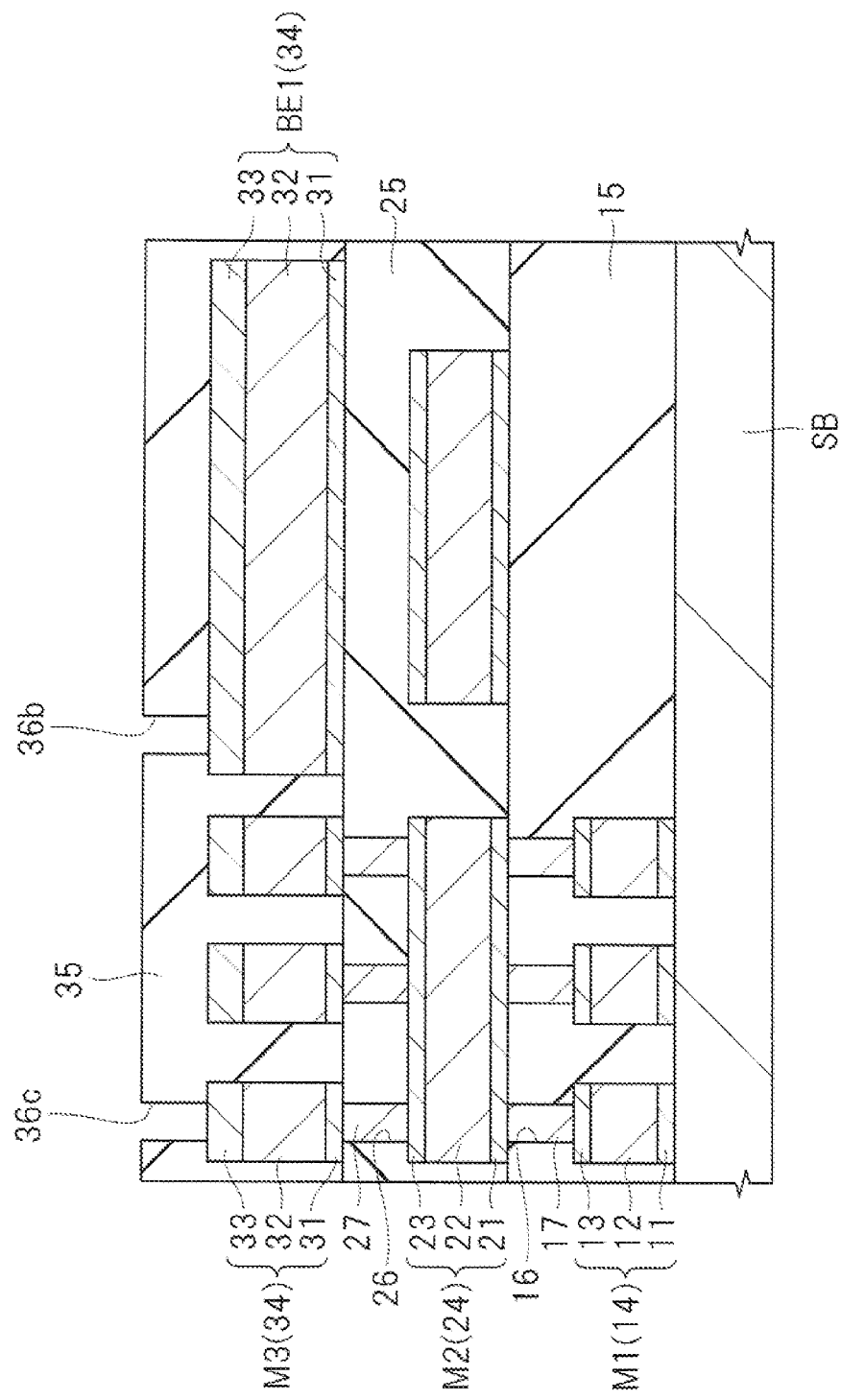
FIG. 30 is a sectional view of the main part in the manufacturing process of the semiconductor device of the second embodiment.

Next, as shown in FIG. 30, the opening portions 36b and 36c are formed (step S36). In step S36, the third interlayer insulating film 35 is patterned or processed by using the photolithography technique and the dry etching technique, thereby forming the opening portion 36b reaching the lower electrode BE1 through the third interlayer insulating film 35. In addition, in step S36, the opening portion 36c reaching the third-layer wiring M3 through the third interlayer insulating film 35 is formed.

Figure 31:
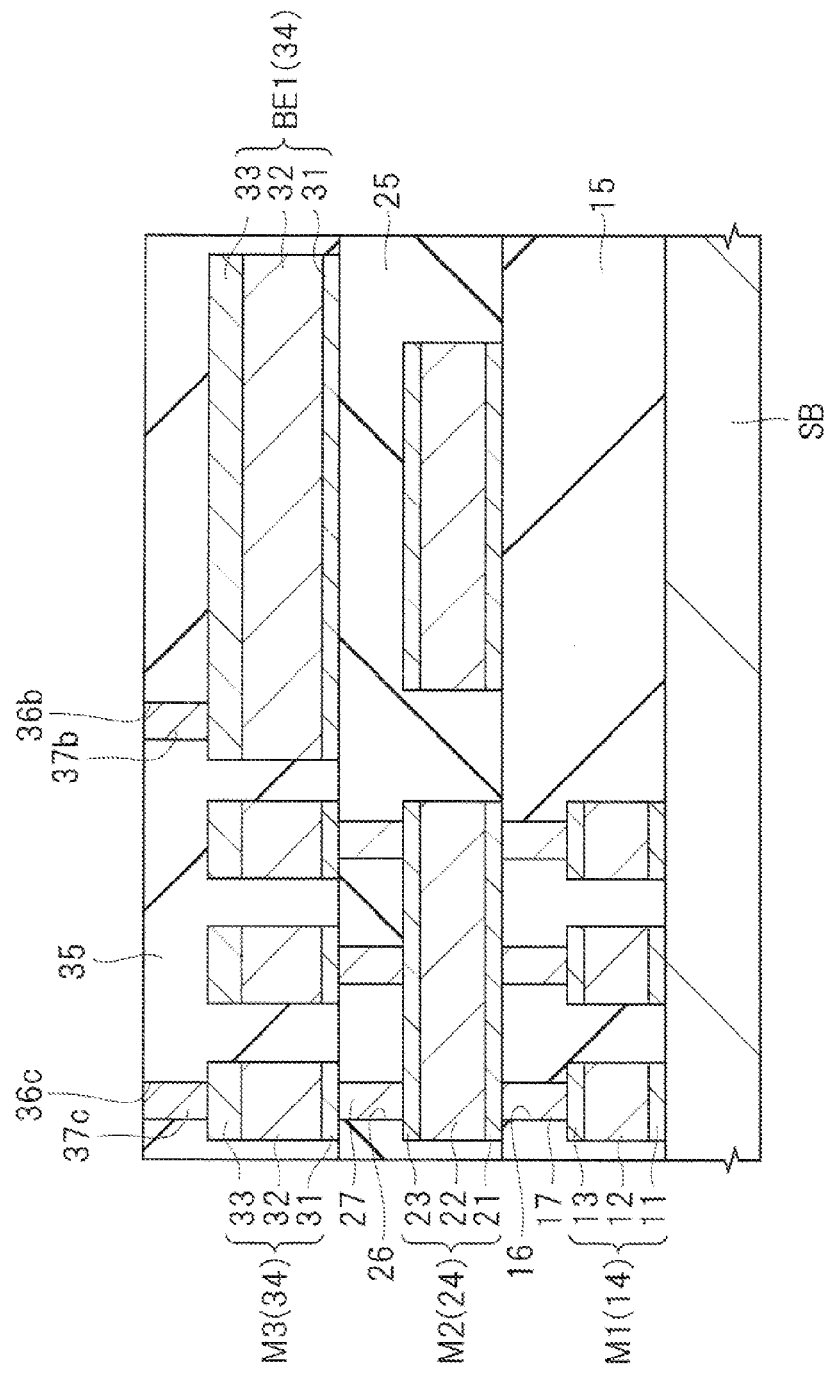
FIG. 31 is a sectional view of the main part in the manufacturing process of the semiconductor device of the second embodiment.

Next, as shown in FIG. 31, the plugs 37b and 37c are formed (step S37). In step S37, a barrier conductive film made of, for example, a TiN film is formed on the lower electrode BE1 exposed on the bottom portion of the opening portion 36b, the third-layer wiring M3 exposed on the bottom portion of the opening portion 36c, the side walls of the opening portions 36b and 36c, and the third interlayer insulating film 35 by the sputtering method. Then, a main conductive film made of, for example, a W film is formed by the CVD method on the formed barrier conductive film so as to fill the opening portions 36b and 36c. Thereafter, portions of the main conductive film and the barrier conductive film other than the portions in the opening portions 36b and 36c, that is, the main conductive film and the barrier conductive film on the third interlayer insulating film 35 are polished and removed by the CMP method.

Through the process described above, the plug 37b electrically connected to the lower electrode BE1 is formed in the opening portion 36b so as to fill the opening portion 36b, and the plug 37c electrically connected to the third-layer wiring M3 is formed in the opening portion 36c so as to fill the opening portion 36c.

Figure 32:
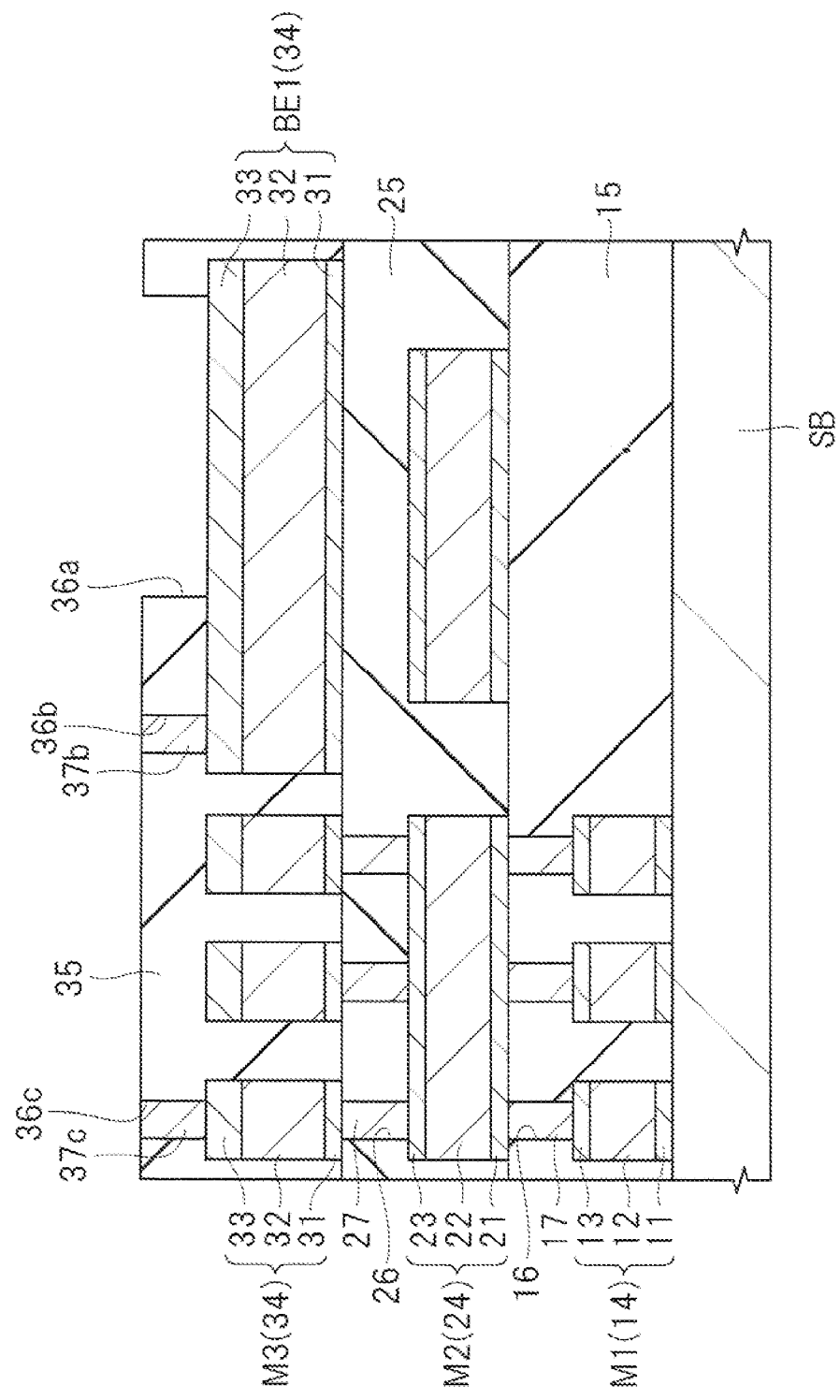
FIG. 32 is a sectional view of the main part in the manufacturing process of the semiconductor device of the second embodiment.

Next, as shown in FIG. 32, the opening portion 36a is formed (step S38). In step S38, the third interlayer insulating film 35 is patterned or processed by using the photolithography technique and the dry etching technique, thereby forming the opening portion 36a reaching the lower electrode BE1 through the third interlayer insulating film 35.

Figure 33:
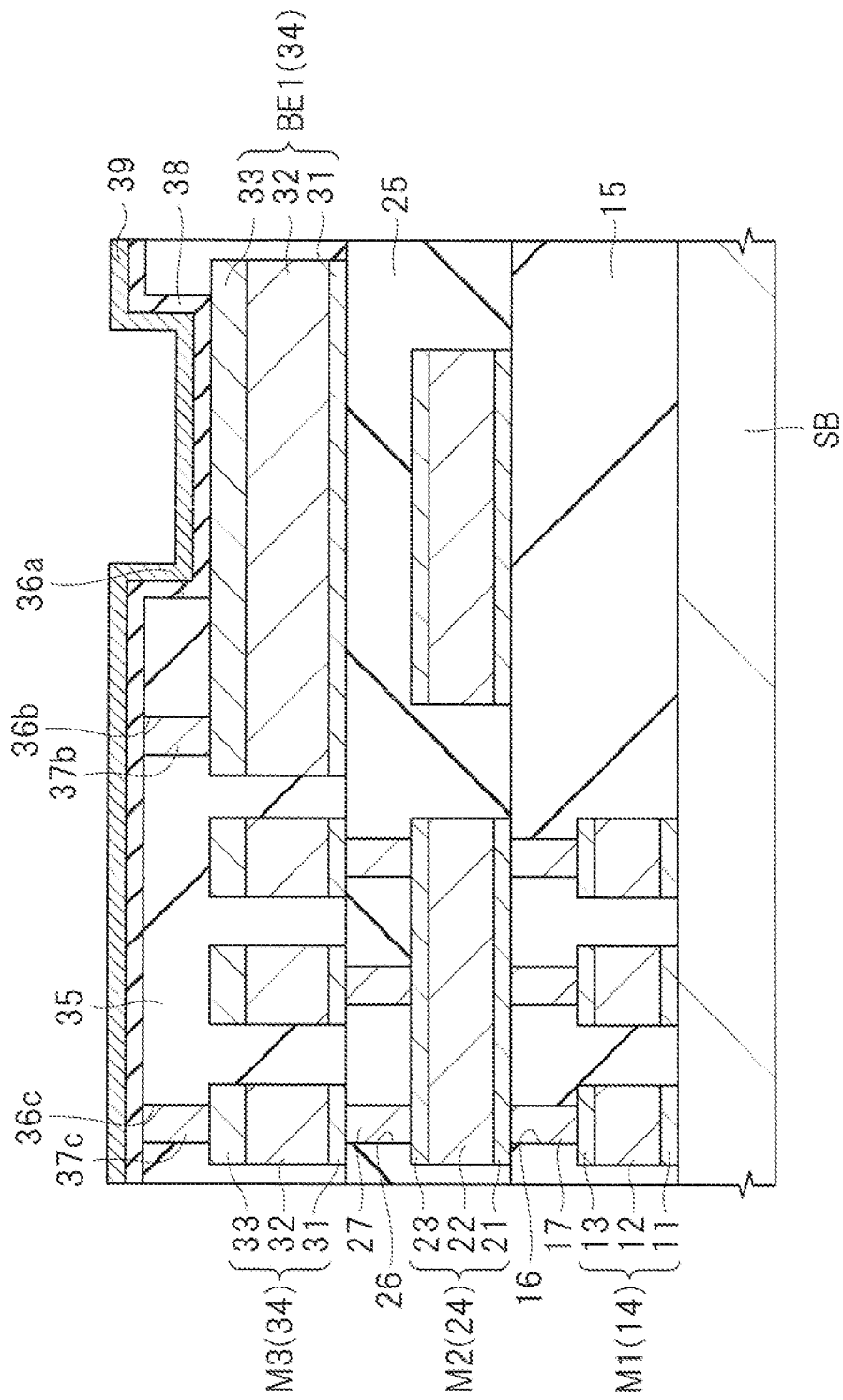
FIG. 33 is a sectional view of the main part in the manufacturing process of the semiconductor device of the second embodiment.

Next, as shown in FIG. 33, the insulating film 38 serving as the capacitive film CIF1 (see FIG. 35) and the conductive film 39 serving as the conductive film PF1 (see FIG. 35) are formed (step S39). In step S39, the insulating film 38 serving as the capacitive film CIF1 and the conductive film 39 serving as the conductive film PF1 are sequentially formed on the lower electrode BE1 exposed on the bottom portion of the opening portion 36a, the side wall of the opening portion 36a, and the third interlayer insulating film 35. The process in step S39 can be the same as that in step S13 in the first embodiment except that the insulating film 38 and the conductive film 39 are formed on the side wall of the opening portion 36a and the third interlayer insulating film 35.

In the second embodiment, the conductive film 39 is formed in a layer higher than the third-layer wiring M3 in step S39. Since this makes it possible to form the conductive film PF1 made of the conductive film 39 and the third-layer wiring M3 at different height positions, the degree of freedom in wiring layout can be improved and the area of the semiconductor device can be reduced.

Figure 34:
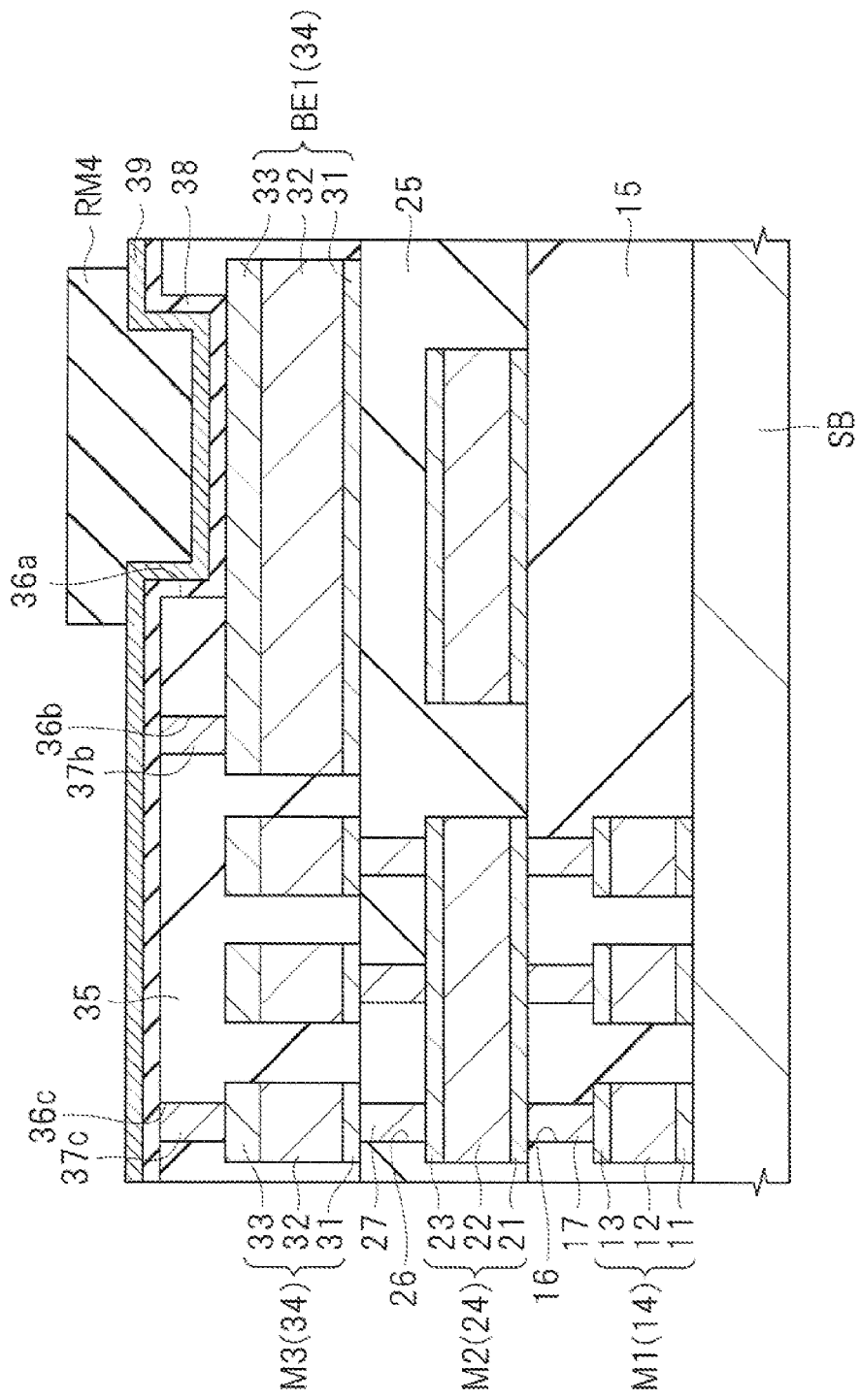
FIG. 34 is a sectional view of the main part in the manufacturing process of the semiconductor device of the second embodiment.

Subsequently, as shown in FIG. 34, a resist mask RM4 is formed (step S40). In step S40, a photoresist film applied onto the conductive film 39 is exposed and developed by using the photolithography technique, thereby leaving the photoresist film so as to cover a portion of the conductive film 39 which serves as the conductive film PF1 (see FIG. 35). More specifically, portions of the photoresist film which are located in regions in which the conductive film PF1 and the capacitive film CIF1 are formed are left, thereby forming the resist mask RM4.

Figure 35:
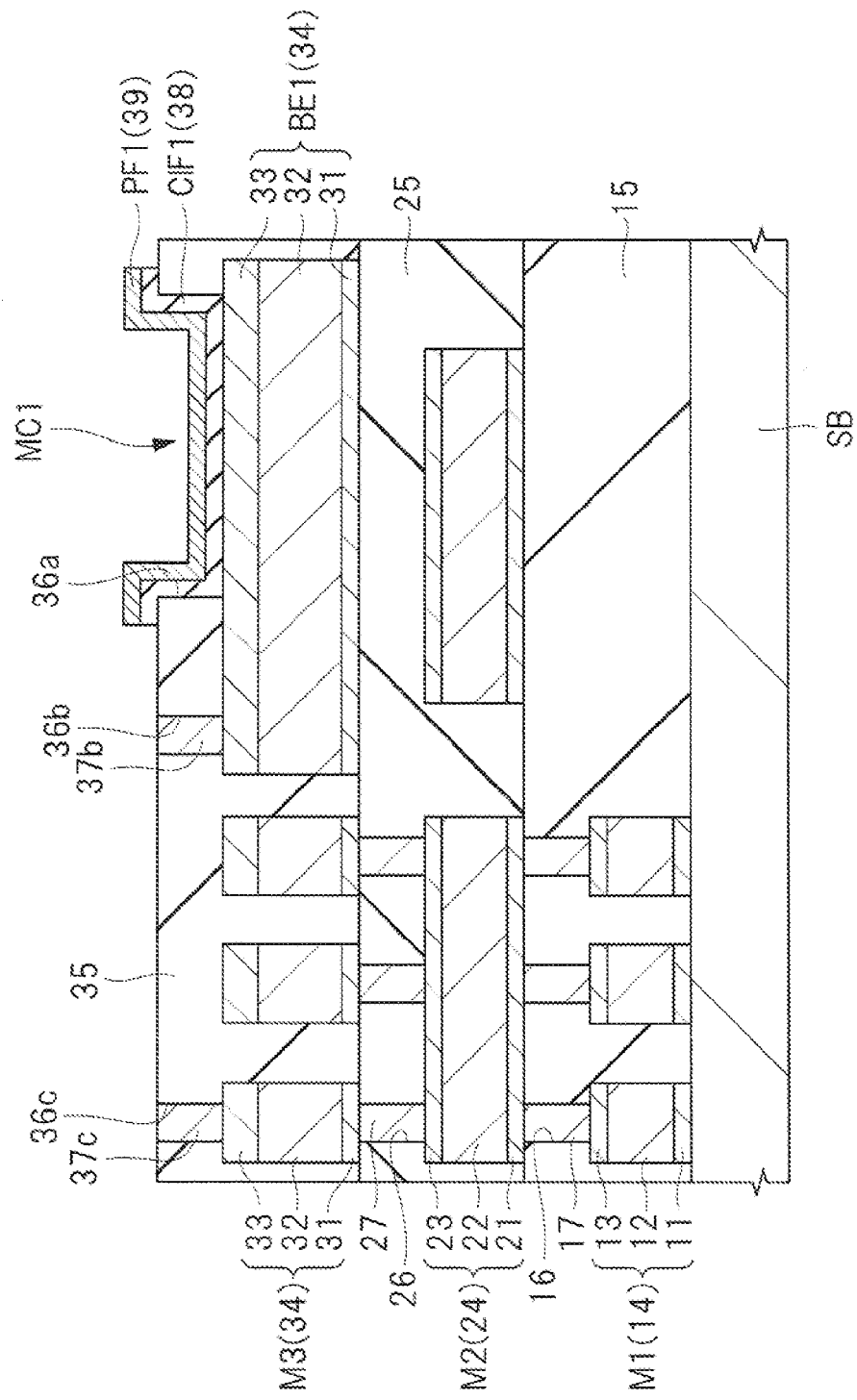
FIG. 35 is a sectional view of the main part in the manufacturing process of the semiconductor device of the second embodiment.

Next, as shown in FIG. 35, the conductive film PF1 and the capacitive film CIF1 are formed (step S41). In step S41, after the conductive film 39 and the insulating film 38 are patterned or processed by the dry etching technique using the resist mask RM4 as a mask, the resist mask RM4 is removed.

In this manner, the capacitive film CIF1 made of the insulating film 38 is formed on the lower electrode BE1 exposed on the bottom portion of the opening portion 36a, and the conductive film PF1 made of the conductive film 39 is formed on the capacitive film CIF1. At this time, the lower electrode BE1, the capacitive film CIF1, and the conductive film PF1 form the MIM capacitor MC1 as a capacitive element.

Also in the manufacturing process of the semiconductor device of the second embodiment, the ratio of the surface roughness RMS of the upper surface 34a of the stacked film 34 formed in step S32 to the thickness FT1 (see FIG. 3) of the insulating film 38 formed in step S39 is 14% or less like the manufacturing process of the semiconductor device of the first embodiment. This makes it possible to manufacture products with a yield rate of 90% or more as described above in the first embodiment with reference to FIG. 22.

Also in the manufacturing process of the semiconductor device of the second embodiment, the film formation rate of the main conductive film 32 made of an alloy film containing Al as a main component, that is, an Al alloy film is preferably 1,000 nm/min or more in step S32 like the manufacturing process of the semiconductor device of the first embodiment. At this time, as described in the first embodiment with reference to FIG. 23, the surface roughness RMS of the upper surface 34a of the stacked film 34 becomes 25 Å or less, and the ratio of the surface roughness RMS of the upper surface 34a of the stacked film 34 to the thickness FT1 of the insulating film 38 can be set to 14% or less.

In addition, also in the manufacturing process of the semiconductor device of the second embodiment, the value obtained by dividing the X-ray diffraction intensity of the (111) plane of the main conductive film 32 formed in step S32 by the thickness of the main conductive film 32 is preferably 200 cps/nm or more like the manufacturing process of the semiconductor device of the first embodiment. At this time, as described above in the first embodiment with reference to FIG. 23, the surface roughness RMS of the upper surface 34a of the stacked film 34 becomes 25 Å or less, and the ratio of the surface roughness RMS of the upper surface 34a of the stacked film 34 to the thickness FT1 of the insulating film 38 can be set to 14% or less.

Figure 36:
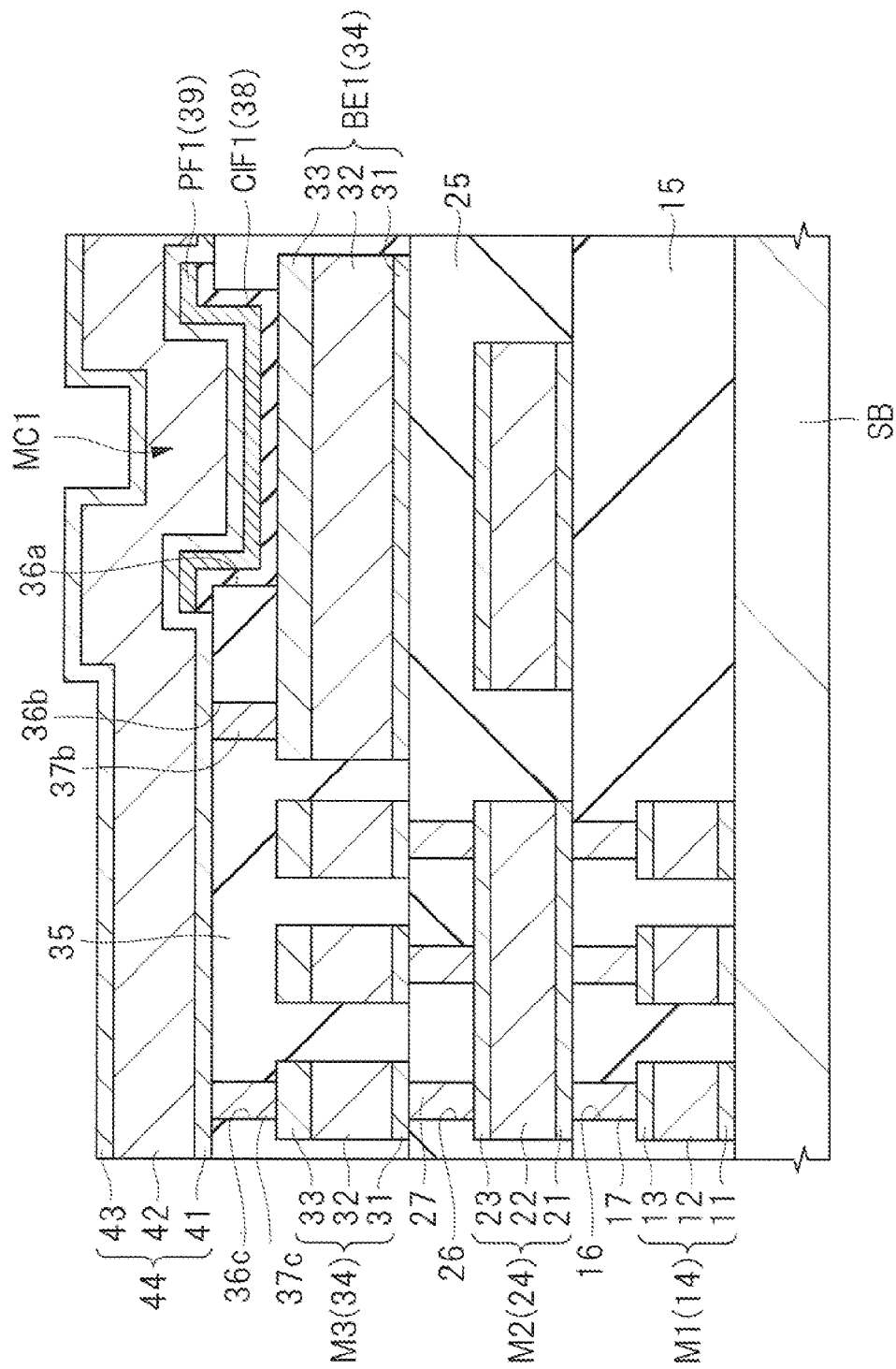
FIG. 36 is a sectional view of the main part in the manufacturing process of the semiconductor device of the second embodiment.

Next, as shown in FIG. 36, the stacked film 44 serving as the upper electrode TE1 (see FIG. 24) and the fourth-layer wiring M4 (see FIG. 24) is formed (step S42). In step S42, the stacked film 44 composed of the barrier conductive film 41, the main conductive film 42, and the barrier conductive film 43 sequentially formed from below is formed on the conductive film PF1, the plugs 37b and 37c, and the third interlayer insulating film 35. The process in step S42 can be the same as that in step S21 in the first embodiment except that the stacked film 44 is formed on the conductive film PF1. In addition, the stacked film 44 can be designed to have a thickness enough to fill the opening portion 36a.

Figure 37:
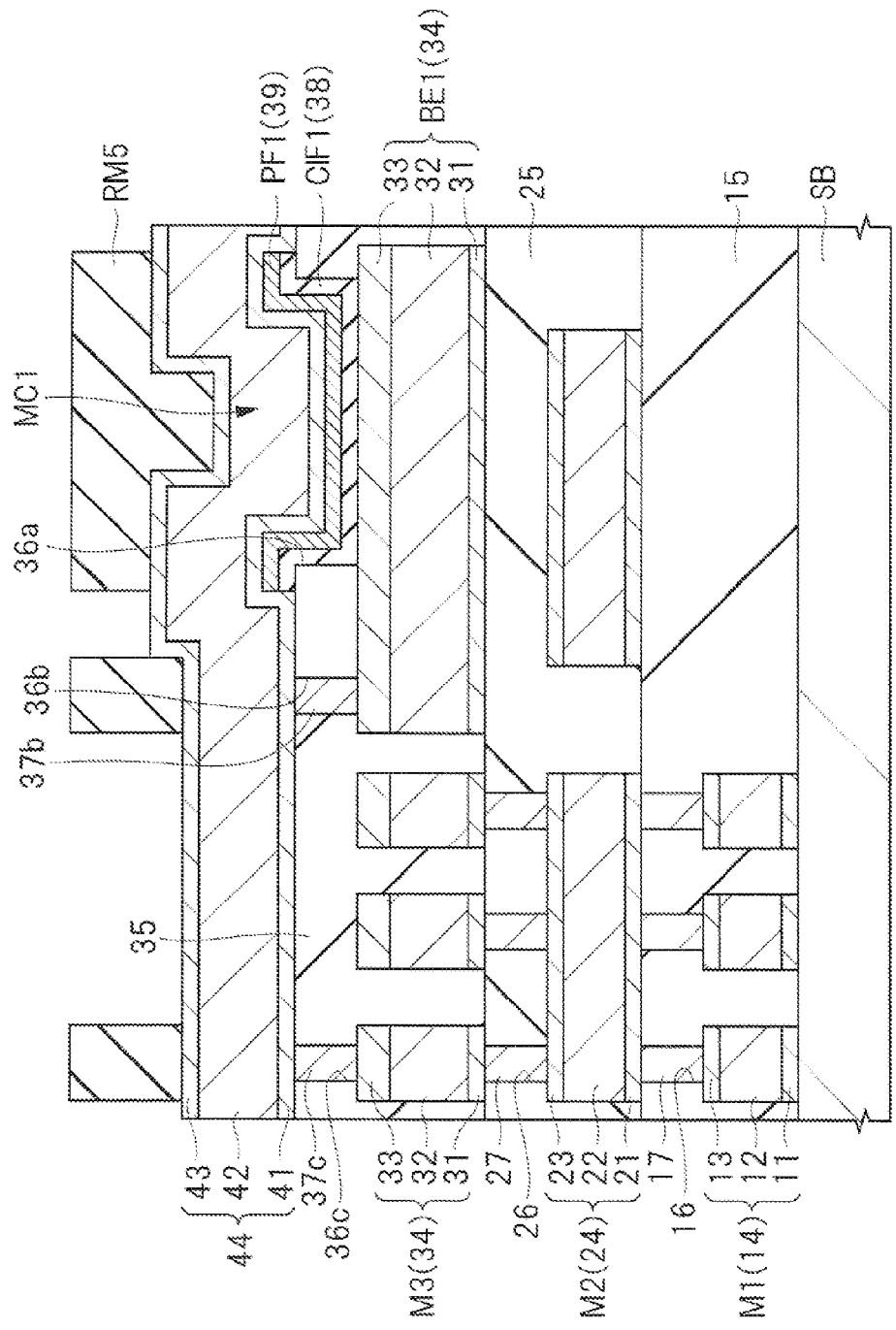
FIG. 37 is a sectional view of the main part in the manufacturing process of the semiconductor device of the second embodiment.

Next, as shown in FIG. 37, a resist mask RM5 is formed (step S43). In step S43, a photoresist film applied onto the stacked film 44 is exposed and developed by using the photolithography technique, thereby leaving portions of the photoresist film which are located in regions in which the upper electrode TE1 and the third-layer wiring M3 are formed, so that the resist mask RM5 is formed.

Subsequently, after the barrier conductive film 43, the main conductive film 42, and the barrier conductive film 41 are patterned or processed by the dry etching technique using the resist mask RM5 as a mask, the resist mask RM5 is removed. In this manner, the upper electrode TE1 which is composed of the stacked film 44 and is electrically connected to the conductive film PF1 is formed, and the fourth-layer wiring M4 which is composed of the stacked film 44 and is electrically connected to the plugs 37b and 37c is formed. Through the process so far, the semiconductor device shown in FIG. 24 is manufactured.

Main Characteristics and Effects of Present Embodiment

Also in the second embodiment, the ratio of the surface roughness RMS of the upper surface 34a of the stacked film 34 serving as the lower electrode BE1 to the thickness FT1 of the insulating film 38 serving as the capacitive film. CIF1 is 14% or less like the first embodiment. Since the ratio of the surface roughness of the stacked film 34 to the thickness FT1 of the insulating film 38 is 14% or less, it is possible to reduce the surface roughness of the lower electrode BE1, and consequently to suppress the decrease in withstand voltage value of the MIM capacitor and suppress the variations in withstand voltage value. As a result, it is possible to increase the yield rate of MIM capacitors to 90% or more.

Also in the second embodiment, the film formation rate of the main conductive film 32 is preferably 1,000 nm/min or more like the first embodiment. In this manner, it is possible to reduce the surface roughness of the lower electrode BE1 composed of the stacked film 34 by improving the (111) orientation of the main conductive film 32 even when the thickness of the main conductive film 32 increases, and consequently to further suppress the decrease in withstand voltage value and further suppress the variations in withstand voltage value.

In addition, also in the second embodiment, the surface of the stacked film 34 serving as the lower electrode BE1 is not roughened like the first embodiment. For this reason, when forming the insulating film 38 serving as the capacitive film CIF1, it is not necessary to use a film formation method excellent in step coverage such as the ALD method, and this prevents or suppresses an increase in manufacturing cost.

In the first embodiment, a portion of the insulating film 38 which serves as an end portion of the capacitive film CIF1 is in contact with the lower electrode BE1. For this reason, when the thickness FT1 of the insulating film 38 decreases, the insulating film 38 and the stacked film 34 may be etched due to overetching during the etching of the conductive film 39. Therefore, there is a possibility that a metal such as Ti or Al in the stacked film 34 adheres to a side surface of the capacitive film CIF1, so that the conductive film PF1 and the lower electrode BE1 are electrically short-circuited.

In contrast, in the second embodiment, a portion of the insulating film 38 which serves as an end portion of the capacitive film CIF1 is located on the third interlayer insulating film 35 and is not in contact with the lower electrode BE1. For this reason, even when the thickness FT1 of the insulating film 38 decreases, it is possible to prevent the lower electrode BE1 from being etched due to overetching during the etching of the conductive film. 39 and the insulating film 38. Therefore, it is possible to prevent the conductive film PF1 and the lower electrode BE1 from being electrically short-circuited to each other.

In the first embodiment, when the stacked film 34 is etched to form the lower electrode BE1, the insulating film 38 is etched together with the stacked film 34. Since the stacked film 34 and the insulating film 38 require different etching conditions, it is not easy to optimize the etching conditions and microfabricate the stacked film 34.

In contrast, in the second embodiment, when the stacked film 34 is etched to form the lower electrode BE1, the insulating film 38 is not etched together with the stacked film 34. Therefore, it is easy to optimize the etching conditions and microfabricate the stacked film 34.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be effectively applied to a semiconductor device and a manufacturing method of the same.

What is claimed is:

1. A manufacturing method of a semiconductor device comprising:
    (a) a step of preparing a semiconductor substrate;
    (b) a step of forming a first insulating film on the semiconductor substrate;
    (c) a step of forming a first conductive film on the first insulating film;
    (d) a step of forming a second insulating film on the first conductive film;
    (e) a step of forming a second conductive film on the second insulating film;
    (f) a step of forming a first electrode made of the second conductive film by patterning the second conductive film; and
    (g) after the step (f), a step of forming a capacitive film made of the second insulating film and disposed under the first electrode and a second electrode made of the first conductive film and disposed under the capacitive film by patterning the second insulating film and the first conductive film, wherein, in the step (g), a capacitive element is formed from the first electrode, the capacitive film, and the second electrode, the step (c) includes:

(c1) a step of forming a first film containing titanium on the first insulating film;

(c2) a step of forming a second film containing titanium and nitrogen on the first film;

(c3) a step of forming a third film containing aluminum on the second film;

(c4) a step of forming a fourth film containing titanium on the third film; and (c5) a step of forming a fifth film containing titanium and nitrogen on the fourth film, in the step (c), the first conductive film composed of the first film, the second film, the third film, the fourth film, and the fifth film is formed by performing the step (c1), the step (c2), the step (c3), the step (c4), and the step (c5), and a ratio of a surface roughness of an upper surface of the first conductive film to a thickness of the second insulating film is 14% or less.

2. The manufacturing method of a semiconductor device according to claim 1, wherein, in the step (c1), the first film made of a titanium film is formed by a sputtering method, in the step (c2), the second film made of a titanium nitride film is formed by the sputtering method, and in the step (c3), the third film made of an alloy film containing aluminum as a main component is formed by the sputtering method and a film formation rate of the third film is 1,000 nm/min or more.

3. The manufacturing method of a semiconductor device according to claim 2, wherein a value obtained by dividing an X-ray diffraction intensity of a (111) plane of the third film by a thickness of the third film is 200 cps/nm or more.

4. The manufacturing method of a semiconductor device according to claim 1, wherein, in the step (g), a wiring made of the first conductive film is formed away from the second electrode.

5. The manufacturing method of a semiconductor device according to claim 1, wherein, in the step (d), the second insulating film made of one of a silicon oxide film, a silicon nitride film, and a silicon oxynitride film is formed by a plasma CVD method.

6. The manufacturing method of a semiconductor device according to claim 1, wherein, in the step (e), the second conductive film made of one of a titanium film, a titanium nitride film, a tantalum nitride film, and an aluminum film is formed.

7. A manufacturing method of a semiconductor device comprising:

(a) a step of preparing a semiconductor substrate;

(b) a step of forming a first insulating film on the semiconductor substrate;

(c) a step of forming a first conductive film on the first insulating film;

(d) a step of forming a first electrode made of the first conductive film by patterning the first conductive film;

(e) a step of forming a second insulating film on the first electrode;

(f) a step of forming an opening portion reaching the first electrode through the second insulating film;

(g) a step of forming a third insulating film on the first electrode exposed in the opening portion and the second insulating film;

(h) a step of forming a second conductive film on the third insulating film; and (i) a step of forming a capacitive film made of the third insulating film and disposed on the first electrode and a second electrode made of the second conductive film and disposed on the capacitive film by patterning the second conductive film and the third insulating film, wherein, in the step (i), a capacitive element is formed from the first electrode, the capacitive film, and the second electrode, the step (c) includes:

(c1) a step of forming a first film containing titanium on the first insulating film;

(c2) a step of forming a second film containing titanium and nitrogen on the first film;

(c3) a step of forming a third film containing aluminum on the second film;

(c4) a step of forming a fourth film containing titanium on the third film; and (c5) a step of forming a fifth film containing titanium and nitrogen on the fourth film, in the step (c), the first conductive film composed of the first film, the second film, the third film, the fourth film, and the fifth film is formed by performing the step (c1), the step (c2), the step (c3), the step (c4), and the step (c5), and a ratio of a surface roughness of an upper surface of the first conductive film to a thickness of the third insulating film is 14% or less.

8. The manufacturing method of a semiconductor device according to claim 7, wherein, in the step (c1), the first film made of a titanium film is formed by a sputtering method, in the step (c2), the second film made of a titanium nitride film is formed by the sputtering method, and in the step (c3), the third film made of an alloy film containing aluminum as a main component is formed by the sputtering method and a film formation rate of the third film is 1,000 nm/min or more.

9. The manufacturing method of a semiconductor device according to claim 8, wherein a value obtained by dividing an X-ray diffraction intensity of a (111) plane of the third film by a thickness of the third film is 200 cps/nm or more.

10. The manufacturing method of a semiconductor device according to claim 7, wherein, in the step (d), a wiring made of the first conductive film is formed away from the first electrode, and in the step (e), the second insulating film is formed on the wiring.

11. The manufacturing method of a semiconductor device according to claim 7, wherein, in the step (g), the third insulating film made of one of a silicon oxide film, a silicon nitride film, and a silicon oxynitride film is formed by a plasma CVD method.

12. The manufacturing method of a semiconductor device according to claim 10, wherein, in the step (h), the second conductive film made of one of a titanium film, a titanium nitride film, a tantalum nitride film, and an aluminum film is formed in a layer higher than the wiring.

* * * * *